United States Patent
Park et al.

(10) Patent No.: US 12,448,397 B2
(45) Date of Patent: *Oct. 21, 2025

(54) COMPOSITION FOR PHOTOELECTRIC DEVICE, AND PHOTOELECTRIC DEVICE, IMAGE SENSOR AND ELECTRONIC DEVICE INCLUDING THE SAME

(71) Applicant: Samsung Electronics Co., Ltd., Suwon-si (KR)

(72) Inventors: Jeong Il Park, Seongnam-si (KR); Cheol Ham, Yongin-si (KR); Hyeongju Kim, Changwon-si (KR); Feifei Fang, Suwon-si (KR); Sung Young Yun, Suwon-si (KR); Youn Hee Lim, Suwon-si (KR); Hye Rim Hong, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 699 days.

This patent is subject to a terminal disclaimer.

(21) Appl. No.: 17/688,051

(22) Filed: Mar. 7, 2022

(65) Prior Publication Data
US 2022/0289767 A1    Sep. 15, 2022

(30) Foreign Application Priority Data
Mar. 5, 2021  (KR) .................. 10-2021-0029757

(51) Int. Cl.
| | | |
|---|---|---|
| C07D 517/22 | (2006.01) | |
| H10K 30/20 | (2023.01) | |
| H10K 30/40 | (2023.01) | |
| H10K 30/80 | (2023.01) | |
| H10K 30/84 | (2023.01) | |
| H10K 39/32 | (2023.01) | |
| H10K 85/40 | (2023.01) | |
| H10K 85/60 | (2023.01) | |

(52) U.S. Cl.
CPC .......... *C07D 517/22* (2013.01); *H10K 30/20* (2023.02); *H10K 39/32* (2023.02); *H10K 85/40* (2023.02); *H10K 85/615* (2023.02); *H10K 85/654* (2023.02); *H10K 85/6572* (2023.02); *H10K 30/40* (2023.02); *H10K 30/80* (2023.02); *H10K 30/84* (2023.02)

(58) Field of Classification Search
CPC .... C07D 517/22; H10K 39/32; H10K 85/615; H10K 85/40; H10K 85/6572; H10K 85/654; H10K 30/40; H10K 30/80
See application file for complete search history.

(56) References Cited

U.S. PATENT DOCUMENTS

2020/0152898 A1    5/2020   Heo et al.

FOREIGN PATENT DOCUMENTS

| EP | 3173410 A1 | 5/2017 |
| EP | 3473622 A1 | 4/2019 |
| EP | 3683211 A1 | 7/2020 |
| EP | 3848374 A1 | 7/2021 |
| EP | 3961737 A1 | 3/2022 |
| JP | 2015-043362 A | 3/2015 |
| KR | 10-2020-0056289 A | 5/2020 |

OTHER PUBLICATIONS

Extended European Search Report dated Jul. 20, 2022 for corresponding European Application No. 22160338.4.
Kazuko Takahashi et al., 'Efficient Synthesis of 2-IODO and 2-Dicyanomethyl Derivitives of Thiophene, Selenophene, Tellurophene, and Thieno[3,2-b]Thiophene' *Heterocycles*, vol. 43, No. 9, 1996, pp. 1927-1935.
Juha Alakarhu, 'Image Sensors and Image Quality in Mobile Phones' printed in the outline of 2007 International Image Sensor Workshop (Ogunquit Maine, USA).

*Primary Examiner* — Rebecca L Anderson
(74) *Attorney, Agent, or Firm* — Harness, Dickey & Pierce, P.L.C.

(57) ABSTRACT

A composition for a photoelectric device includes a compound represented by Chemical Formula 1, and an image sensor and an electronic device including the same:

[Chemical Formula 1]

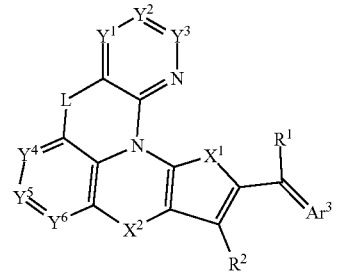

In Chemical Formula 1, each substituent is the same as defined in the detailed description.

27 Claims, 13 Drawing Sheets

COMPOSITION FOR PHOTOELECTRIC DEVICE, AND PHOTOELECTRIC DEVICE, IMAGE SENSOR AND ELECTRONIC DEVICE INCLUDING THE SAME

CROSS-REFERENCE TO RELATED APPLICATION

This application claims priority to and the benefit of Korean Patent Application No. 10-2021-0029757 filed in the Korean Intellectual Property Office on Mar. 5, 2021, the entire contents of which are incorporated herein by reference.

BACKGROUND

1. Field

Example embodiments relate to compositions for photoelectric devices and photoelectric devices, image sensors, and electronic devices including the same.

2. Description of the Related Art

A photoelectric device may convert light into an electrical signal using photoelectric effects. A photoelectric device may include a photodiode, a phototransistor, etc., and may be applied to an image sensor, etc.

An image sensor including a photodiode may require high resolution and thus a small pixel. At present, a silicon photodiode is widely used. In some cases, a silicon photodiode exhibits a problem of deteriorated sensitivity because of a relatively small absorption area due to relatively small pixels.

SUMMARY

Example embodiments provide a composition for a photoelectric device capable of selectively absorbing light in a green wavelength region and having improved thermal stability. Such a composition may be or may be included in an organic material of a photoelectric device that may replace silicon in image sensors and may have a relatively high extinction coefficient and may selectively absorb light in a particular wavelength region depending on a molecular structure, and thus may simultaneously replace a photodiode (e.g., a silicon photodiode) and a color filter and resultantly improve sensitivity and contribute to relatively high integration.

Some example embodiments also provide a photoelectric device capable of selectively absorbing light in a green wavelength region and maintaining improved efficiency in a process at a high temperature condition.

Some example embodiments also provide an image sensor including the photoelectric device.

Some example embodiments also provide an electronic device including the image sensor.

According to some example embodiments, a composition for a photoelectric device includes a p-type semiconductor compound represented by Chemical Formula 1 and an n-type semiconductor compound.

[Chemical Formula 1]

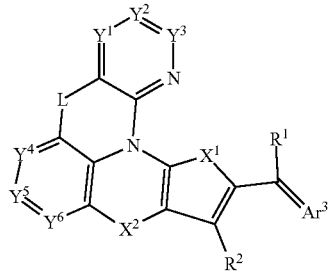

In Chemical Formula 1,

L is —O—, —S—, —Se—, —Te—, —NR$^{a1}$—, —BR$^{a2}$—, —SiR$^{b}$R$^{c}$—, —SiR$^{bb}$R$^{cc}$—, —GeR$^{d}$R$^{e}$—, —GeR$^{dd}$R$^{ee}$—, —(CR$^{f}$R$^{g}$)$_{n1}$—, —(CR$^{ff}$R$^{gg}$)—, —(C(R$^{m}$)=C(R$^{n}$))—, —(C(R$^{mm}$)=C(R$^{nnn}$))—, —(C(R$^{p}$)=N)—, or a single bond, wherein R$^{a1}$, R$^{a2}$, R$^{b}$, R$^{c}$, R$^{d}$, R$^{e}$, R$^{f}$, R$^{g}$, R$^{m}$, R$^{n}$, and R$^{p}$ are each independently hydrogen, deuterium, a halogen, a substituted or unsubstituted C1 to C20 alkyl group, a substituted or unsubstituted C6 to C20 aryl group, or a substituted or unsubstituted C6 to C20 aryloxy group, each pair of R$^{bb}$ and R$^{cc}$, R$^{dd}$ and R$^{ee}$, R$^{ff}$ and R$^{gg}$, or R$^{mm}$ and R$^{nnn}$ are linked to each other to form a ring structure, and n1 of —(CR$^{f}$R$^{g}$)$_{n1}$— is 1 or 2, or L is linked to Y$^{1}$ or Y$^{4}$ to provide a ring structure, Y$^{1}$ to Y$^{6}$ are each independently N or CR$^{k}$, wherein R$^{k}$ is hydrogen, deuterium, a halogen, a cyano group, a nitro group, a hydroxyl group, amine group, a substituted or unsubstituted C1 to C10 alkyl group, or a substituted or unsubstituted C1 to C10 alkoxy group or adjacent R$^{k}$'s are linked to each other to provide a substituted or unsubstituted C6 to C30 arene group, a substituted or unsubstituted C3 to C30 heteroarene group, or a condensed ring thereof, X$^{1}$ is —S—, —Se—, —Te—, —S(=O)—, —S(=O)$_{2}$—, —NR$^{a1}$—, —BR$^{a2}$—, —SiR$^{b}$R$^{c}$—, —SiR$^{bb}$R$^{cc}$—, —GeR$^{d}$R$^{e}$—, —GeR$^{dd}$R$^{ee}$—, —CR$^{f}$R$^{g}$—, or —CR$^{ff}$R$^{gg}$—, wherein R$^{a1}$, R$^{a2}$, R$^{b}$, R$^{c}$, R$^{d}$, R$^{e}$, R$^{f}$, and R$^{g}$ are each independently hydrogen, deuterium, a halogen, a cyano group, a substituted or unsubstituted C1 to C20 alkyl group, a substituted or unsubstituted C1 to C20 alkoxy group, a substituted or unsubstituted C6 to C20 aryl group, a substituted or unsubstituted C6 to C20 aryloxy group, or a substituted or unsubstituted C3 to C20 heteroaryl group, and each pair of R$^{bb}$ and R$^{cc}$, R$^{dd}$ and R$^{ee}$, or R$^{ff}$ and R$^{gg}$ are linked to each other to provide a ring structure, X$^{2}$ is —O—, —S—, —Se—, —Te—, —S(=O)—, —S(=O)$_{2}$—, —NR$^{a1}$—, —BR$^{a2}$—, —SiR$^{b}$R$^{c}$—, —SiR$^{bb}$R$^{cc}$—, —GeR$^{d}$R$^{e}$—, —GeR$^{dd}$R$^{ee}$—, —(CR$^{f}$R$^{g}$)$_{n1}$—, —(CR$^{ff}$R$^{gg}$)—, —(C(R$^{m}$)=C(R$^{n}$))—, —(C(R$^{mm}$)=C(R$^{nnn}$))—, or —(C(R$^{p}$)=N)—, wherein R$^{a1}$, R$^{a2}$, R$^{b}$, R$^{c}$, R$^{d}$, R$^{e}$, R$^{f}$, R$^{g}$, R$^{m}$, R$^{n}$, and R$^{p}$ are each independently hydrogen, deuterium, a halogen, a cyano group, a substituted or unsubstituted C1 to C20 alkyl group, a substituted or unsubstituted C1 to C20 alkoxy group, a substituted or unsubstituted C6 to C20 aryl group, a substituted or unsubstituted C6 to C20 aryloxy group or a substituted or unsubstituted C3 to C20 heteroaryl group, and each pair of R$^{bb}$ and R$^{cc}$, R$^{dd}$ and R$^{ee}$, R$^{ff}$ and R$^{gg}$, or R$^{mm}$ and R$^{nnn}$ is linked to each other to provide a ring structure, and n1 of —(CR$^{f}$R$^{g}$)$_{n1}$— is 1 or 2, Ar$^{3}$ is a substituted or unsubstituted C6 to C30 hydrocarbon cyclic group having at least one functional group selected from C=O, C=S, C=Se, and C=Te, a substituted or unsubstituted C2 to C30 heterocyclic group having at least one functional group selected from C=O, C=S, C=Se, and C=Te, or a fused ring thereof, $R^1$ and $R^2$ are each independently hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a substituted or unsubstituted C2 to C30 acyl group, a halogen, a cyano group (—CN), a cyano-containing group, a nitro group, a pentafluorosulfanyl group (—$SF_5$), a hydroxyl group, an amine group, a hydrazine group, a hydrazone group, a carboxyl group or a salt thereof, a sulfonic acid group or a salt thereof, a phosphoric acid group or a salt thereof, —$SiR^aR^bR^c$, wherein $R^a$, $R^b$, and $R^c$ may each independently be hydrogen or a substituted or unsubstituted C1 to C10 alkyl group, or any combination thereof.

In Chemical Formula 1, when $Y^1$ and $Y^4$ are $CR^k$, L and at least one of $Y^1$ or $Y^4$ may be linked to each other to provide a fused ring. A structure in which L and $Y^4$ are linked to each other may be represented by Chemical Formula 2A and a structure in which L and $Y^1$ are linked to each other may be represented by Chemical Formula 2B.

[Chemical Formula 2A]

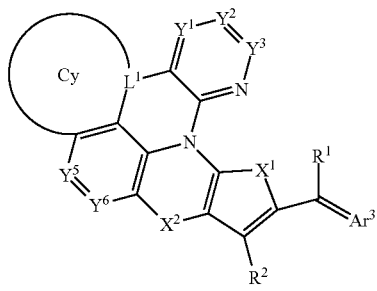

In Chemical Formula 2A, $X^1$, $X^2$, $Ar^3$, $R^1$, $R^2$, $Y^1$ to $Y^3$, $Y^5$, and $Y^6$ are the same as $X^1$, $X^2$, $Ar^3$, $R^1$, $R^2$, $Y^1$ to $Y^3$, $Y^5$, and $Y^6$, respectively, in Chemical Formula 1, $L^1$ may be N, B, Si, Ge, or C, and Cy may be a substituted or unsubstituted C6 to C30 arene group, a substituted or unsubstituted C3 to C30 heteroarene group, a substituted or unsubstituted C5 to C30 cycloalkene group, a substituted or unsubstituted C5 to C30 heterocycloalkene group, or a condensed ring thereof.

[Chemical Formula 2B]

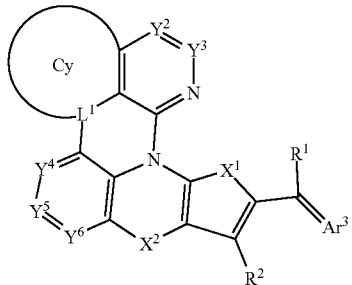

In Chemical Formula 2B, $X^1$, $X^2$, $Ar^3$, $R^1$, $R^2$, $Y^2$, $Y^3$, $Y^4$, $Y^5$, and $Y^6$ are the same as $X^1$, $X^2$, $Ar^3$, $R^1$, $R^2$, $Y^2$, $Y^3$, $Y^4$, $Y^5$, and $Y^6$, respectively, in Chemical Formula 1, $L^1$ may be N, B, Si, Ge, or C, and Cy may be a substituted or unsubstituted C6 to C30 arene group, a substituted or unsubstituted C3 to C30 heteroarene group, a substituted or unsubstituted C5 to C30 cycloalkene group, a substituted or unsubstituted C5 to C30 heterocycloalkene group, or a condensed ring thereof.

In Chemical Formula 1 and example structure thereof (Chemical Formula 2A, Chemical Formula 2B, and Chemical Formula 2A-1, Chemical Formula 2B-1, Chemical Formula 2C-1, and Chemical Formulas 3A-1 to 3A-8 to be described below), $X^1$ may be —S—, —Se—, —Te—, —S(=O)—, —S(=O)$_2$—, —$NR^{a1}$—, —$BR^{a2}$—, —$SiR^bR^c$—, —$GeR^dR^e$—, or —$CR^fR^g$— wherein $R^{a1}$, $R^{a2}$, $R^b$, $R^c$, $R^d$, $R^e$, $R^f$, and $R^g$ may each independently be a halogen, a cyano group, a C1 to C20 alkyl group substituted with a halogen or a cyano group, a C1 to C20 alkoxy group substituted with a halogen or a cyano group, a C6 to C20 aryl group substituted with a halogen or a cyano group, a C6 to C20 aryloxy group substituted with a halogen or a cyano group, or a C3 to C20 heteroaryl group substituted with a halogen or a cyano group.

The ring structure in $X^1$, $X^2$, and L of Chemical Formula 1 may each be a spiro structure or a fused ring structure.

In some example embodiments, the spiro structure may include a moiety represented by Chemical Formula 4.

[Chemical Formula 4]

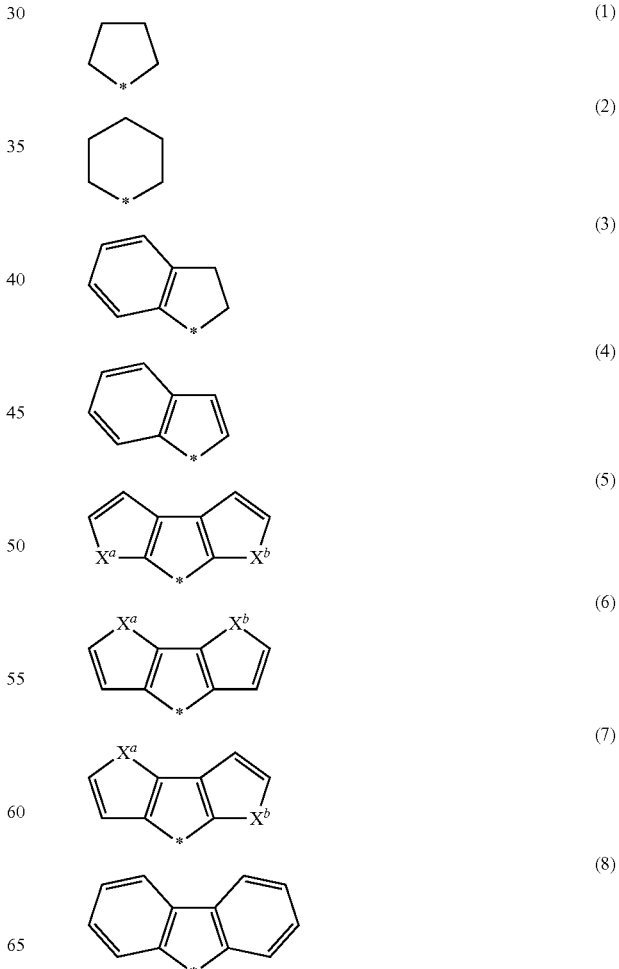

-continued

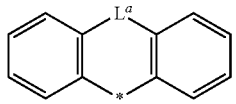
(9)

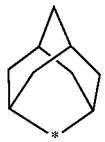
(10)

In Chemical Formula 4, $X^a$ and $X^b$ may each independently be —O—, —S—, —Se—, —Te—, —S(=O)—, —S(=O)$_2$—, —NR$^{a1}$—, —BR$^{a2}$—, —SiR$^b$R$^c$—, —SiR$^{bb}$R$^{cc}$—, —GeR$^d$R$^e$—, or —GeR$^{dd}$R$^{ee}$—, wherein R$^{a1}$, R$^{a2}$, R$^b$, R$^c$, R$^d$, and R$^e$ may each independently be hydrogen, deuterium, a halogen, a cyano group, a substituted or unsubstituted C1 to C20 alkyl group, a substituted or unsubstituted C1 to C20 alkoxy group, a substituted or unsubstituted C6 to C20 aryl group, a substituted or unsubstituted C6 to C20 aryloxy group, or a substituted or unsubstituted C3 to C20 heteroaryl group, and each pair of R$^{bb}$ and R$^{cc}$ or R$^{dd}$ and R$^{ee}$ may be linked to each other to provide a ring structure, L$^a$ may be —O—, —S—, —Se—, —Te—, —NR$^{a1}$—, —BR$^{a2}$—, —SiR$^b$R$^c$—, —GeR$^d$R$^e$—, —(CR$^f$R$^g$)$_{n1}$—, —(C(R$^p$)=N)—, or a single bond, wherein R$^{a1}$, R$^{a2}$, R$^b$, R$^c$, R$^d$, R$^e$, R$^f$, R$^g$, and R$^p$ may each independently be hydrogen, deuterium, a halogen, a cyano group, a substituted or unsubstituted C1 to C20 alkyl group, a substituted or unsubstituted C1 to C20 alkoxy group, a substituted or unsubstituted C6 to C20 aryl group, or a substituted or unsubstituted C6 to C20 aryloxy group, and

* may be a linking point.

At least one hydrogen of each ring of the moieties (1), (2), (3), (4), (5), (6), (7), (8), or (9) may be replaced by at least one substituent of deuterium, a halogen, a substituted or unsubstituted C1 to C20 alkyl group, a substituted or unsubstituted C1 to C20 alkoxy group, a substituted or unsubstituted C6 to C20 aryl group, or a substituted or unsubstituted C6 to C20 aryloxy group.

In some example embodiments, in Chemical Formula 4, one or more CH present in an aromatic ring of the moieties (3), (4), (5), (6), (7), (8), or (9) may be replaced by N.

In some example embodiments, in Chemical Formula 1, Ar$^3$ may be a cyclic group represented by Chemical Formula 5.

[Chemical Formula 5]

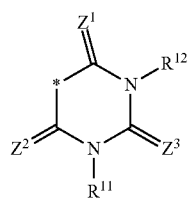

In Chemical Formula 5,

Ar$^{3\prime}$ may be a substituted or unsubstituted C6 to C30 aryl group or a substituted or unsubstituted C3 to C30 heteroaryl group, Z$^1$ may be O, S, Se, or Te, Z$^2$ may be O, S, Se, Te, or CR$^a$R$^b$, wherein R$^a$ and R$^b$ may each independently be hydrogen, a substituted or unsubstituted C1 to C10 alkyl group, a cyano group, or a cyano-containing group, provided that when Z$^2$ is CR$^a$R$^b$, at least one of R$^a$ or R$^b$ may be a cyano group or a cyano-containing group, and

* may be a linking point.

In some example embodiments, in Chemical Formula 1, Ar$^3$ may be a cyclic group represented by one of Chemical Formula 6A to Chemical Formula 6G.

[Chemical Formula 6A]

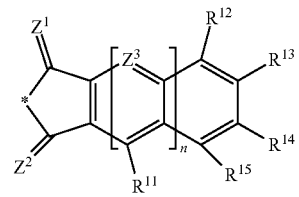

In Chemical Formula 6A,

Z$^1$ may be O, S, Se, or Te,

Z$^2$ may be O, S, Se, Te, or CR$^a$R$^b$, wherein R$^a$ and R$^b$ may each independently be hydrogen, a substituted or unsubstituted C1 to C10 alkyl group, a cyano group, or a cyano-containing group, provided that when Z$^2$ is CR$^a$R$^b$, at least one of R$^a$ or R$^b$ may be a cyano group or a cyano-containing group, Z$^3$ may be N or CR$^c$, wherein R$^c$ is hydrogen, deuterium, or a substituted or unsubstituted C1 to C10 alkyl group, R$^{11}$, R$^{12}$, R$^{13}$, R$^{14}$, and R$^{15}$ may each independently be hydrogen, deuterium, a substituted or unsubstituted C1 to C30 alkyl group, a substituted or unsubstituted C6 to C30 aryl group, a substituted or unsubstituted C4 to C30 heteroaryl group, a halogen, a cyano group (—CN), a cyano-containing group, or any combination thereof, wherein R$^{12}$ and R$^{13}$ and R$^{14}$ and R$^{15}$ may each independently be present or may be linked to each other to provide a fused aromatic ring, n may be 0 or 1, and

* may be a linking point.

[Chemical Formula 6B]

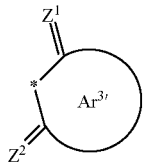

In Chemical Formula 6B,

Z$^1$ may be O, S, Se, or Te,

Z$^2$ may be O, S, Se, Te, or CR$^a$R$^b$, wherein R$^a$ and R$^b$ may each independently be hydrogen, a substituted or unsubstituted C1 to C10 alkyl group, a cyano group, or a cyano-containing group, provided that when Z$^2$ is CR$^a$R$^b$, at least one of R$^a$ or R$^b$ is a cyano group or a cyano-containing group, Z$^3$ may be O, S, Se, Te, or C(R$^a$)(CN), wherein R$^a$ is hydrogen, a cyano group (—CN), or a C1 to C10 alkyl group, $R^{11}$ and $R^{12}$ may each independently be hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C4 to C30 heteroaryl group, a halogen, a cyano group (—CN), or any combination thereof, and \* may be a linking point.

[Chemical Formula 6C]

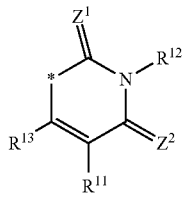

In Chemical Formula 6C, $Z^1$ may be O, S, Se, or Te, $Z^2$ may be O, S, Se, Te, or $CR^aR^b$, wherein $R^a$ and $R^b$ may each independently be hydrogen, a substituted or unsubstituted C1 to C10 alkyl group, a cyano group, or a cyano-containing group, provided that when $Z^2$ is $CR^aR^b$, at least one of $R^a$ or $R^b$ may be a cyano group or a cyano-containing group, $R^{11}$, $R^{12}$, and $R^{13}$ may each independently be hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C4 to C30 heteroaryl group, a halogen, a cyano group (—CN), or any combination thereof, and \* may be a linking point.

[Chemical Formula 6D]

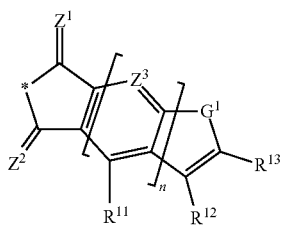

In Chemical Formula 6D, $Z^1$ may be O, S, Se, or Te, $Z^2$ may be O, S, Se, Te, or $CR^aR^b$, wherein $R^a$ and $R^b$ may each independently be hydrogen, a substituted or unsubstituted C1 to C10 alkyl group, a cyano group, or a cyano-containing group, provided that when $Z^2$ is $CR^aR^b$, at least one of $R^a$ or $R^b$ may be a cyano group or a cyano-containing group, $Z^3$ may be N or $CR^c$, wherein $R^c$ may be hydrogen or a substituted or unsubstituted C1 to C10 alkyl group, $G^1$ may be O, S, Se, Te, $SiR^xR^y$, or $GeR^zR^w$, wherein $R^x$, $R^y$, $R^z$, and $R^w$ may each independently be hydrogen, deuterium, a halogen, a substituted or unsubstituted C1 to C20 alkyl group, or a substituted or unsubstituted C6 to C20 aryl group, $R^{11}$, $R^{12}$, and $R^{13}$ may each independently be hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C4 to C30 heteroaryl group, a halogen, a cyano group, a cyano-containing group, or any combination thereof, wherein $R^{12}$ and $R^{13}$ may each independently be present or may be linked to each other to provide a fused aromatic ring, n may be 0 or 1, and \* may be a linking point.

[Chemical Formula 6E]

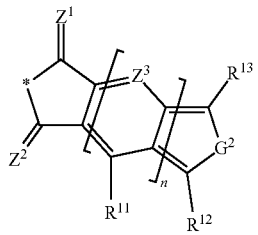

In Chemical Formula 6E, $Z^1$ may be O, S, Se, or Te, $Z^2$ may be O, S, Se, Te, or $CR^aR^b$, wherein $R^a$ and $R^b$ may each independently be hydrogen, a substituted or unsubstituted C1 to C10 alkyl group, a cyano group, or a cyano-containing group, provided that when $Z^2$ is $CR^aR^b$, at least one of $R^a$ or $R^b$ is a cyano group or a cyano-containing group, $Z^3$ may be N or $CR^c$, wherein $R^c$ may be hydrogen or a substituted or unsubstituted C1 to C10 alkyl group, $G^2$ may be O, S, Se, Te, $SiR^xR^y$, or $GeR^zR^w$, wherein $R^x$, $R^y$, $R^z$, and $R^w$ may each independently be hydrogen, deuterium, a halogen, a substituted or unsubstituted C1 to C20 alkyl group, or a substituted or unsubstituted C6 to C20 aryl group, $R^{11}$, $R^{12}$, and $R^{13}$ may each independently be hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C4 to C30 heteroaryl group, a halogen, a cyano group, a cyano-containing group, or any combination thereof, n may be 0 or 1, and \* may be a linking point.

[Chemical Formula 6F]

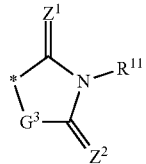

In Chemical Formula 6F, $Z^1$ may be O, S, Se, or Te, $Z^2$ may be O, S, Se, Te, or $CR^aR^b$, wherein $R^a$ and $R^b$ may each independently be hydrogen, a substituted or unsubstituted C1 to C10 alkyl group, a cyano group, or a cyano-containing group, provided that when $Z^2$ is $CR^aR^b$, at least one of $R^a$ or $R^b$ may be a cyano group or a cyano-containing group, $R^{11}$ may be hydrogen, deuterium, a substituted or unsubstituted C1 to C30 alkyl group, a substituted or unsubstituted C6 to C30 aryl group, a substituted or unsubstituted C4 to C30 heteroaryl group, a halogen, a cyano group (—CN), a cyano-containing group, or any combination thereof, $G^3$ may be O, S, Se, Te, $SiR^xR^y$, or $GeR^zR^w$, wherein $R^x$, $R^y$, $R^z$, and $R^w$ may each independently be hydrogen, deuterium, a halogen, a substituted or unsubstituted C1 to C20 alkyl group, or a substituted or unsubstituted C6 to C20 aryl group, and

* may be a linking point.

[Chemical Formula 6G]

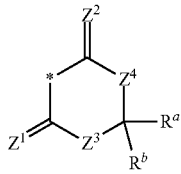

In Chemical Formula 6G, $Z^1$ may be O, S, Se, or Te, $R^a$ and $R^b$ may each independently be hydrogen, a substituted or unsubstituted C1 to C10 alkyl group, a cyano group, or a cyano-containing group, $Z^2$ to $Z^4$ may each independently be O, S, Se, Te, or $CR^cR^d$, wherein $R^c$ and $R^d$ are each independently hydrogen, a substituted or unsubstituted C1 to C10 alkyl group, a cyano group, or a cyano-containing group, provided that when $Z^2$ is $CR^cR^d$, at least one of $R^c$ or $R^d$ is a cyano group or a cyano-containing group, and

* may be a linking point.

In some example embodiments, the composition for a photoelectric device may have a maximum absorption wavelength ($\lambda_{max}$) in a wavelength range of greater than or equal to about 500 nm and less than or equal to about 600 nm in a thin film state.

In some example embodiments, the composition for a photoelectric device may exhibit a light absorption curve having a full width at half maximum (FWHM) of about 50 nm to about 200 nm in a thin film state.

According to some example embodiments, a photoelectric device (e.g., organic photoelectric device) includes a first electrode and a second electrode facing each other, and an active layer between the first electrode and the second electrode and including the composition for a photoelectric device including the p type semiconductor compound represented by Chemical Formula 1 and n-type semiconductor compound.

According to some example embodiments, an image sensor including the photoelectric device is provided.

In some example embodiments, the image sensor may further include a semiconductor substrate integrated with a plurality of first photo-sensing devices configured to selectively sense light in a blue wavelength region and a plurality of second photo-sensing devices configured to selectively sense light in a red wavelength region, and the photoelectric device may be on the semiconductor substrate and configured to selectively sense light in a green wavelength region.

In some example embodiments, the plurality of first photo-sensing devices and the plurality of second photo-sensing devices may be stacked in a vertical direction in a semiconductor substrate.

In some example embodiments, the image sensor may further include a color filter layer including a blue filter configured to selectively transmit light in a blue wavelength region and a red filter configured to selectively transmit light in a red wavelength region.

In some example embodiments, the photoelectric device may be a green photoelectric device configured to selectively sense light in a green wavelength region, and the image sensor may include a stack, on the semiconductor substrate, of the green photoelectric device, a blue photoelectric device configured to selectively sense light in a blue wavelength region, and a red photoelectric device configured to selectively sense light in a red wavelength region.

In some example embodiments, the green photoelectric device, the blue photoelectric device, and the red photoelectric device may be aligned in parallel on the semiconductor substrate and may overlap in a horizontal direction that is parallel to an upper surface of the semiconductor substrate.

In some example embodiments, an aspect ratio of a molecule of the p-type semiconductor compound represented by Chemical Formula 1, determined based on dividing a length of a shortest axis of the molecule by a length of a longest axis of the molecule, is less than or equal to about 0.42.

In some example embodiments, a volume ratio of the p-type semiconductor compound represented by Chemical Formula 1 and the n-type semiconductor compound in the composition is about 1:100 to about 100:1

According to some example embodiments, an electronic device including the image sensor is provided.

According to some example embodiments, the composition may include the compound represented by Chemical Formula 1, and the composition may include an n-type semiconductor compound or may not include any n-type semiconductor compounds.

The composition for a photoelectric device is capable of selectively absorbing light in a green wavelength region and excellent in thermal stability and charge mobility. The wavelength selectivity in the green wavelength region of the composition for a photoelectric device may be increased to improve efficiency of the device, and a photoelectric device, an image sensor, and an electronic device in which performance is not degraded even in a high-temperature process are provided.

DETAILED DESCRIPTION

Figure 1:
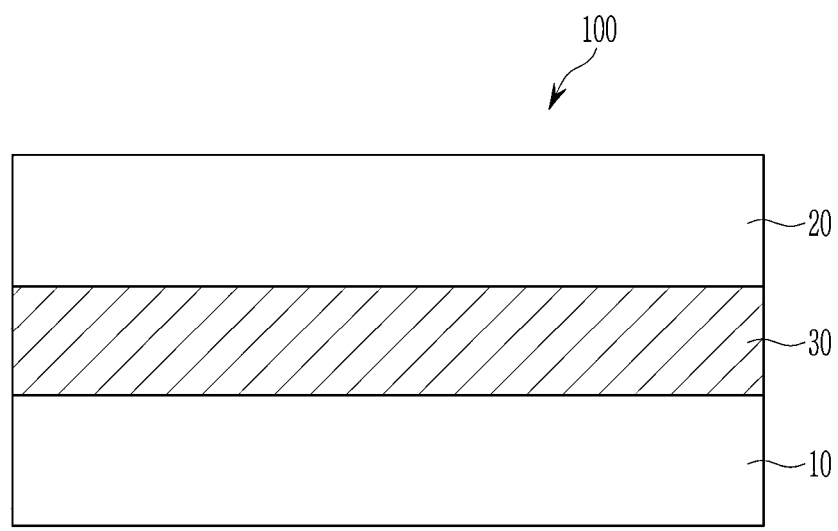
FIG. 1 is a cross-sectional view showing a photoelectric device according to some example embodiments.

Hereinafter, some example embodiments are described in detail so that those of ordinary skill in the art can easily implement them. However, a structure that is actually applied may be implemented in various different forms, and is not limited to the example embodiments described herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

In the drawings, parts having no relationship with the description are omitted for clarity of the example embodiments, and the same or similar constituent elements are indicated by the same reference numeral throughout the specification.

As used herein, "at least one of A, B, or C," "one of A, B, C, or any combination thereof" and "one of A, B, C, and any combination thereof" refer to each constituent element, and any combination thereof (e.g., A; B; C; A and B; A and C; B and C; or A, B and C).

As used herein, when specific definition is not otherwise provided, "substituted" refers to replacement of a hydrogen of a compound or a functional group by a halogen atom (F, Br, Cl, or I), a hydroxy group, a nitro group, a cyano group, an azido group, an amidino group, an amine group (—NR'R", wherein R' and R" are each independently a hydrogen atom, a C1 to C20 alkyl group or a C6 to C30 aryl group), a hydrazino group, a hydrazono group, a carbonyl group, a carbamyl group, a thiol group, an ester group, a carboxyl group or a salt thereof, sulfonic acid group or a salt thereof, a phosphoric acid group or a salt thereof, a C1 to C20 alkyl group, a C1 to C20 alkoxy group, a C2 to C20 alkenyl group, a C2 to C20 alkynyl group, a C6 to C30 aryl group, a C7 to C30 arylalkyl group, a C2 to C20 heteroaryl group, a C3 to C20 heteroarylalkyl group, a C3 to C30 cycloalkyl group, a C3 to C15 cycloalkenyl group, a C6 to C15 cycloalkynyl group, a C2 to C20 heterocycloalkyl group, or any combination thereof.

The "arene group" refers to a hydrocarbon cyclic group having an aromatic ring, and includes monocyclic and multicyclic hydrocarbon cyclic groups, and additional rings of the multicyclic hydrocarbon cyclic group may be an aromatic ring or a non-aromatic ring. The arene group may be a C6 to C30 arene group, a C6 to C20 arene group, or a C6 to C10 arene group.

"Heteroarene group" refers to an arene group including 1 to 3 heteroatoms selected from N, O, S, P, and Si in the ring. The heteroarene group may be a C3 to C30 heteroarene group, a C3 to C20 heteroarene group, or a C3 to C10 heteroarene group.

As used herein, "hydrocarbon cyclic group" may be a C3 to C30 hydrocarbon cyclic group. The hydrocarbon cyclic group may be an aromatic hydrocarbon cyclic group (e.g., C6 to C30 arene group, C6 to C20 arene group, or C6 to C10 arene group or C6 to C30 aryl group, C6 to C20 aryl group, or C6 to C10 aryl group), an alicyclic hydrocarbon cyclic group (e.g., C3 to C30 cycloalkyl group, C5 to C30 cycloalkyl group, C3 to C20 cycloalkyl group, or C3 to C10 cycloalkyl group), or a fused ring group thereof. For example, the fused ring group may refer to a fused ring of an aromatic ring (arene ring) and a non-aromatic ring (alicyclic ring), for example a fused ring in which at least one aromatic ring (arene ring) such as a C6 to C30 arene group, a C6 to C20 arene group, or a C6 to C10 arene group or a C6 to C30 aryl group, a C6 to C20 aryl group, or a C6 to C10 aryl group and at least one non-aromatic ring (alicyclic ring) such as a C3 to C30 cycloalkyl group, a C3 to C20 cycloalkyl group, or a C3 to C10 cycloalkyl group are fused to each other.

As used herein, the "heterocyclic group" may be a C2 to C30 heterocyclic group. The heterocyclic group may be a cyclic group in which at least one, for example 1 to 3 carbon atoms of an aromatic hydrocarbon cyclic group (e.g., a C6 to C30 arene group, a C6 to C20 arene group, or a C6 to C10 arene group or a C6 to C30 aryl group, a C6 to C20 aryl group, or a C6 to C10 aryl group), an alicyclic hydrocarbon cyclic group (e.g., a C3 to C30 cycloalkyl group, a C3 to C20 cycloalkyl group, or a C3 to C10 cycloalkyl group), and a fused ring group thereof are replaced by a heteroatom selected from N, O, S, P, and Si. In addition, at least one carbon atom of the heterocyclic group may be replaced by a thiocarbonyl group (C=S).

As used herein, when specific definition is not otherwise provided, "hetero" refers to one including 1 to 3 heteroatoms selected from N, O, S, P, and Si.

As used herein, "alkyl group" refers to a monovalent linear or branched saturated hydrocarbon group, for example a methyl group, an ethyl group, a propyl group, an isopropyl group, an n-butyl group, an isobutyl group, a t-butyl group, a pentyl group, a hexyl group, and the like.

As used herein, "cycloalkyl group" refers to a monovalent hydrocarbon cyclic group in which the atoms of the cycle are carbon, for example a cyclopropyl group, a cyclobutyl group, a cyclopentyl group, or a cyclohexyl group.

As used herein, "aryl group" refers to a cyclic functional group wherein all elements of the cycle (all ring-forming atoms) have p-orbitals which form conjugation, and may be a monocyclic, polycyclic, or fused ring polycyclic (e.g., rings sharing adjacent pairs of carbon atoms) functional group.

As used herein, when a definition is not otherwise provided, "cyano-containing group" refers to a monovalent group such as a C1 to C30 alkyl group, a C2 to C30 alkenyl group, or a C2 to C30 alkynyl group where at least one hydrogen is substituted with a cyano group. The cyano-containing group also refers to a divalent group such as $=CR^{x'}-(CR^xR^y)_p-CR^{y'}(CN)_2$ wherein $R^x$, $R^y$, $R^{x'}$, and $R^{y'}$ may each independently be hydrogen or a C1 to C10 alkyl group and p is an integer of 0 to 10 (or 1 to 10). Specific examples of the cyano-containing group may be a dicyanomethyl group, a dicyanovinyl group, a cyanoethynyl group, and the like. As used herein, the cyano-containing group does not include a functional group including a cyano group (—CN) alone.

As used herein, when a definition is not otherwise provided, "aromatic hydrocarbon group" may include a C6 to C30 arene group such as a phenyl group and a naphthyl group, a C6 to C30 aryl group, and a C6 to C30 arylene group, but is not limited thereto.

As used herein, when a definition is not otherwise provided, "aliphatic hydrocarbon group" may include a C1 to C15 alkyl group such as a methyl group, an ethyl group, a propyl group, and the like, a C1 to C15 alkylene group, a C2 to C15 alkenyl group such as an ethenyl group or a propenyl group, a C2 to C15 alkynyl group such as an ethynyl group or a propynyl group, but is not limited thereto.

As used herein, when a definition is not otherwise provided, "aromatic ring" refers to a C6 to C10 hydrocarbon cyclic group (e.g., a C6 to C10 aryl group) providing a conjugated structure or a C2 to C10 heterocyclic group (e.g., a C2 to C10 heteroaryl group) providing a conjugated structure.

As used herein, when a definition is not otherwise provided, "spiro structure" may be a substituted or unsubstituted C5 to C30 hydrocarbon cyclic group, a substituted or unsubstituted C2 to C30 heterocyclic group, or a fused ring thereof. The substituted or unsubstituted C5 to C30 hydrocarbon cyclic group may be for example a substituted or unsubstituted C5 to C30 cycloalkyl group (e.g., a substituted or unsubstituted C5 to C20 cycloalkyl group or a substituted or unsubstituted C5 to C10 cycloalkyl group) or a substituted or unsubstituted C6 to C30 aryl group (e.g., a substituted or unsubstituted C6 to C20 aryl group, or a substituted or unsubstituted C6 to C10 aryl group) and the substituted or unsubstituted C2 to C30 heterocyclic group may be for example a substituted or unsubstituted C2 to C20 heterocycloalkyl group (e.g., a substituted or unsubstituted C2 to C10 heterocycloalkyl group) or a substituted or unsubstituted C2 to C20 heteroaryl group (e.g., a substituted or unsubstituted C2 to C10 heteroaryl group).

As used herein, when a definition is not otherwise provided, "fused ring" is a fused ring of two or more substituted or unsubstituted C5 to C30 hydrocarbon cyclic groups, a fused ring of two or more substituted or unsubstituted C2 to C30 heterocyclic groups, or a fused ring of a substituted or unsubstituted C5 to C30 hydrocarbon cyclic group and a substituted or unsubstituted C2 to C30 heterocyclic group (e.g., a fluorenyl group). Herein, the hydrocarbon cyclic group and the hetero cyclic group are as defined above.

As used herein, when a definition is not otherwise provided, "combination" refers to a mixture of two or more, substitution in which one substituent is substituted with another substituent, fusion with each other, or a linkage to each other by a single bond or a C1 to C10 alkylene group.

It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," or the like, respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular" with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel" with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar" with regard to the other elements and/or properties thereof that is equal to or less than 10% (e.g., a. tolerance of ±10%).

It will be understood that elements and/or properties thereof may be recited herein as being "identical" to, "the same" as or "equal" to other elements other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being the "substantially" the same and/or identical encompasses elements and/or properties thereof that have a relative difference in magnitude that is equal to or less than 10%. Further, regardless of whether elements and/or properties thereof are modified with "substantially," it will be understood that these elements and/or properties thereof should be construed as including a manufacturing or operational tolerance (e.g., ±10%) around the stated elements and/or properties thereof.

When the term "about" is used in this specification in connection with a numerical value, it is intended that the associated numerical value includes a manufacturing or operational tolerance (e.g., ±10%) around the stated numerical value.

Hereinafter, a composition for a photoelectric device according to some example embodiments is described. The composition for a photoelectric device includes a p-type semiconductor compound represented by Chemical Formula 1 and an n-type semiconductor compound.

[Chemical Formula 1]

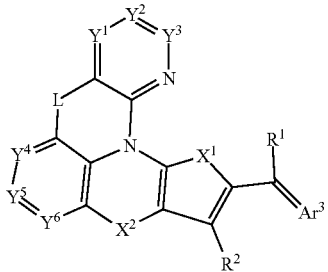

In Chemical Formula 1,

L is —O—, —S—, —Se—, —Te—, —NR$^{a1}$—, —BR$^{a2}$—, —SiR$^b$R$^c$—, —SiR$^{bb}$R$^{cc}$—, —GeR$^d$R$^e$—, —GeR$^{dd}$R$^{ee}$—, —(CR$^f$R$^g$)$_{n1}$—, —(CR$^{ff}$R$^{gg}$)—, —(C(R$^m$)=C(R$^n$))—, —(C(R$^{mm}$)=C(R$^{nn}$))—, —(C(R$^p$)=N)—, or a single bond, wherein R$^{a1}$, R$^{a2}$, R$^b$, R$^c$, R$^d$, R$^e$, R$^f$, R$^g$, R$^m$, R$^n$, and R$^p$ are each independently hydrogen, deuterium, a halogen, a substituted or unsubstituted C1 to C20 alkyl group, a substituted or unsubstituted C6 to C20 aryl group, or a substituted or unsubstituted C6 to C20 aryloxy group, each pair of R$^{bb}$ and R$^{cc}$, R$^{dd}$ and R$^{ee}$, R$^{ff}$ and R$^{gg}$, or R$^{mm}$ and R$^{nn}$ are linked to each other to form a ring structure, and n1 of —(CR$^f$R$^g$)$_{n1}$— is 1 or 2, or L is optionally linked to Y$^1$ or Y$^4$ to provide a ring structure, Y$^1$ to Y$^6$ are each independently N or CR$^k$, wherein R$^k$ is hydrogen, deuterium, a halogen, a cyano group, a nitro group, a hydroxyl group, amine group, a substituted or unsubstituted C1 to C10 alkyl group, or a substituted or unsubstituted C1 to C10 alkoxy group or adjacent R$^k$'s are linked to each other to provide a substituted or unsubstituted C6 to C30 arene group, a substituted or unsubstituted C3 to C30 heteroarene group, or a condensed ring thereof, X$^1$ is —S—, —Se—, —Te—, —S(=O)—, —S(=O)$_2$—, —NR$^{a1}$—, —BR$^{a2}$—, —SiR$^b$R$^c$—, —SiR$^{bb}$R$^{cc}$—, —GeR$^d$R$^e$—, —GeR$^{dd}$R$^{ee}$—, —CR$^f$R$^g$—, or —CR$^{ff}$R$^{gg}$—, wherein R$^{a1}$, R$^{a2}$, R$^b$, R$^c$, R$^d$, R$^e$, R$^f$, and R$^g$ are each independently hydrogen, deuterium, a halogen, a cyano group, a substituted or unsubstituted C1 to C20 alkyl group, a substituted or unsubstituted C1 to C20 alkoxy group, a substituted or unsubstituted C6 to C20 aryl group, a substituted or unsubstituted C6 to C20 aryloxy group, or a substituted or unsubstituted C3 to C20 heteroaryl group, and each pair of R$^{bb}$ and R$^{cc}$, R$^{dd}$ and R$^{ee}$, or R$^{ff}$ and R$^{gg}$ are linked to each other to provide a ring structure, X$^2$ is —O—, —S—, —Se—, —Te—, —S(=O)—, —S(=O)$_2$—, —NR$^{a1}$—, —BR$^{a2}$—, —SiR$^b$R$^c$—, —SiR$^{bb}$R$^{cc}$—, —GeR$^d$R$^e$—, —GeR$^{dd}$R$^{ee}$—, —(CR$^f$R$^g$)$_{n1}$—, —(CR$^{ff}$R$^{gg}$)—, —(C(R$^m$)=C(R$^n$))—, —(C(R$^{mm}$)=C(R$^{nn}$))—, or —(C(R$^p$)=N)—, wherein R$^{a1}$, R$^{a2}$, R$^b$, R$^c$, R$^d$, R$^e$, R$^f$, R$^g$, R$^m$, R$^n$, and R$^p$ are each independently hydrogen, deuterium, a halogen, a cyano group, a substituted or unsubstituted C1 to C20 alkyl group, a substituted or unsubstituted C1 to C20 alkoxy group, a substituted or unsubstituted C6 to C20 aryl group, a substituted or unsubstituted C6 to C20 aryloxy group or a substituted or unsubstituted C3 to C20 heteroaryl group, and each pair of R$^{bb}$ and R$^{cc}$, R$^{dd}$ and R$^{ee}$, R$^{ff}$ and R$^{gg}$, or R$^{mm}$ and R$^{nn}$ is linked to each other to provide a ring structure, and n1 of —(CR$^f$R$^g$)$_{n1}$— is 1 or 2, Ar$^3$ is a substituted or unsubstituted C6 to C30 hydrocarbon cyclic group having at least one functional group selected from C=O, C=S, C=Se, and C=Te, a substituted or unsubstituted C2 to C30 heterocyclic group having at least one functional group selected from C=O, C=S, C=Se, and C=Te, or a fused ring thereof, and R$^1$ and R$^2$ are each independently hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a substituted or unsubstituted C2 to C30 acyl group, a halogen, a cyano group (—CN), a cyano-containing group, a nitro group, a pentafluorosulfanyl group (—SF$_5$), a hydroxyl group, an amine group, a hydrazine group, a hydrazone group, a carboxyl group or a salt thereof, a sulfonic acid group or a salt thereof, a phosphoric acid group or a salt thereof, —SiR$^a$R$^b$R$^c$, wherein R$^a$, R$^b$, and R$^c$ may each independently be hydrogen or a substituted or unsubstituted C1 to C10 alkyl group, or any combination thereof.

The compound represented by Chemical Formula 1 includes an electron donor moiety including a first ring moiety including nitrogen (N, first nitrogen) and L and an X$^1$-containing second ring moiety; and an electron acceptor moiety represented by Ar$^3$; wherein the first ring moiety including the nitrogen (N, first nitrogen) and L and the X$^1$-containing second ring moiety are fused to each other by a third ring moiety including nitrogen (N, first nitrogen) and X$^2$. In Chemical Formula 1, by fusing the first ring moiety including the nitrogen (N, first nitrogen) and L and the X$^1$-containing second ring moiety, by the third ring moiety including nitrogen (N, first nitrogen) and X$^2$ to provide a fused ring, stability of the molecular structure of the compound may be improved, decomposition of the compound in the deposition process may be limited and/or prevented, so that the reliability of the device may be improved. In addition, by including N (second nitrogen) in the aromatic ring group including Y$^1$, Y$^2$, Y$^3$, and N (second nitrogen), N (second nitrogen), X$^1$, and the functional group present in Ar$^3$ (C=O, C=S, C=Se, or C=Te) may increase the intramolecular interaction to improve the absorption intensity at a specific wavelength and may increase planarity of the molecular structure.

The compound represented by Chemical Formula 1 includes an electron donor moiety including a first ring moiety including nitrogen (N, the first nitrogen) and L and an X$^1$-containing second ring moiety; and an electron acceptor moiety represented by Ar$^3$; wherein the first ring moiety including the nitrogen (N, the first nitrogen) and L and the X$^1$-containing second ring moiety are fused to each other by a third ring moiety including nitrogen (N, the first nitrogen) and X$^2$ to provide a fused ring.

In some example embodiments, the compound of Chemical Formula 1 may be represented by Chemical Formula 2A.

[Chemical Formula 2A]

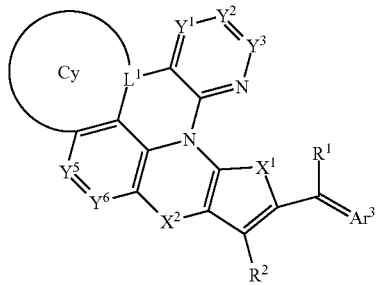

$X^1$, $X^2$, $Ar^3$, $R^1$, $R^2$, $Y^1$ to $Y^3$, $Y^5$, and $Y^6$ are the same as $X^1$, $X^2$, $Ar^3$, $R^1$, $R^2$, $Y^1$ to $Y^3$, $Y^5$ and $Y^6$, respectively, in Chemical Formula 1, $L^1$ may be N, B, Si, Ge, or C, and Cy may be a substituted or unsubstituted C6 to C30 arene group, a substituted or unsubstituted C3 to C30 heteroarene group, a substituted or unsubstituted C5 to C30 cycloalkene group, a substituted or unsubstituted C5 to C30 heterocycloalkene group, or a condensed ring thereof.

In some example embodiments, in Chemical Formula 1, Chemical Formula 2A, Chemical Formula 2A-1, or Chemical Formula 2A-2, $Y^3$ may be N or $CR^k$, wherein $R^k$ may be a halogen, a cyano group, a C1 to C10 haloalkyl group, or a C1 to C10 cyanoalkyl group (the carbon number does not include the carbon in the cyano group). In some example embodiments, $Y^3$, N (first nitrogen and second nitrogen), $X^1$, and the functional group (C=O, C=S, C=Se, or C=Te) of $Ar^3$ increase an intramolecular interaction, thereby increasing the absorption intensity at a specific wavelength.

In some example embodiments, in Chemical Formula 1, Chemical Formula 2A, Chemical Formula 2A-1, or Chemical Formula 2A-2, $Y^6$ may be N or $CR^k$, wherein $R^k$ may be a halogen, a cyano group, a C1 to C10 haloalkyl group, or a C1 to C10 cyanoalkyl group, and $X^2$ may be —O—, —S—, —Se—, —Te—, —S(=O)—, —S(=O)$_2$—, —$NR^{a1}$—, —$BR^{a2}$—, —$SiR^bR^c$—, —$GeR^dR^e$—, —$(CR^fR^g)_{n1}$—, —$(C(R''')=C(R''))$—, or —$(C(R^p)=N)$—, wherein $R^{a1}$, $R^{a2}$, $R^b$, $R^c$, $R^d$, $R^e$, $R^f$, $R^g$, $R'''$, $R''$, and $R^p$ may each independently be a halogen, a C1 to C20 haloalkyl group, or a C1 to C20 cyanoalkyl group. In some example embodiments, $Y^6$ and $X^2$ may increase an intramolecular interaction, thereby improving the absorption intensity at a specific wavelength.

In some example embodiments, in Chemical Formula 1, when $Y^1$ and $Y^4$ are $CR^k$, at least one of $Y^1$ or $Y^4$ and L may be linked to each other to provide a fused ring. A structure in which $Y^4$ and L are linked may be represented by Chemical Formula 2A, and a structure in which $Y^1$ and L are linked may be represented by Chemical Formula 2B.

[Chemical Formula 2A]

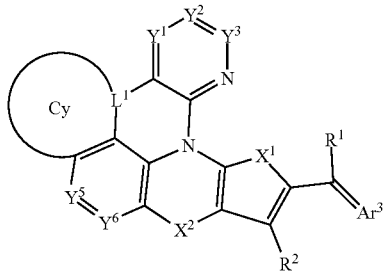

In Chemical Formula 2A, $X^1$, $X^2$, $Ar^3$, $R^1$, $R^2$, $Y^1$ to $Y^3$, $Y^5$, and $Y^6$ are the same as $X^1$, $X^2$, $Ar^3$, $R^1$, $R^2$, $Y^1$ to $Y^3$, $Y^5$, and $Y^6$, respectively, in Chemical Formula 1, $L^1$ may be N, B, Si, Ge, or C, and Cy may be a substituted or unsubstituted C6 to C30 arene group, a substituted or unsubstituted C3 to C30 heteroarene group, a substituted or unsubstituted C5 to C30 cycloalkene group, a substituted or unsubstituted C5 to C30 heterocycloalkene group, or a condensed ring thereof.

[Chemical Formula 2B]

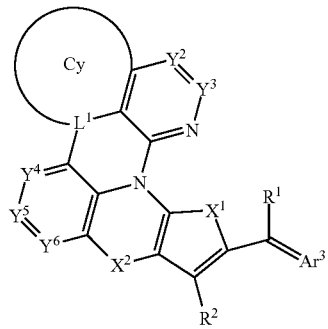

In Chemical Formula 2B, $X^1$, $X^2$, $Ar^3$, $R^1$, $R^2$, $Y^2$, $Y^3$, $Y^4$, $Y^5$, and $Y^6$ are the same as $X^1$, $X^2$, $Ar^3$, $R^1$, $R^2$, $Y^2$, $Y^3$, $Y^4$, $Y^5$, and $Y^6$, respectively, in Chemical Formula 1, $L^1$ may be N, B, Si, Ge, or C, and Cy may be a substituted or unsubstituted C6 to C30 arene group, a substituted or unsubstituted C3 to C30 heteroarene group, a substituted or unsubstituted C5 to C30 cycloalkene group, a substituted or unsubstituted C5 to C30 heterocycloalkene group, or a condensed ring thereof.

In some example embodiments, Cy of Chemical Formula 2A and Chemical Formula 2B may be an arene group, a heteroarene group, a cycloalkene group, or a heterocycloalkene group, and they may have a 5-membered to 10-membered ring structure. The heteroarene group or heterocycloalkene group may include N in the ring.

When Cy of Chemical Formula 2A has a 6-membered ring structure, the compound of Chemical Formula 2A may be represented by Chemical Formula 2A-1.

[Chemical Formula 2A-1]

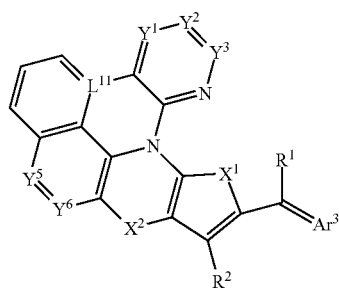

In Chemical Formula 2A-1, $X^1$, $X^2$, $Ar^3$, $R^1$, $R^2$, $Y^1$ to $Y^3$, $Y^5$, and $Y^6$ are the same as $X^1$, $X^2$, $Ar^3$, $R^1$, $R^2$, $Y^1$ to $Y^3$, $Y^5$, and $Y^6$, respectively, in Chemical Formula 1, $L^{11}$ may be Si, Ge, or C, and hydrogen of each aromatic ring may be replaced by at least one substituent selected from deuterium, a halogen, a substituted or unsubstituted C1 to C20 alkyl group, a substituted or unsubstituted C1 to C20 alkoxy group, a substituted or unsubstituted C6 to C20 aryl group, and a substituted or unsubstituted C6 to C20 aryloxy group.

In some example embodiments, CH of a 6-membered ring structure in Chemical Formula 2A-1 may be replaced by N, and one or more (e.g., 1, 2, or 3) N may be included in one 6-member ring structure.

When Cy of Chemical Formula 2B has a 6-membered ring structure, the compound of Chemical Formula 2B may be represented by Chemical Formula 2B-1.

[Chemical Formula 2B-1]

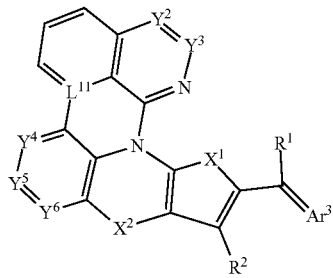

In Chemical Formula 2B-1, $X^1$, $X^2$, $Ar^3$, $R^1$, $R^2$, $Y^2$, $Y^3$, $Y^4$, $Y^5$, and $Y^6$ are the same as $X^1$, $X^2$, $Ar^3$, $R^1$, $R^2$, $Y^2$, $Y^3$, $Y^4$, $Y^5$, and $Y^6$, respectively, in Chemical Formula 1, $L^{11}$ may be Si, Ge, or C, and hydrogen of each aromatic ring may be replaced by at least one substituent selected from deuterium, a halogen, a substituted or unsubstituted C1 to C20 alkyl group, a substituted or unsubstituted C1 to C20 alkoxy group, a substituted or unsubstituted C6 to C20 aryl group, and a substituted or unsubstituted C6 to C20 aryloxy group.

In some example embodiments, CH of a 6-membered ring structure in Chemical Formula 2B-1 may be replaced by N, and one or more (e.g., 1, 2, or 3) N may be included in one 6-member ring structure.

In some example embodiments, in Chemical Formula 1, $Y^1$(CR$^k$) and L may be linked to each other to provide a first fused ring and $Y^4$ (CR$^k$) and L may be linked to each other to provide a second fused ring. When the first fused ring and the second fused ring each have a 6-membered ring structure, the compound represented by Chemical Formula 1 may be represented by Chemical Formula 2C-1.

[Chemical Formula 2C-1]

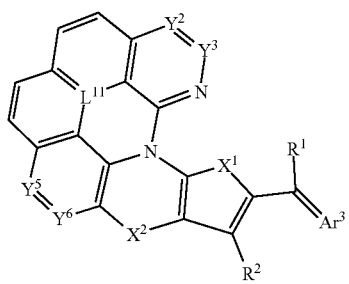

In Chemical Formula 2C-1, $X^1$, $X^2$, $Ar^3$, $R^1$, $R^2$, $Y^2$, $Y^3$, $Y^5$, and $Y^6$ are the same as $X^1$, $X^2$, $Ar^3$, $R^1$, $R^2$, $Y^2$, $Y^3$, $Y^5$, and $Y^6$, respectively, in Chemical Formula 1, $L^{11}$ may be Si, Ge, or C, and hydrogen of each aromatic ring may be replaced by at least one substituent selected from deuterium, a halogen, a substituted or unsubstituted C1 to C20 alkyl group, a substituted or unsubstituted C1 to C20 alkoxy group, a substituted or unsubstituted C6 to C20 aryl group, and a substituted or unsubstituted C6 to C20 aryloxy group.

In some example embodiments, CH of a 6-membered ring structure in Chemical Formula 2C-1 may be replaced by N, and one or more (e.g., 1, 2, or 3) N may be included in one 6-member ring structure.

In some example embodiments, in Chemical Formula 1, when $Y^1$ to $Y^3$ are CR$^k$ and adjacent R$^k$'s are linked to each other to provide a fused ring (a substituted or unsubstituted C6 to C30 arene group, a substituted or unsubstituted C3 to C30 heteroarene group, a substituted or unsubstituted C5 to C30 cycloalkene group, a substituted or unsubstituted C5 to C30 heterocycloalkene group, or any combination thereof), it may be represented by one of Chemical Formulas 3A-1 to 3A-4.

[Chemical Formula 3A-1]

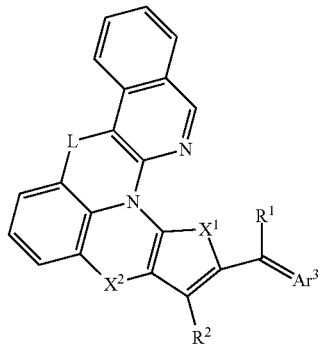

[Chemical Formula 3A-2]

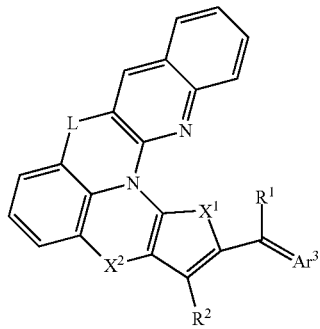

[Chemical Formula 3A-3]

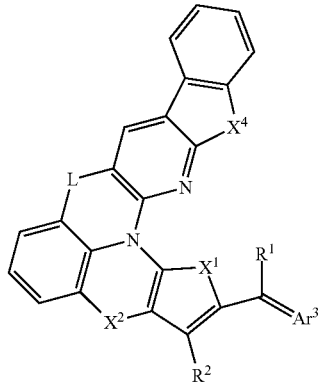

-continued

[Chemical Formula 3A-4]

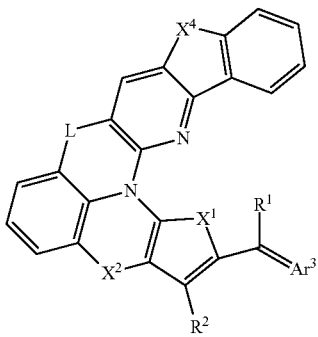

[Chemical Formula 3A-6]

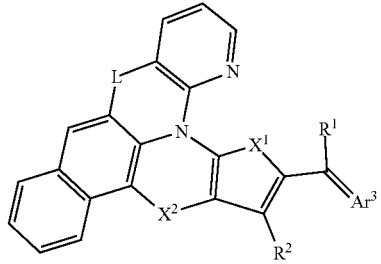

[Chemical Formula 3A-7]

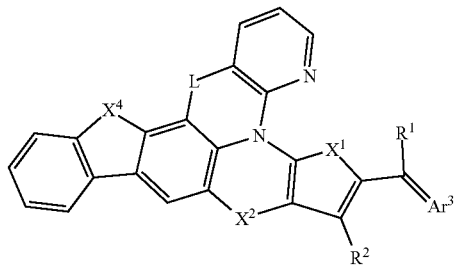

[Chemical Formula 3A-8]

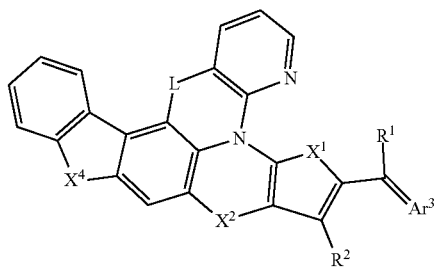

In Chemical Formula 3A-1 to Chemical Formula 3A-4, $X^1$, $X^2$, $Ar^3$, $R^1$, $R^2$, and L are the same as $X^1$, $X^2$, $Ar^3$, $R^1$, $R^2$, and L, respectively, in Chemical Formula 1, $X^4$ may be —O—, —S—, —Se—, —Te—, —S(=O)—, —S(=O)$_2$—, —NR$^{a1}$—, —BR$^{a2}$—, —SiR$^b$R$^c$—, —SiR$^{bb}$R$^{cc}$—, —GeR$^d$R$^e$—, —GeR$^{dd}$R$^{ee}$—, —CR$^f$R$^g$—, —CR$^{ff}$R$^{gg}$—, —CR$^h$=CR$^i$—, or —CR$^{hh}$=CR$^{ii}$—, wherein R$^{a1}$, R$^{a2}$, R$^b$, R$^c$, R$^d$, R$^e$, R$^f$, R$^g$, R$^h$, and R$^i$ may each independently be hydrogen, deuterium, a halogen, a cyano group, a substituted or unsubstituted C1 to C20 alkyl group, a substituted or unsubstituted C1 to C20 alkoxy group, a substituted or unsubstituted C6 to C20 aryl group, a substituted or unsubstituted C6 to C20 aryloxy group or a substituted or unsubstituted C3 to C20 heteroaryl group, and each pair of R$^{bb}$ and R$^{cc}$, R$^{dd}$ and R$^{ee}$, R$^{ff}$ and R$^{gg}$ or R$^{hh}$ and R$^{ii}$ may be linked to each other to provide a ring structure, and hydrogen of each aromatic ring may be replaced by at least one substituent selected from deuterium, a halogen, a substituted or unsubstituted C1 to C20 alkyl group, a substituted or unsubstituted C1 to C20 alkoxy group, a substituted or unsubstituted C6 to C20 aryl group, and a substituted or unsubstituted C6 to C20 aryloxy group.

In some example embodiments, in Chemical Formula 3A-1 to Chemical Formula 3A-4, CH of the aromatic ring may be replaced by N and one or more (e.g., 1, 2, or 3) N may be included in one aromatic ring.

In Chemical Formula 1, when $Y^4$ to $Y^6$ are CR$^k$ and adjacent R$^k$'s are linked to each other to provide a fused ring (a substituted or unsubstituted C6 to C30 arene group, a substituted or unsubstituted C3 to C30 heteroarene group, a substituted or unsubstituted C5 to C30 cycloalkene group, a substituted or unsubstituted C5 to C30 heterocycloalkene group, or any combination thereof), it may be represented by one of Chemical Formula 3A-5 to Chemical Formula 3A-8.

[Chemical Formula 3A-5]

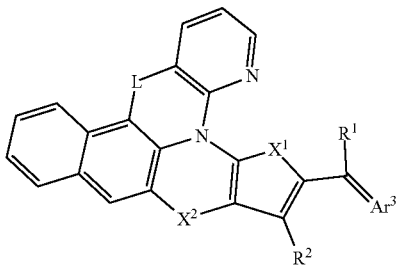

In Chemical Formula 3A-5 to Chemical Formula 3A-8, $X^1$, $X^2$, $Ar^3$, $R^1$, $R^2$, and L are the same as $X^1$, $X^2$, $Ar^3$, $R^1$, $R^2$, and L, respectively, in Chemical Formula 1, $X^4$ may be —O—, —S—, —Se—, —Te—, —S(=O)—, —S(=O)$_2$—, —NR$^{a1}$—, —BR$^{a2}$—, —SiR$^b$R$^c$—, —SiR$^{bb}$R$^{cc}$—, —GeR$^d$R$^e$—, —GeR$^{dd}$R$^{ee}$—, —CR$^f$R$^g$—, —CR$^{ff}$R$^{gg}$—, —CR$^h$=CR$^i$—, or —CR$^{hh}$=CR$^{ii}$—, wherein R$^{a1}$, R$^{a2}$, R$^b$, R$^c$, R$^d$, R$^e$, R$^f$, R$^g$, R$^h$, and R$^i$ may each independently be hydrogen, deuterium, a halogen, a cyano group, a substituted or unsubstituted C1 to C20 alkyl group, a substituted or unsubstituted C1 to C20 alkoxy group, a substituted or unsubstituted C6 to C20 aryl group, a substituted or unsubstituted C6 to C20 aryloxy group, or a substituted or unsubstituted C3 to C20 heteroaryl group, and each pair of R$^{bb}$ and R$^{cc}$, R$^{dd}$ and R$^{ee}$, R$^{ff}$ and R$^{gg}$, or R$^{hh}$ and R$^{ii}$ are linked to each other to provide a ring structure, and hydrogen of each aromatic ring may be replaced by at least one substituent selected from deuterium, a halogen, a substituted or unsubstituted C1 to C20 alkyl group, a substituted or unsubstituted C1 to C20 alkoxy group, a substituted or unsubstituted C6 to C20 aryl group, and a substituted or unsubstituted C6 to C20 aryloxy group.

In some example embodiments, in Chemical Formula 3A-5 to Chemical Formula 3A-8, CH of the aromatic ring may be replaced by N and one or more (e.g., 1, 2, or 3) N may be included in one aromatic ring.

In $X^1$, $X^2$, and L of Chemical Formula 1, $X^1$ and $X^2$ in Chemical Formula 2A, 2B, 2A-1, 2B-1 and 2C-1, and $X^1$, $X^2$ and $X^4$ of Chemical Formulae 3A-1 to 3A-8, the respective ring structures thereof may each be a spiro structure or a fused ring structure. The spiro structure may be a substituted or unsubstituted C5 to C30 hydrocarbon cyclic group or a substituted or unsubstituted C2 to C30 heterocyclic group. The substituted or unsubstituted C5 to C30 hydrocarbon cyclic group may be, for example, a substituted or unsubstituted C5 to C30 cycloalkyl group (e.g., a substituted or unsubstituted C3 to C20 cycloalkyl group or a substituted or unsubstituted C3 to C10 cycloalkyl group) or a fused ring of a substituted or unsubstituted C5 to C30 cycloalkyl group (e.g., a substituted or unsubstituted C3 to C20 cycloalkyl group or a substituted or unsubstituted C3 to C10 cycloalkyl group) and a substituted or unsubstituted C6 to C30 aryl group (e.g., a substituted or unsubstituted C6 to C20 aryl group or a substituted or unsubstituted C6 to C10 aryl group). Examples of the fused ring include a fluorenyl group and an indanyl group. The substituted or unsubstituted C2 to C30 heterocyclic group may be for example a substituted or unsubstituted C2 to C30 heterocycloalkyl group (e.g., a substituted or unsubstituted C2 to C20 heterocycloalkyl group or a substituted or unsubstituted C2 to C10 heterocycloalkyl group).

The fused ring structure may have a fused substituted or unsubstituted C5 to C30 hydrocarbon cyclic group, a fused substituted or unsubstituted C2 to C30 heterocyclic group, or a fused ring thereof. The substituted or unsubstituted C5 to C30 hydrocarbon cyclic group may be for example a substituted or unsubstituted C5 to C30 cycloalkyl group (e.g., a substituted or unsubstituted C5 to C20 cycloalkyl group, or a substituted or unsubstituted C5 to C10 cycloalkyl group) or a substituted or unsubstituted C6 to C30 aryl group (e.g., a substituted or unsubstituted C6 to C20 aryl group or a substituted or unsubstituted C6 to C10 aryl group) and the substituted or unsubstituted C2 to C30 heterocyclic group may be for example a substituted or unsubstituted C2 to C30 heterocycloalkyl group (e.g., a substituted or unsubstituted C2 to C20 heterocycloalkyl group or a substituted or unsubstituted C2 to C10 heterocycloalkyl group) or a substituted or unsubstituted C2 to C30 heteroaryl group (e.g., a substituted or unsubstituted C2 to C20 heteroaryl group, or a substituted or unsubstituted C2 to C10 heteroaryl group).

The spiro structure may include a moiety represented by Chemical Formula 4.

[Chemical Formula 4]

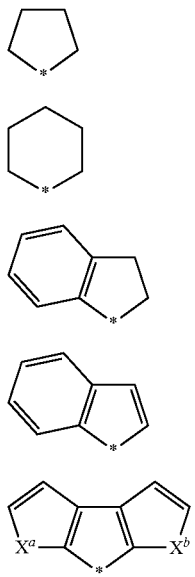

-continued

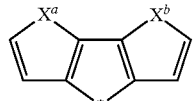  (6)

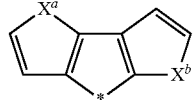  (7)

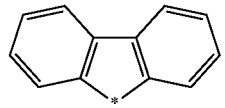  (8)

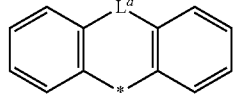  (9)

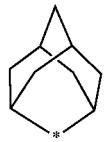  (10)

In Chemical Formula 4, $X^a$ and $X^b$ may each independently be —O—, —S—, —Se—, —Te—, —S(=O)—, —S(=O)$_2$—, —NR$^{a1}$—, —BR$^{a2}$—, —SiR$^b$R$^c$—, —SiR$^{bb}$R$^{cc}$—, —GeR$^d$R$^e$—, or —GeR$^{dd}$R$^{ee}$—, wherein R$^{a1}$, R$^a2$, R$^b$, R$^c$, R$^d$, and R$^e$ may each independently be hydrogen, deuterium, a halogen, a cyano group, a substituted or unsubstituted C1 to C20 alkyl group, a substituted or unsubstituted C1 to C20 alkoxy group, a substituted or unsubstituted C6 to C20 aryl group, a substituted or unsubstituted C6 to C20 aryloxy group, or a substituted or unsubstituted C3 to C20 heteroaryl group, and each pair of R$^{bb}$ and R$^{cc}$ or R$^{dd}$ and R$^{ee}$ may be linked to each other to provide a ring structure, $L^a$ may be —O—, —S—, —Se—, —Te—, —NR$^{a1}$—, —BR$^{a2}$—, —SiR$^b$R$^c$—, —GeR$^d$R$^e$—, —(CR$^f$R$^g$)$_{n1}$—, —(C(R$^p$)=N)—, or a single bond, wherein R$^{a1}$, R$^{a2}$, R$^b$, R$^c$, R$^d$, R$^e$, R$^f$, R$^g$, and R$^p$ may each independently be hydrogen, deuterium, a halogen, a cyano group, a substituted or unsubstituted C1 to C20 alkyl group, a substituted or unsubstituted C1 to C20 alkoxy group, a substituted or unsubstituted C6 to C20 aryl group, or a substituted or unsubstituted C6 to C20 aryloxy group and n1 of —(CR$^f$R$^g$)$_{n1}$— may be 1 or 2,

* may be a linking point, and hydrogen of each ring (e.g., at least one hydrogen of each ring of the moieties (1), (2), (3), (4), (5), (6), (7), (8), or (9)) may optionally be replaced by at least one substituent selected from deuterium, a halogen, a substituted or unsubstituted C1 to C20 alkyl group, a substituted or unsubstituted C1 to C20 alkoxy group, a substituted or unsubstituted C6 to C20 aryl group, and a substituted or unsubstituted C6 to C20 aryloxy group.

In Chemical Formula 4, one or more CH present in the aromatic ring of the moieties (3), (4), (5), (6), (7), (8), or (9) may be replaced by N.

In Chemical Formula 1, Ar$^3$ may be represented by Chemical Formula 5.

[Chemical Formula 5]

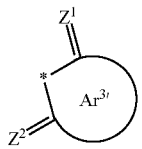

In Chemical Formula 5, $Ar^{3'}$ may be a substituted or unsubstituted C6 to C30 aryl group or a substituted or unsubstituted C3 to C30 heteroaryl group, $Z^1$ may be O, S, Se, or Te, $Z^2$ may be O, S, Se, Te, or $CR^aR^b$, wherein $R^a$ and $R^b$ may each independently be hydrogen, a substituted or unsubstituted C1 to C10 alkyl group, a cyano group, or a cyano-containing group, provided that when $Z^2$ is $CR^aR^b$, at least one of $R^a$ or $R^b$ is a cyano group or a cyano-containing group, and

* may be a linking point.

In Chemical Formula 1, $Ar^3$ may be a cyclic group represented by one of Chemical Formula 6A to Chemical Formula 6G.

[Chemical Formula 6A]

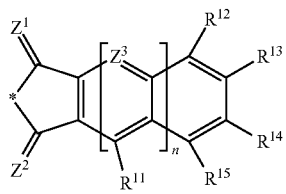

In Chemical Formula 6A, $Z^1$ may be O, S, Se, or Te, $Z^2$ may be O, S, Se, Te, or $CR^aR^b$, wherein $R^a$ and $R^b$ may each independently be hydrogen, a substituted or unsubstituted C1 to C10 alkyl group, a cyano group, or a cyano-containing group, provided that when $Z^2$ is $CR^aR^b$, at least one of $R^a$ or $R^b$ is a cyano group or a cyano-containing group, $Z^3$ is N or $CR^c$, wherein $R^c$ is hydrogen, deuterium, or a substituted or unsubstituted C1 to C10 alkyl group, $R^{11}$, $R^{12}$, $R^{13}$, $R^{14}$, and $R^{15}$ may each independently be hydrogen, deuterium, a substituted or unsubstituted C1 to C30 alkyl group, a substituted or unsubstituted C6 to C30 aryl group, a substituted or unsubstituted C4 to C30 heteroaryl group, a halogen, a cyano group (—CN), a cyano-containing group, or any combination thereof, wherein $R^{12}$ and $R^{13}$ and $R^{14}$ and $R^{15}$ may each independently be present or may be linked to each other to provide a fused aromatic ring, n may be 0 or 1, and

* may be a linking point.

In some example embodiments, in Chemical Formula 6A, at least one of $CR^{11}$, $CR^{12}$, $CR^{13}$, $CR^{14}$, or $CR^{15}$ may be replaced by nitrogen (N). That is, the substituted or unsubstituted benzene ring moiety of Chemical Formula 6A may include a hetero atom (N).

[Chemical Formula 6B]

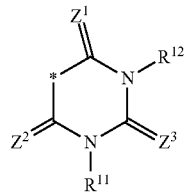

In Chemical Formula 6B, $Z^1$ may be O, S, Se, or Te, $Z^2$ may be O, S, Se, Te, or $CR^aR^b$, wherein $R^a$ and $R^b$ may each independently be hydrogen, a substituted or unsubstituted C1 to C10 alkyl group, a cyano group, or a cyano-containing group, provided that when $Z^2$ is $CR^aR^b$, at least one of $R^a$ or $R^b$ is a cyano group or a cyano-containing group, $Z^3$ may be O, S, Se, Te, or $C(R^a)(CN)$, wherein $R^a$ is hydrogen, a cyano group (—CN), or a C1 to C10 alkyl group, $R^{11}$ and $R^{12}$ may each independently be hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C4 to C30 heteroaryl group, a halogen, a cyano group (—CN), or any combination thereof, and

* may be a linking point.

[Chemical Formula 6C]

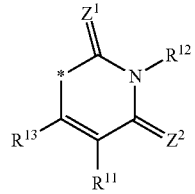

In Chemical Formula 6C, $Z^1$ may be O, S, Se, or Te, $Z^2$ may be O, S, Se, Te, or $CR^aR^b$, wherein $R^a$ and $R^b$ may each independently be hydrogen, a substituted or unsubstituted C1 to C10 alkyl group, a cyano group, or a cyano-containing group, provided that when $Z^2$ is $CR^aR^b$, at least one of $R^a$ or $R^b$ is a cyano group or a cyano-containing group, $R^{11}$, $R^{12}$, and $R^{13}$ may each independently be hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C4 to C30 heteroaryl group, a halogen, a cyano group (—CN), or any combination thereof, and

* may be a linking point.

[Chemical Formula 6D]

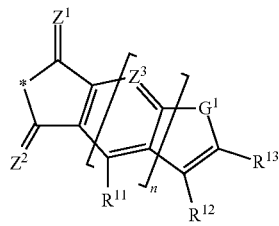

In Chemical Formula 6D, $Z^1$ may be O, S, Se, or Te, $Z^2$ may be O, S, Se, Te, or $CR^aR^b$, wherein $R^a$ and $R^b$ may each independently be hydrogen, a substituted or unsubstituted C1 to C10 alkyl group, a cyano group, or a cyano-containing group, provided that when $Z^2$ is $CR^aR^b$, at least one of $R^a$ or $R^b$ is a cyano group or a cyano-containing group, $Z^3$ may be N or $CR^c$, wherein $R^c$ may be hydrogen or a substituted or unsubstituted C1 to C10 alkyl group, $G^1$ may be O, S, Se, Te, $SiR^xR^y$, or $GeR^zR^w$, wherein $R^x$, $R^y$, $R^z$, and $R^w$ may each independently be hydrogen, deuterium, a halogen, a substituted or unsubstituted C1 to C20 alkyl group, or a substituted or unsubstituted C6 to C20 aryl group, $R^{11}$, $R^{12}$, and $R^{13}$ may each independently be hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C4 to C30 heteroaryl group, a halogen, a cyano group, a cyano-containing group, or any combination thereof, wherein $R^{12}$ and $R^{13}$ may each independently be present or may be linked to each other to provide a fused aromatic ring, n may be 0 or 1, and

* may be a linking point.

[Chemical Formula 6E]

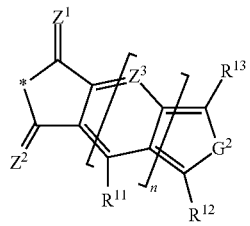

In Chemical Formula 6E, $Z^1$ may be O, S, Se, or Te, $Z^2$ may be O, S, Se, Te, or $CR^aR^b$, wherein $R^a$ and $R^b$ may each independently be hydrogen, a substituted or unsubstituted C1 to C10 alkyl group, a cyano group, or a cyano-containing group, provided that when $Z^2$ is $CR^aR^b$, at least one of $R^a$ or $R^b$ is a cyano group or a cyano-containing group, $Z^3$ may be N or $CR^c$, wherein $R^c$ may be hydrogen or a substituted or unsubstituted C1 to C10 alkyl group, $G^2$ may be O, S, Se, Te, $SiR^xR^y$, or $GeR^zR^w$, wherein $R^x$, $R^y$, $R^z$, and $R^w$ may each independently be hydrogen, deuterium, a halogen, a substituted or unsubstituted C1 to C20 alkyl group, or a substituted or unsubstituted C6 to C20 aryl group, $R^{11}$, $R^{12}$, and $R^{13}$ may each independently be hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C4 to C30 heteroaryl group, a halogen, a cyano group, a cyano-containing group, or any combination thereof, n may be 0 or 1, and

* may be a linking point.

[Chemical Formula 6F]

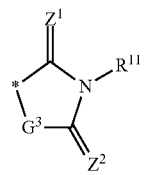

In Chemical Formula 6F, $Z^1$ is O, S, Se, or Te, $Z^2$ may be O, S, Se, Te, or $CR^aR^b$, wherein $R^a$ and $R^b$ may each independently be hydrogen, a substituted or unsubstituted C1 to C10 alkyl group, a cyano group, or a cyano-containing group, provided that when $Z^2$ is $CR^aR^b$, at least one of $R^a$ or $R^b$ is a cyano group or a cyano-containing group, $R^{11}$ may be hydrogen, deuterium, a substituted or unsubstituted C1 to C30 alkyl group, a substituted or unsubstituted C6 to C30 aryl group, a substituted or unsubstituted C4 to C30 heteroaryl group, a halogen, a cyano group (—CN), a cyano-containing group, or any combination thereof, $G^3$ may be O, S, Se, Te, $SiR^xR^y$, or $GeR^zR^w$, wherein $R^x$, $R^y$, $R^z$, and $R^w$ may each independently be hydrogen, deuterium, a halogen, a substituted or unsubstituted C1 to C20 alkyl group, or a substituted or unsubstituted C6 to C20 aryl group, and

* may be a linking point.

[Chemical Formula 6G]

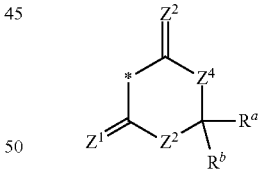

In Chemical Formula 6G, $Z^1$ may be O, S, Se, or Te, $R^a$ and $R^b$ may each independently be hydrogen, a substituted or unsubstituted C1 to C10 alkyl group, a cyano group, or a cyano-containing group, $Z^2$ to $Z^4$ may each independently be O, S, Se, Te, or $CR^cR^d$, wherein $R^c$ and $R^d$ are each independently hydrogen, a substituted or unsubstituted C1 to C10 alkyl group, a cyano group, or a cyano-containing group, provided that when $Z^2$ is $CR^cR^d$, at least one of $R^c$ or $R^d$ is a cyano group or a cyano-containing group, and

* may be a linking point.

The cyclic group represented by Chemical Formula 6A may be a cyclic group represented by Chemical Formula 6A-1 or Chemical Formula 6A-2.

[Chemical Formula 6A-1]

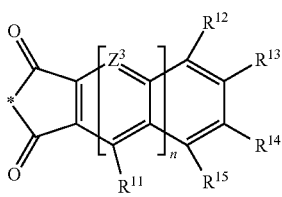

[Chemical Formula 6A-2]

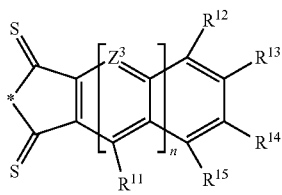

In Chemical Formula 6A-1 and Chemical Formula 6A-2, $Z^3$, $R^{11}$ n $R^{12}$, $R^{13}$, $R^{14}$, and $R^{15}$ are the same as $Z^3$, $R^{11}$, n, $R^{12}$, $R^{13}$, $R^{14}$, and $R^{15}$, respectively, in Chemical Formula 6A.

The cyclic group represented by Chemical Formula 6A may be a cyclic group represented by Chemical Formula 6A-3 when $R^{12}$ and $R^{13}$ and/or $R^{14}$ and $R^{15}$ are each independently linked to form a fused aromatic ring.

[Chemical Formula 6A-3]

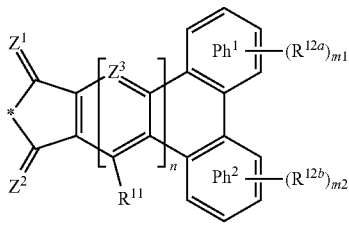

In Chemical Formula 6A-3, $Z^1$, $Z^2$, $Z^3$, $R^{11}$, and n are the same as $Z^1$, $Z^2$, $Z^3$, $R^{11}$, and n, respectively, in Chemical Formula 6A, $R^{12a}$ and $R^{12b}$ may each independently be hydrogen, deuterium, a substituted or unsubstituted C1 to C30 alkyl group, a substituted or unsubstituted C6 to C30 aryl group, a substituted or unsubstituted C4 to C30 heteroaryl group, a halogen, a cyano group (—CN), a cyano-containing group, or any combination thereof, m1 and m2 may each independently be an integer ranging from 0 to 4, and $Ph^1$ and $Ph^2$ refer to a fused phenylene ring, and one of $Ph^1$ or $Ph^2$ may be optionally omitted.

The cyclic group represented by Chemical Formula 6B may be, for example, a cyclic group represented by Chemical Formula 6B-1, 6B-2, or 6B-3.

[Chemical Formula 6B-1]

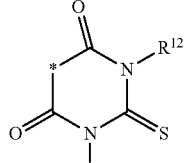

[Chemical Formula 6B-2]

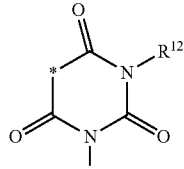

[Chemical Formula 6B-3]

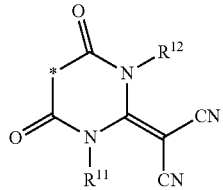

In Chemical Formulas 6B-1, 6B-2, and 6B-3, $R^{11}$ and $R^{12}$ are the same as $R^{11}$ and $R^{12}$, respectively, in Chemical Formula 6B.

The cyclic group represented by Chemical Formula 6C may be, for example, a cyclic group represented by Chemical Formula 6C-1 or 6C-2.

[Chemical Formula 6C-1]

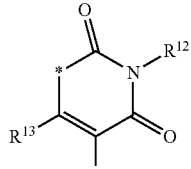

[Chemical Formula 6C-2]

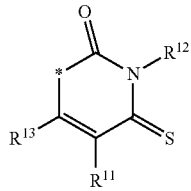

In Chemical Formulas 6C-1 and 6C-2, $R^{11}$ to $R^{13}$ are the same as $R^{11}$ to $R^{13}$, respectively, in Chemical Formula 6C.

In Chemical Formula 1, N of the electron donor moiety, $X^1$ of the $X^1$-containing ring, the functional groups (C=O, C=S, C=Se, or C=Te) of $Ar^3$, which is the electron acceptor moiety increase intramolecular interactions to improve the absorption intensity at a specific wavelength.

Specific examples of the compound represented by Chemical Formula 1 may include compounds of Group 1, but are not limited thereto.

[Group 1]

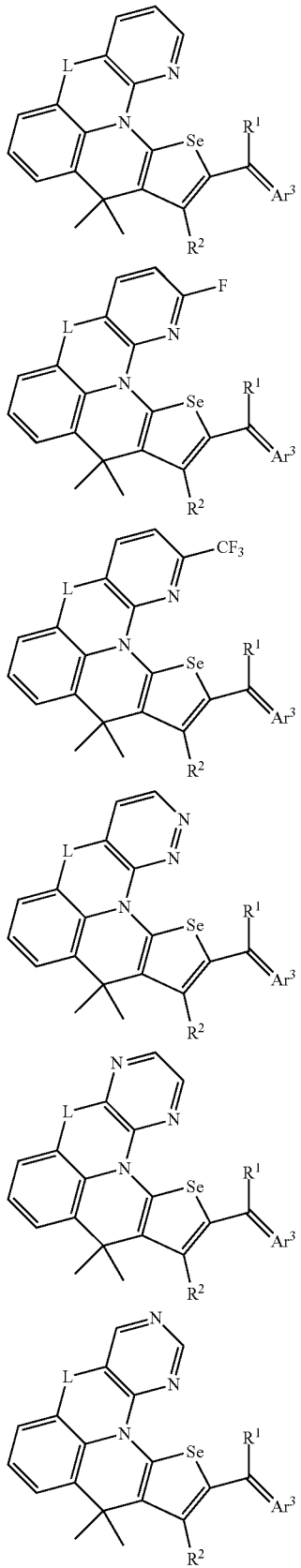

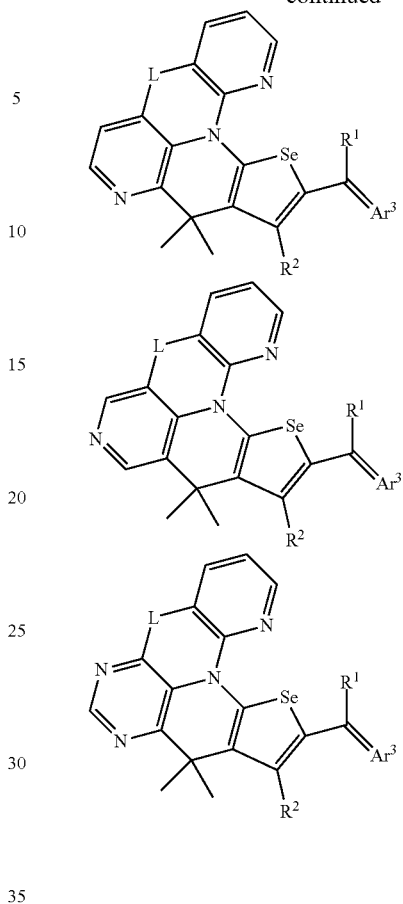

In Group 1, Ar³, R¹, R², and L are the same as Ar³, R¹, R², and L, respectively, in Chemical Formula 1, at least one hydrogen of each aromatic ring may be replaced by at least one substituent selected from deuterium, a halogen, a substituted or unsubstituted C1 to C20 alkyl group, a substituted or unsubstituted C1 to C20 alkoxy group, a substituted or unsubstituted C6 to C20 aryl group, and a substituted or unsubstituted C6 to C20 aryloxy group.

In Group 1, compounds in which $X^1$ is —Se— in Chemical Formula 1, are shown, but the —Se— may be replaced by another linking group of $X^1$ (—S—, —Te—, —S(=O)—, —S(=O)$_2$—, —NR$^{a1}$—, —BR$^{a2}$—, —SiR$^b$R$^c$—, —SiR$^{bb}$R$^{cc}$—, —GeR$^d$R$^e$—, —GeR$^{dd}$R$^{ee}$—, —CR$^f$R$^g$—, or —CR$^{ff}$R$^{gg}$—).

In Group 1, compounds in which $X^2$ is —C(CH$_3$)(CH$_3$))— in Chemical Formula 1, are shown, but the —(C(CH$_3$)(CH$_3$)) may be replaced by another linking group of $X^2$ (—O—, —S—, —Se—, —Te—, —S(=O)—, —S(=O)$_2$—, —NR$^{a1}$—, —BR$^{a2}$—, —SiR$^b$R$^c$—, —SiR$^{bb}$R$^{cc}$—, —GeR$^d$R$^e$—, —GeR$^{dd}$R$^{ee}$—, —(CR$^f$R$^g$)$_{n1}$—, —(CR$^{ff}$R$^{gg}$)—, —(C(R$^m$)=C(R$^n$))—, —(C(R$^{mm}$)=C(R$^{nn}$))—, or —(C(R$^p$)=N)—).

Specific examples of the compound represented by Chemical Formula 2A-1 or Chemical Formula 2B-1 may include compounds of Group 2, but are not limited thereto.

[Group 2]
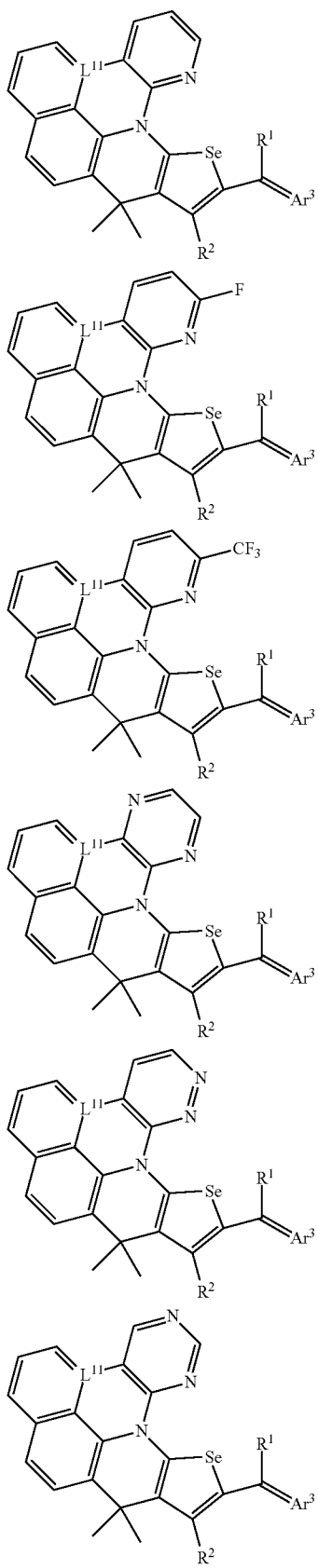
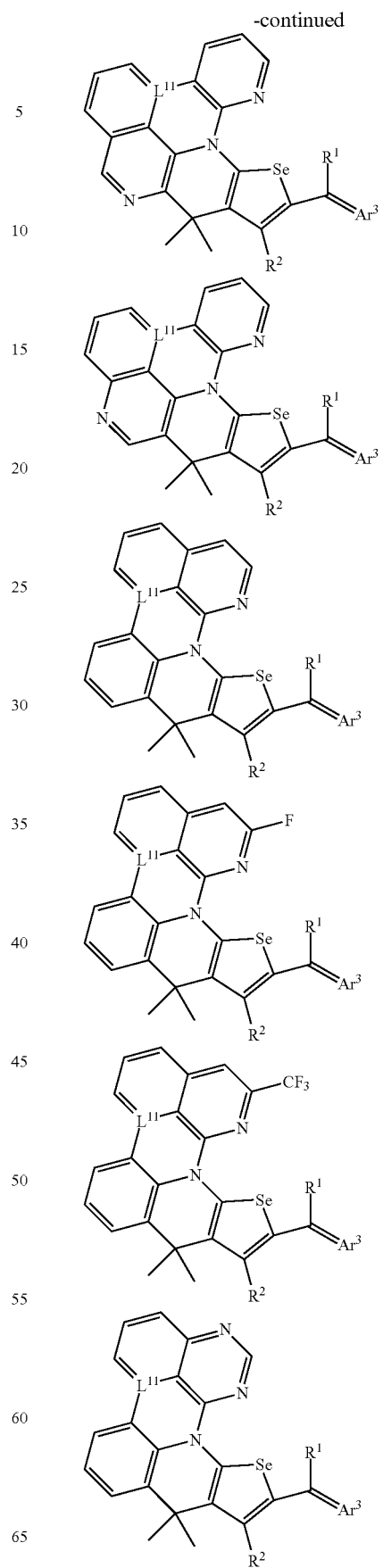

-continued

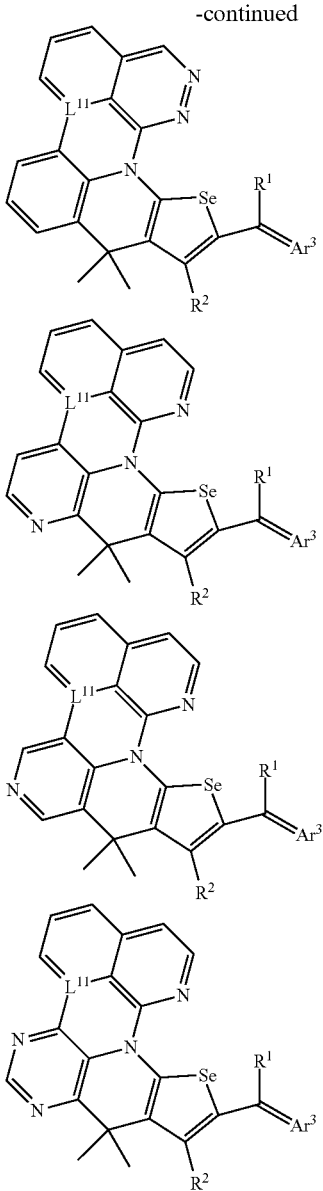

In Group 2, Ar³, R¹, R², and L¹ are the same as Ar³, R¹, R², and L¹ respectively, in Chemical Formula 2A-1 or 2B-1, at least one hydrogen of each ring (benzene ring, cyclohexadiene ring, or heterocycle containing N) may be replaced by at least one substituent selected from deuterium, a halogen, a substituted or unsubstituted C1 to C20 alkyl group, a substituted or unsubstituted C1 to C20 alkoxy group, a substituted or unsubstituted C6 to C20 aryl group, and a substituted or unsubstituted C6 to C20 aryloxy group.

Structures in which CH present in the benzene ring or pyridine ring in Group 2 is replaced by one N are illustrated, but the CH of each ring (benzene ring, pyridine ring, or cyclohexadiene ring) of Group 2 may be replaced by N, wherein one ring may include one or more N, and a plurality of rings may contain N.

In Group 2, compounds in which X¹ is —Se— in Chemical Formula 2A-1 or 2B-1 are shown, but the —Se— may be replaced by another linking group of X¹ (—S—, —Te—, —S(=O)—, —S(=O)₂—, —NR$^{a1}$—, —BR$^{a2}$—, —SiR$^b$R$^c$—, —SiR$^{bb}$R$^{cc}$—, —GeR$^d$R$^e$—, —GeR$^{dd}$R$^{ee}$—, —CR$^f$R$^g$—, or —CR$^{ff}$R$^{gg}$—).

In Group 2, compounds in which X² is —(C(CH₃)(CH₃))— in Chemical Formula 2A-1 or 2B-1 are shown, but the —(C(CH₃)(CH₃)) may be replaced by another linking group of X² (—O—, —S—, —Se—, —Te—, —S(=O)—, —S(=O)₂—, —NR$^{a1}$—, —BR$^{a2}$—, —SiR$^b$R$^c$—, —SiR$^{bb}$R$^{cc}$—, —GeR$^d$R$^e$—, —GeR$^{dd}$R$^{ee}$—, —(CR$^f$R$^g$)$_{n1}$—, —(CR$^{ff}$R$^{gg}$)—, —(C(R$^m$)=C(R$^n$))—, —(C(R$^{mm}$)=C(R$^{nnn}$))—, or —(C(R$^p$)=N)—).

Specific examples of the compound represented by Chemical Formula 1 may be compounds of Group 3.

[Group 3]

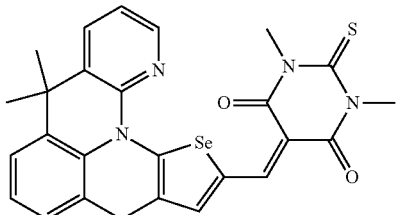

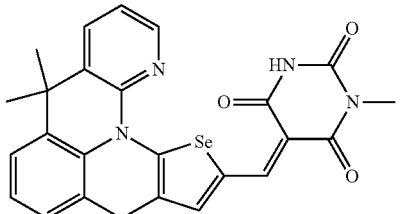

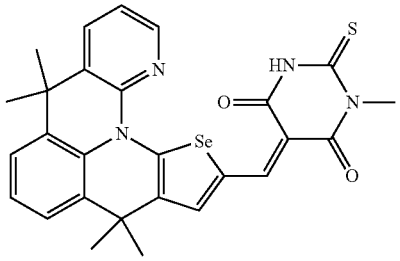

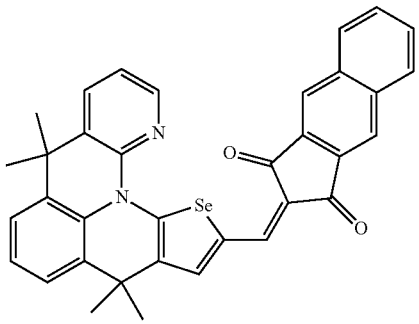

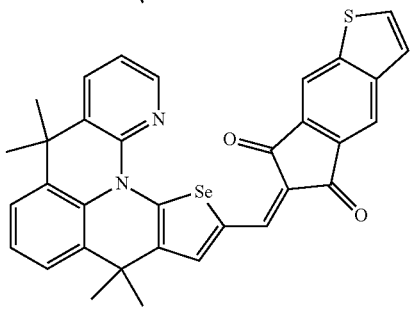

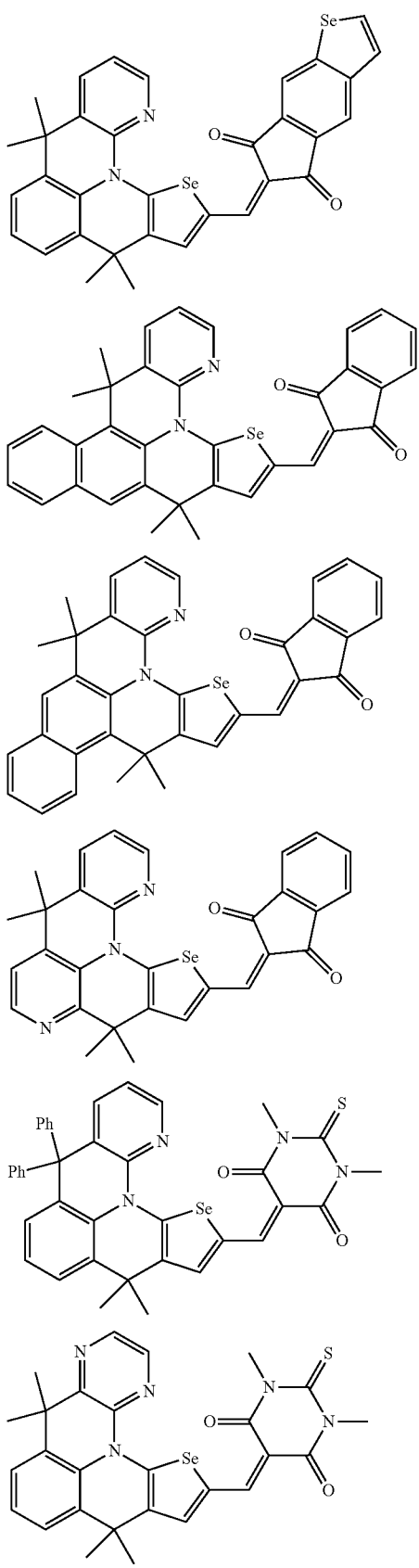
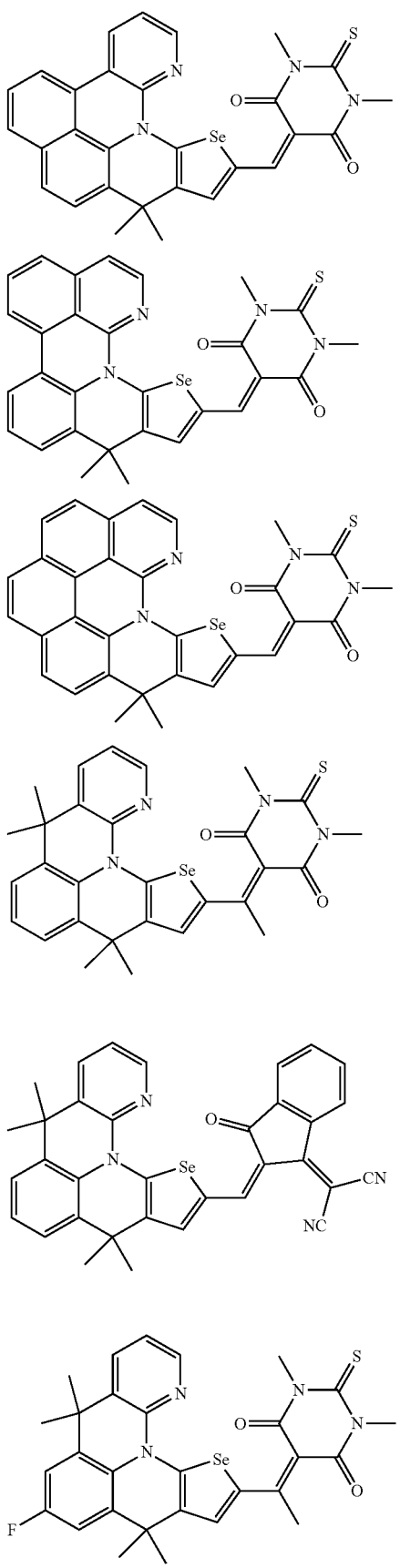

-continued
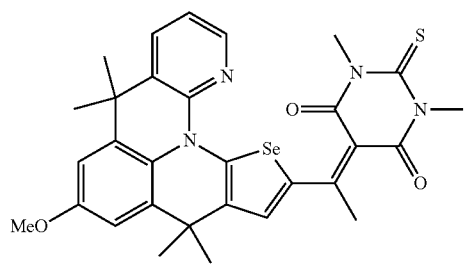
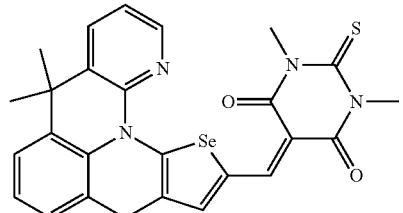
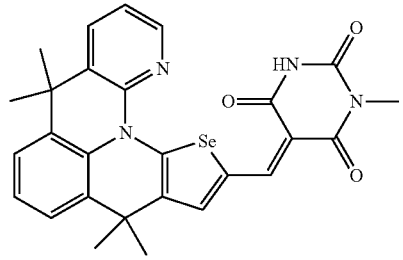
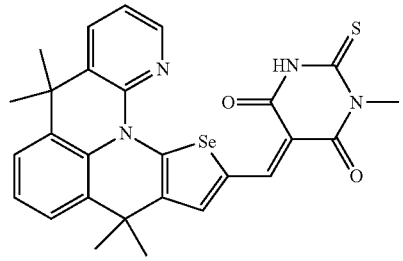
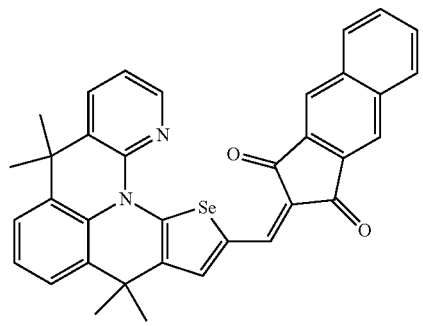
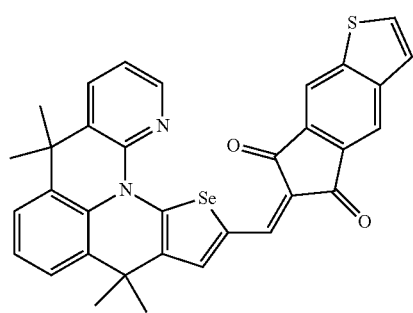
-continued
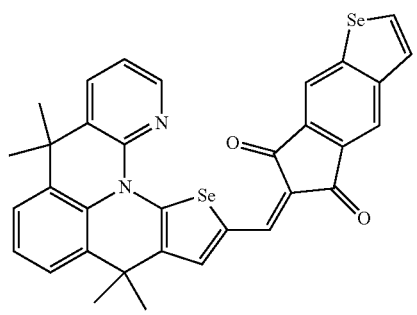
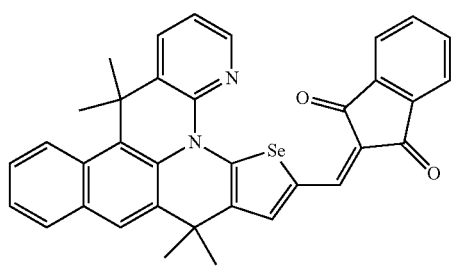
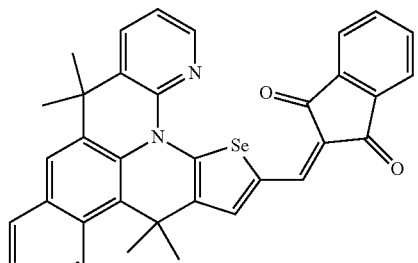
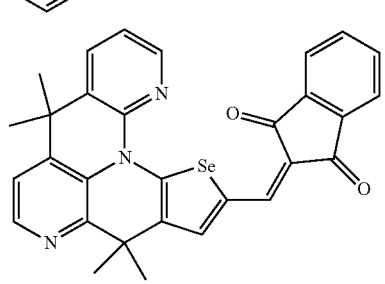
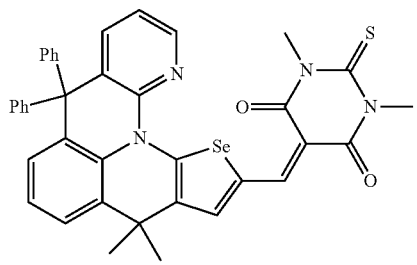
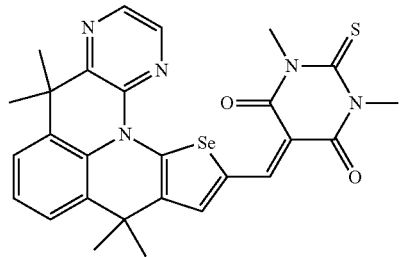

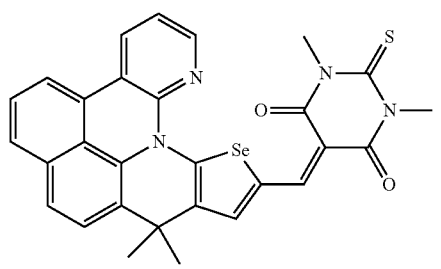
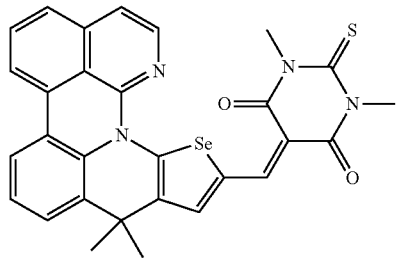
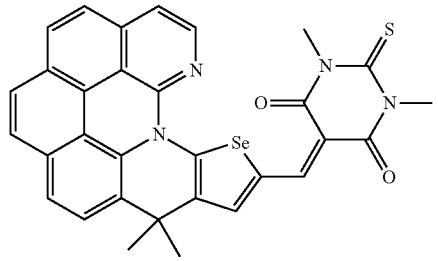
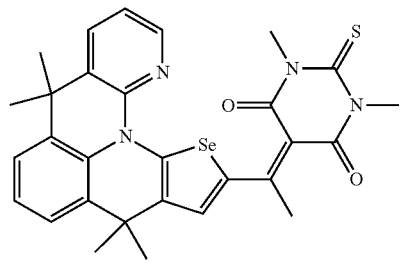
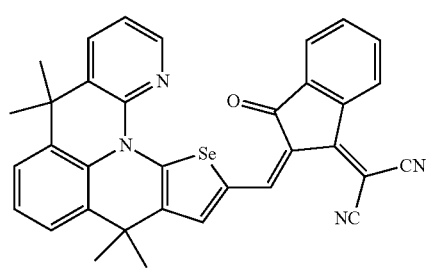
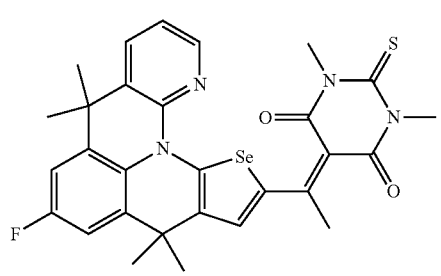
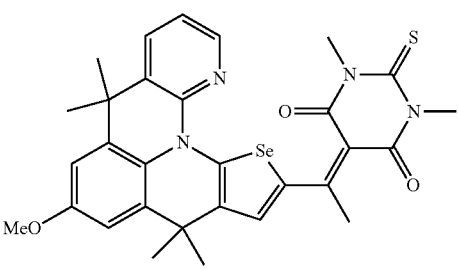
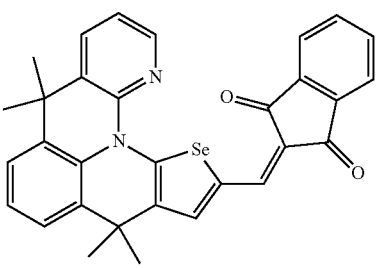
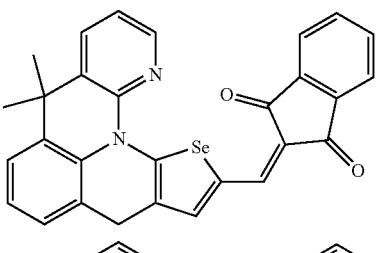
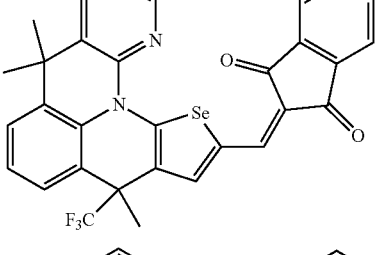
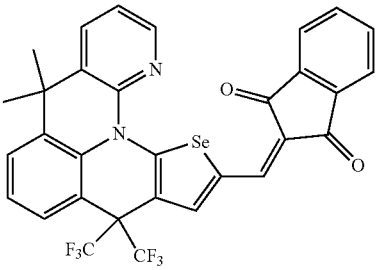
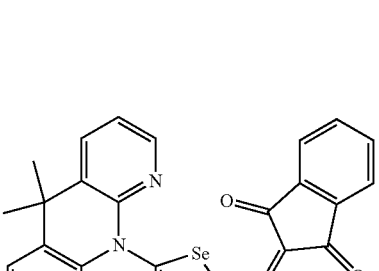

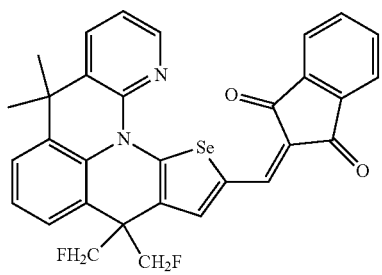
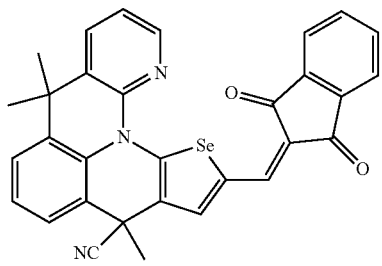
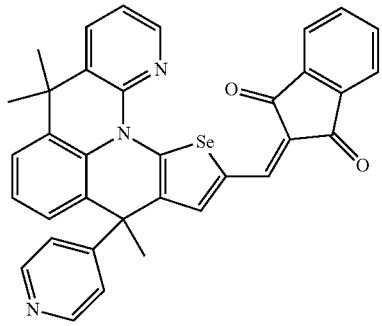
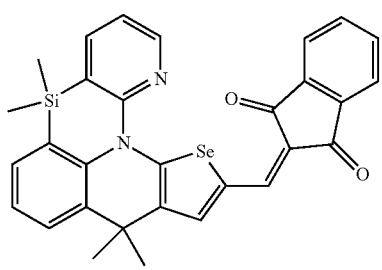
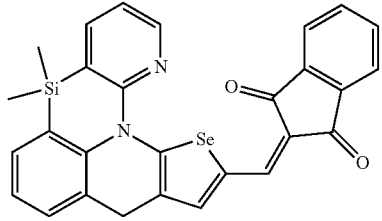
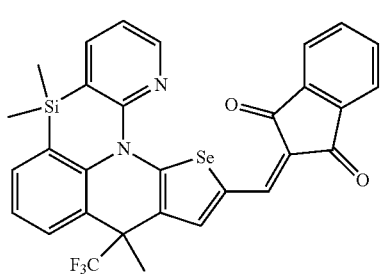
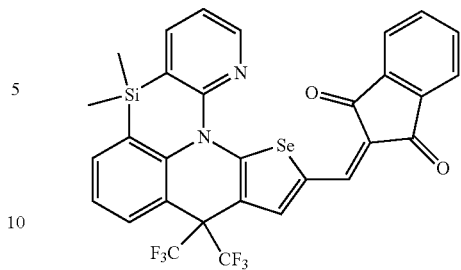
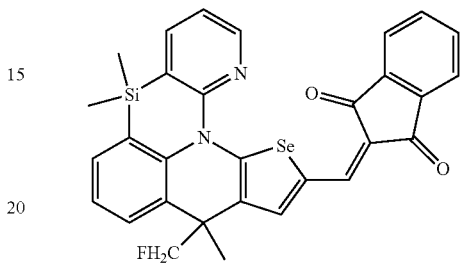
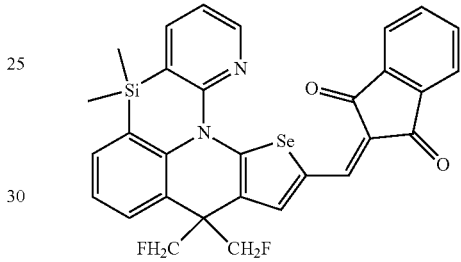
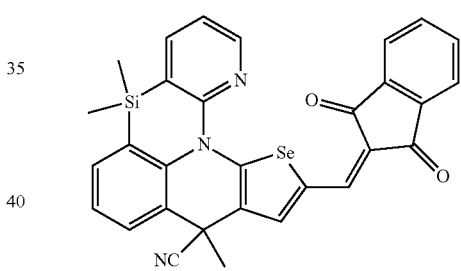
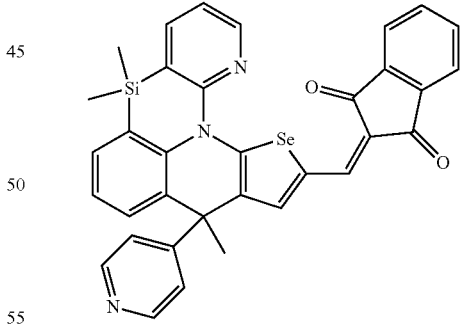
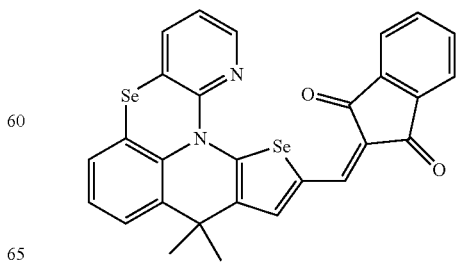

-continued

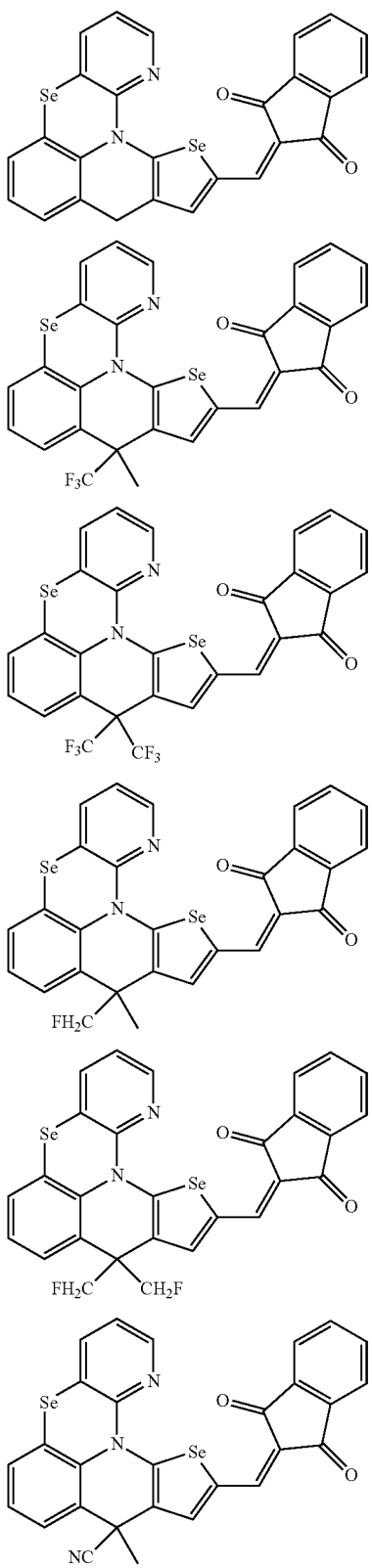

-continued

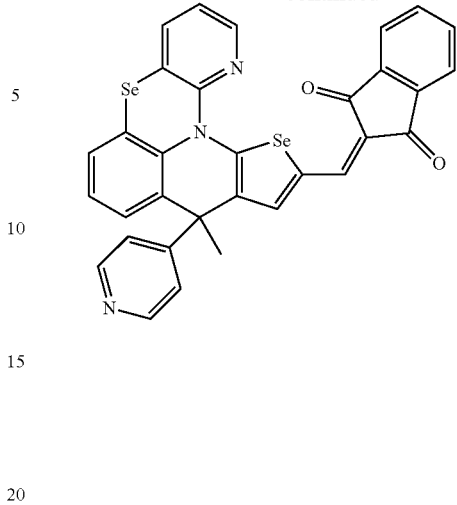

In the three-dimensional structure of the molecule of the compound represented by Chemical Formula 1, an aspect ratio (Z/X) obtained by dividing a length of the shortest axis (Z) by a length of the longest axis (X) may be less than or equal to about 0.42, for example less than or equal to about 0.41, or less than or equal to about 0.40, and the aspect ratio (Z/X) may be greater than 0, for example equal to or greater than about 0.001, equal to or greater than about 0.01, or equal to or greater than 0.1. In the above range, planarity of the compound may be maintained excellently, so that charge mobility may be improved.

The n-type semiconductor compound may be sub-phthalocyanine or a sub-phthalocyanine derivative, fullerene or a fullerene derivative, thiophene or a thiophene derivative, or any combination thereof.

The fullerene may include C60, C70, C76, C78, C80, C82, C84, C90, C96, C240, C540, a mixture thereof, a fullerene nanotube, and the like. The fullerene derivative may refer to compounds of these fullerenes having a substituent thereof. The fullerene derivative may include a substituent such as alkyl group (e.g., C1 to C30 alkyl group), aryl group (e.g., C6 to C30 aryl group), a heterocyclic group (e.g., C3 to C30 heterocycloalkyl group), and the like. Examples of the aryl groups and heterocyclic groups may be a benzene ring, a naphthalene ring, an anthracene ring, a phenanthrene ring, a fluorene ring, a triphenylene ring, a naphthacene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a benzimidazole ring, an imidazopyridine ring, a quinolizidine ring, a quinoline ring, a phthalazine ring, a naphthyridine ring, a quinoxaline ring, a quinoxazoline ring, a quinazoline ring, an isoquinoline ring, a carbazole ring, a phenanthridine ring, an acridine ring, a phenanthroline ring, a thianthrene ring, a chromene ring, an xanthene ring, a phenoxazine ring, a phenoxathin ring, a phenothiazine ring, or a phenazine ring.

The sub-phthalocyanine or the sub-phthalocyanine derivative may be represented by Chemical Formula 7.

[Chemical Formula 7]

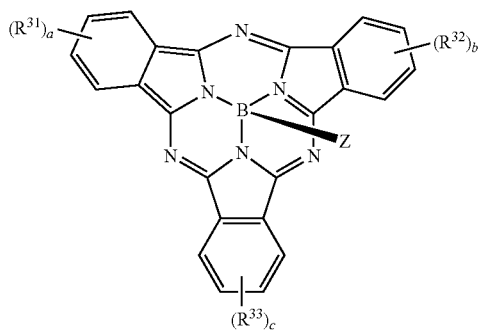

In Chemical Formula 7, $R^{31}$ to $R^{33}$ may each independently be hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, a halogen-containing group, or any combination thereof, a, b, and c are integers ranging from 1 to 3, and Z is a monovalent substituent.

For example, Z may be a halogen or a halogen-containing group, for example F, Cl, an F-containing group, or a Cl-containing group.

The halogen refers to F, Cl, Br, or I and the halogen-containing group refers to alkyl group (e.g., C1 to C30 alkyl group) where at least one hydrogen of the alkyl group is replaced by F, Cl, Br, or I.

The thiophene derivative may be for example represented by Chemical Formula 8 or 9, but is not limited thereto.

[Chemical Formula 8]

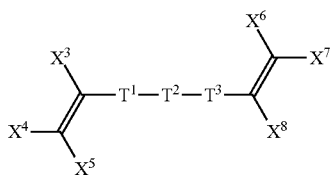

EWG¹-T¹-T²-T³-EWG²  [Chemical Formula 9]

In Chemical Formulas 8 and 9, $T^1$, $T^2$, and $T^3$ may be aromatic rings including substituted or unsubstituted thiophene moieties, $T^1$, $T^2$, and $T^3$ may each independently be present or may be fused to each other, $X^3$ to $X^8$ may each independently be hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heterocyclic group, a cyano group, a cyano-containing group, or any combination thereof, and $EWG^1$ and $EWG^2$ may each independently be electron withdrawing groups.

For example, in Chemical Formula 8, at least one of $X^3$ to $X^8$ may be an electron withdrawing group, for example a cyano-containing group.

The composition for a photoelectric device may further include a second p-type semiconductor compound configured to selectively absorb green light. The second p-type semiconductor compound may be a compound represented by Chemical Formula 10.

[Chemical Formula 10]

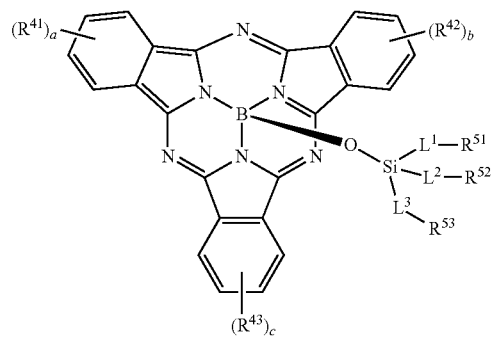

In Chemical Formula 10, $R^{41}$ to $R^{43}$ may each independently be hydrogen, a substituted or unsubstituted C1 to C30 aliphatic hydrocarbon group, a substituted or unsubstituted C6 to C30 aromatic hydrocarbon group, a substituted or unsubstituted C1 to C30 aliphatic heterocyclic group, a substituted or unsubstituted C2 to C30 aromatic heterocyclic group, a substituted or unsubstituted C1 to C30 alkoxy group, a substituted or unsubstituted C6 to C30 aryloxy group, a thiol group, a substituted or unsubstituted C1 to C30 alkylthio group, a substituted or unsubstituted C6 to C30 arylthio group, a cyano group, a cyano-containing group, a halogen, a halogen-containing group, a substituted or unsubstituted sulfonyl group (e.g., a substituted or unsubstituted C0 to C30 aminosulfonyl group, a substituted or unsubstituted C1 to C30 alkylsulfonyl group or a substituted or unsubstituted C6 to C30 arylsulfonyl group), or any combination thereof, or two adjacent groups of $R^{41}$ to $R^{43}$ may be linked to each other to provide a fused ring, $L^1$ to $L^3$ may independently be a single bond, a substituted or unsubstituted C1 to C30 alkylene group, a substituted or unsubstituted C6 to C30 arylene group, a divalent a substituted or unsubstituted C3 to C30 heterocyclic group, or any combination thereof, $R^{51}$ to $R^{53}$ may independently be a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heterocyclic group, a substituted or unsubstituted amine group (e.g., a substituted or unsubstituted C1 to C30 alkylamine group, or a substituted or unsubstituted C6 to C30 arylamine group), a substituted or unsubstituted silyl group, or any combination thereof, and a to c may independently be an integer ranging from 0 to 4.

The second p-type semiconductor compound configured to selectively absorb green light may be included in the composition in an amount of about 500 to about 1500 parts by weight based on 100 parts by weight of the compound represented by Chemical Formula 1 in the composition.

The composition for a photoelectric device may be configured to selectively absorb light in a green wavelength region and may have a maximum absorption wavelength ($\lambda_{max}$) in a wavelength region of greater than or equal to about 500 nm, for example greater than or equal to about 510 nm, greater than or equal to about 520 nm, greater than or equal to about 525 nm, or greater than or equal to about 530 nm and less than or equal to about 600 nm, less than or equal to about 590 nm, for example less than or equal to about 580 nm, less than or equal to about 570 nm, less than or equal to about 560 nm, less than or equal to about 555 nm, or less than or equal to about 550 nm, in a thin film state.

The composition for a photoelectric device may exhibit a light absorption curve having a full width at half maximum (FWHM) of about 50 nm to about 200 nm, for example about 50 nm to about 150 nm, about 50 nm to about 120 nm, about 50 nm to about 100 nm, in a thin film state. Herein, the FWHM is a width of a wavelength corresponding to half of a height of a maximum absorption point. When the FWHM is small, wavelength selectivity is increased by selectively absorbing light in a narrow wavelength region. As used herein, when specific definition is not otherwise provided, it may be defined by absorbance measured by UV-Vis spectroscopy. When the FWHM is within the range, selectivity in a green wavelength region may be increased. The thin film may be a thin film deposited under a vacuum condition.

The composition for a photoelectric device may be formed into a single layer in which the compound of Chemical Formula 1 and the n-type semiconductor compound are mixed, or a structure in which a p-type layer of the compound of Chemical Formula 1 and an n-type layer including the n-type semiconductor compound are stacked.

The composition for a photoelectric device may include the compound of Chemical Formula 1 and the n-type semiconductor compound in a volume ratio of about 1:100 to about 100:1. Within the above range, they may be included in a volume ratio of about 1:50 to about 50:1, and for example about 1:10 to about 10:1, about 1:5 to about 5:1, about 1:3 to about 3:1, about 1:2 to about 2:1, about 1:1.5 to about 1.5:1, about 1:1.2 to about 1.2:1, or about 1:1. Within the above ranges of the volume ratios, an exciton may be effectively produced, and a pn junction may be effectively formed.

In addition, the composition for a photoelectric device may exhibit improved residual charge characteristics while having high wavelength selectivity (narrow FWHM) and absorption coefficient, thereby reducing an after-image of the device.

The composition for a photoelectric device may be formed into a thin film by (e.g., based on) co-depositing or sequentially depositing a p-type semiconductor compound and an n-type semiconductor compound. The deposition method may provide a uniform thin film and have small inclusion possibility of impurities into the thin film. However, when the compound such as the p-type semiconductor compound has a lower melting point than a temperature for the deposition, a product decomposed from the compound may be deposited and thus performance of a device may be deteriorated. Accordingly, the p-type semiconductor compound represented by Chemical Formula 1 desirably has a higher melting point than the deposition temperature. The p-type semiconductor compound represented by Chemical Formula 1 has, for example, at least about 10° C., for example at least about 20° C., or at least about 30° C. higher melting point than the deposition temperature and thus may be desirably used for the deposition.

In more detail, the donor-acceptor type material represented by Chemical Formula 1 may be thermally decomposed at the melting point ($T_m$) of the material because the melting point ($T_m$) is similar to the decomposition temperature ($T_d$). Accordingly, if the temperature (sublimation temperature, deposition temperature, $T_s$) at which a film is formed by vacuum deposition is higher than $T_m$, decomposition occurs more preferentially than sublimation (deposition), and thus a normal device cannot be manufactured, and it is impossible to produce a stable image sensor with these materials. Thus, for donor-acceptor type material represented by Chemical Formula 1, $T_m$ should be higher than $T_s$, and desirably $T_m-T_s \geq 10°$ C.

In addition, a micro lens array (MLA) may be formed to concentrate light after manufacturing an organic photoelectric device during manufacture of an image sensor. This micro lens array may require a relatively high temperature (greater than or equal to about 160° C., for example greater than or equal to about 170° C., greater than or equal to about 180° C., or greater than or equal to about 190° C.). The performance of the photoelectric devices (e.g., organic photoelectric devices) may be required not to be deteriorated in these heat-treatment processes. The performance deterioration of the organic photoelectric device during the heat treatment of MLA may be caused not by chemical decomposition of an organic material but its morphology change. The morphology change is in general caused, when a material starts a thermal vibration due to a heat treatment, but a material having a firm molecule structure may not have the thermal vibration and be limited and/or prevented from the deterioration by the heat treatment. The compound represented by Chemical Formula 1 (e.g., in the composition according to any of the example embodiments) may be suppressed from the thermal vibration of molecules due to a conjugation structure in the donor moiety and thus may be stably maintained during the MLA heat treatment and secure process stability.

In some example embodiments, the composition may omit the n-type semiconductor compound and may include the p-type semiconductor compound represented by Chemical Formula 1 alone or in combination with other materials that are not the n-type semiconductor compound as described herein. Such a composition may be included in various layers, structures, or the like of any of the photoelectric devices, image sensors, and/or electronic devices according to any of the example embodiments.

Hereinafter, a photoelectric device including the composition for a photoelectric device according to some example embodiments is described with reference to drawings.

FIG. 1 is a cross-sectional view showing a photoelectric device according to some example embodiments.

Referring to FIG. 1, a photoelectric device 100 according to some example embodiments includes a first electrode 10 and a second electrode 20 (e.g., a first electrode 10 and a second electrode 20 facing each other), and an active layer 30 between the first electrode 10 and the second electrode 20.

One of the first electrode 10 or the second electrode 20 is an anode and the other is a cathode. At least one of the first electrode 10 or the second electrode 20 may be a light-transmitting electrode, and the light-transmitting electrode may be made of, for example, a transparent conductor such as indium tin oxide (ITO) or indium zinc oxide (IZO), or a metal thin layer of a thin single layer or multilayer. When one of the first electrode 10 or the second electrode 20 is a non-light-transmitting electrode, it may be made of, for example, an opaque conductor such as aluminum (Al).

The active layer 30 includes a p-type semiconductor and an n-type semiconductor to form a pn junction, and absorbs external light to generate excitons and then separates the generated excitons into holes and electrons.

The active layer 30 includes the composition for a photoelectric device (e.g., a composition including the p-type semiconductor compound represented by Chemical Formula 1 and an n-type semiconductor compound) according to any of the example embodiments.

The active layer 30 may have a maximum absorption wavelength ($\lambda_{max}$) in a wavelength region of greater than or equal to about 500 nm, for example greater than or equal to about 510 nm, greater than or equal to about 520 nm, greater than or equal to about 525 nm, greater than or equal to about 530 nm, or greater than or equal to about 535 nm and less than or equal to about 590 nm, for example less than or equal to about 580 nm, less than or equal to about 570 nm, or less than or equal to about 560 nm.

The active layer 30 may exhibit a light absorption curve having a relatively narrow full width at half maximum (FWHM) of about 50 nm to about 200 nm, for example about 50 nm to about 150 nm, about 50 nm to about 120 nm, or about 50 nm to about 100 nm. Accordingly, the active layer 30 has high selectivity for light in a green wavelength region.

The active layer 30 may be a single layer or a multilayer. The active layer 30 may be, for example, an intrinsic layer (I layer), a p-type layer/I layer, an I layer/n-type layer, a p-type layer/I layer/n-type layer, a p-type layer/n-type layer, and the like.

The intrinsic layer (I layer) may include the compound of Chemical Formula 1 and the n-type semiconductor compound in a volume ratio of about 1:100 to about 100:1. The compound of Chemical Formula 1 and the n-type semiconductor compound may be included in the composition according to any of the example embodiments, the active layer 30 including the composition, any layers thereof (e.g., the intrinsic layer), or any combination thereof, in a volume ratio of about 1:50 to about 50:1, for example, about 1:10 to about 10:1, about 1:5 to about 5:1, about 1:3 to about 3:1, about 1:2 to about 2:1, about 1:1.5 to about 1.5:1, about 1:1.2 to about 1.2:1, or about 1:1. When the compound of Chemical Formula 1 and the n-type semiconductor compound have a volume ratio within the ranges, an exciton may be effectively produced, and a pn junction may be effectively formed.

The p-type layer may include the semiconductor compound of Chemical Formula 1, and the n-type layer may include the n-type semiconductor compound.

The active layer 30 may have a thickness of about 1 nm to about 500 nm and specifically, about 5 nm to about 300 nm, about 20 nm to about 250 nm, about 30 nm to about 200 nm, about 50 nm to about 150 nm, about 70 nm to about 130 nm, about 80 nm to about 120 nm. When the active layer 30 has a thickness within the range, the active layer 30 may effectively absorb light, effectively separate holes from electrons, and deliver them, thereby effectively improving photoelectric conversion efficiency. A desirable thickness of the active layer 30 may be, for example, determined by an absorption coefficient of the active layer 30, and may be, for example, a thickness being capable of absorbing light of at least about 70% or more, for example about 80% or more, and for another example about 90% or more.

In the photoelectric device 100, when light enters from the first electrode 10 and/or second electrode 20, and when the active layer 30 absorbs light in a desired and/or alternatively predetermined wavelength region, excitons may be produced from the inside. The excitons are separated into holes and electrons in the active layer 30, and the separated holes are transported to an anode that is one of the first electrode 10 or the second electrode 20 and the separated electrons are transported to the cathode that is the other of the first electrode 10 and the second electrode 20 so as to flow a current in (e.g., induce a current through at least a portion of) the photoelectric device 100.

Hereinafter, a photoelectric device according to some example embodiments is described with reference to FIG. 2.

Figure 2:
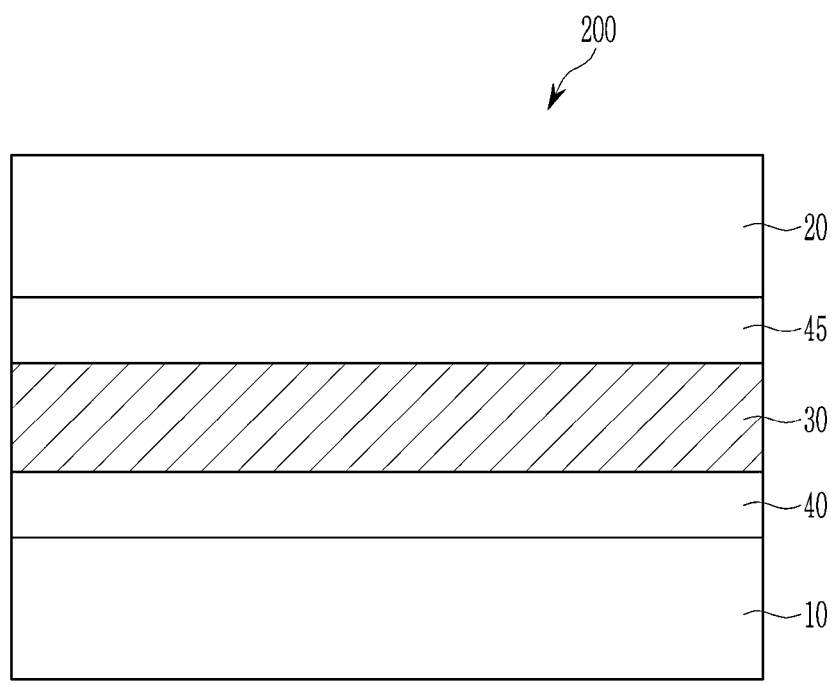
FIG. 2 is a cross-sectional view showing a photoelectric device according to some example embodiments.

FIG. 2 is a cross-sectional view showing a photoelectric device according to some example embodiments.

Referring to FIG. 2, a photoelectric device 200 according to some example embodiments, including the example embodiments shown in FIG. 2, includes a first electrode 10 and a second electrode 20 facing each other, and an active layer 30 between the first electrode 10 and the second electrode 20, like some example embodiments, including the example embodiments shown in FIG. 1.

However, the photoelectric device 200 according to some example embodiments, including the example embodiments shown in FIG. 2 further includes charge auxiliary layers 40 and 45 between the first electrode 10 and the active layer 30, and the second electrode 20 and the active layer 30, unlike some example embodiments, including the example embodiments shown in FIG. 1. The charge auxiliary layers 40 and 45 may facilitate the transfer of holes and electrons separated from the active layer 30, so as to increase efficiency.

The charge auxiliary layers 40 and 45 may be at least one selected from a hole injection layer (HIL) for facilitating hole injection, a hole transport layer (HTL) for facilitating hole transport, an electron blocking layer (EBL) for preventing electron transport, an electron injection layer (EIL) for facilitating electron injection, an electron transport layer (ETL) for facilitating electron transport, and a hole blocking layer (HBL) for preventing hole transport.

The charge auxiliary layers 40 and 45 may include, for example, an organic material, an inorganic material, or an organic/inorganic material. The organic material may be an organic compound having hole or electron characteristics, and the inorganic material may be, for example, a metal oxide such as molybdenum oxide, tungsten oxide, nickel oxide, and the like.

The hole injection layer (HIL) and/or hole transport layer (HTL) may include one selected from, for example, poly(3,4-ethylenedioxythiophene):poly(styrenesulfonate) (PEDOT:PSS), polyarylamine, poly(N-vinylcarbazole), polyaniline, polypyrrole, N,N,N',N'-tetrakis(4-methoxyphenyl)-benzidine (TPD), 4,4'-bis[N-(1-naphthyl)-N-phenyl-amino]biphenyl (α-NPD), m-MTDATA (4,4',4"-tris[phenyl(m-tolyl)amino]triphenylamine), 4,4',4"-tris(N-carbazolyl)-triphenylamine (TCTA), and any combination thereof, but is not limited thereto.

The electron blocking layer (EBL) may include one selected from, for example, poly(3,4-ethylenedioxythiophene):poly(styrenesulfonate) (PEDOT:PSS), polyarylamine, poly(N-vinylcarbazole), polyaniline, polypyrrole, N,N,N',N'-tetrakis(4-methoxyphenyl)-benzidine (TPD), 4,4'-bis[N-(1-naphthyl)-N-phenyl-amino]biphenyl (α-NPD), m-MTDATA, 4,4',4"-tris(N-carbazolyl)-triphenylamine (TCTA), and any combination thereof, but is not limited thereto.

The electron injection layer (EIL) and/or electron transport layer (ETL) may include one selected from, for example, 1,4,5,8-naphthalene-tetracarboxylic dianhydride (NTCDA), bathocuproine (BCP), LiF, Alq$_3$, Gaq$_3$, Inq$_3$, Znq$_2$, Zn(BTZ)$_2$, BeBq$_2$, and any combination thereof, but is not limited thereto.

The hole blocking layer (HBL) may include one selected from, for example, 1,4,5,8-naphthalene-tetracarboxylic dianhydride (NTCDA), bathocuproine (BCP), LiF, Alq$_3$, Gaq$_3$, Inq$_3$, Znq$_2$, Zn(BTZ)$_2$, BeBq$_2$, and any combination thereof, but is not limited thereto.

Either one of the charge auxiliary layers 40 or 45 may be omitted.

The photoelectric device may be applied to various fields, for example a solar cell, an image sensor, a photo-detector, a photo-sensor, and an organic light emitting diode (OLED), but is not limited thereto.

Hereinafter, an example of an image sensor including the organic photoelectric device is described referring to drawings. As an example of an image sensor, an organic CMOS image sensor is described.

Figure 3:
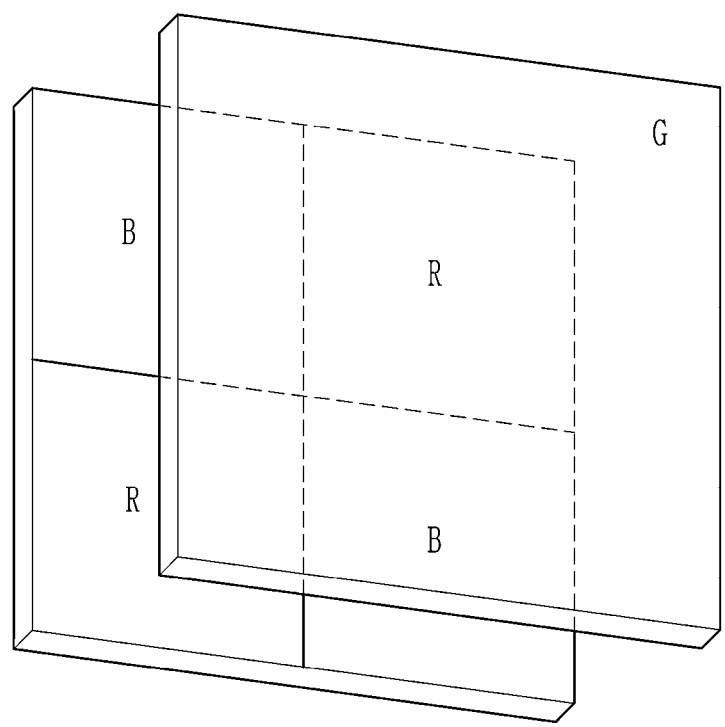
FIG. 3 is a schematic plan view showing an organic CMOS image sensor according to some example embodiments.
Figure 4:
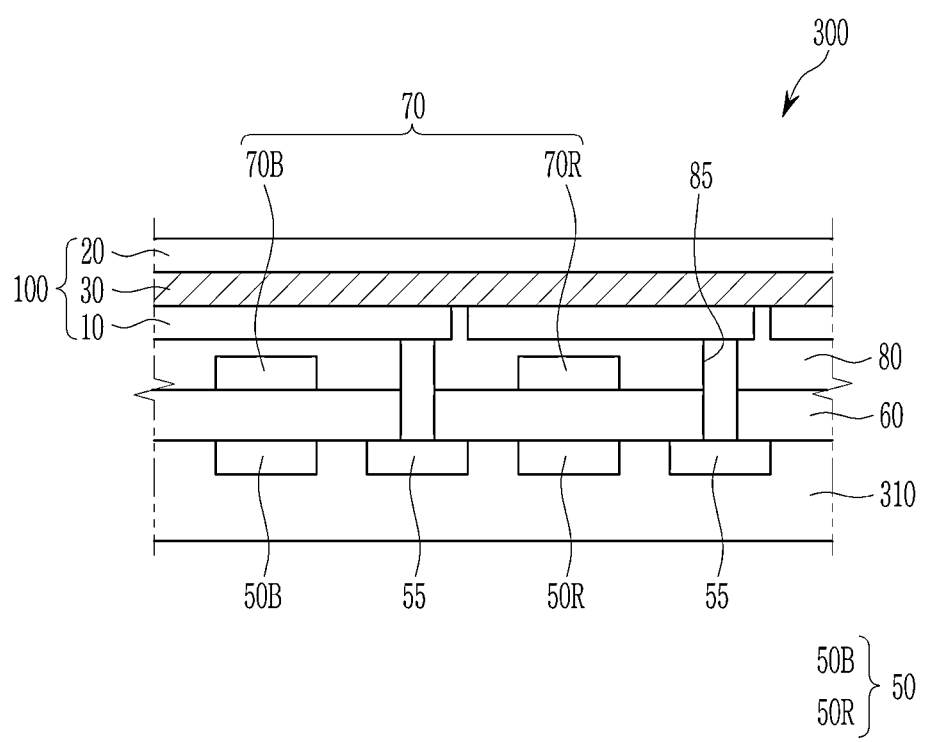
FIG. 4 is a cross-sectional view of the organic CMOS image sensor of FIG. 3.

FIG. 3 is a schematic top plan view showing an organic CMOS image sensor according to some example embodiments, and FIG. 4 is a cross-sectional view showing the organic CMOS image sensor of FIG. 3.

Referring to FIGS. 3 and 4, an organic CMOS image sensor 300 according to some example embodiments, including the example embodiments shown in FIGS. 3 and 4 includes a semiconductor substrate 310 integrated with photo-sensing device 50, which may include photo-sensing devices 50B and 50R, a transmission transistor (not shown), a charge storage 55, a lower insulation layer 60, a color filter layer 70, an upper insulation layer 80 (also referred to herein as an insulation layer), and a photoelectric device 100. The photoelectric device 100 may be the photoelectric device according to any of the example embodiments and is on (e.g., directly or indirectly on) the semiconductor substrate 310.

The semiconductor substrate 310 may be a silicon substrate, and is integrated with a photo-sensing device 50, the transmission transistor (not shown), and the charge storage 55. The photo-sensing device 50 may include a blue photo-sensing device 50B and a red photo-sensing device 50R. The blue and red photo-sensing devices 50B and 50R may be photodiodes.

The photo-sensing devices 50B and 50R, the transmission transistor, and/or the charge storage 55 may be integrated in each pixel, for example may be integrated in the semiconductor substrate 310 such that the photo-sensing device 50B and 50R are located within a volume space defined by outermost surface of the semiconductor substrate 310 and may be at least partially exposed by the semiconductor substrate 310 or may be enclosed within an interior of the semiconductor substrate 310, and as shown in the drawing, the photo-sensing devices 50B and 50R may be respectively included in a blue pixel and a red pixel and the charge storage 55 may be included in a green pixel. The blue photo-sensing device 50B may be configured to sense (e.g., selectively sense, including selectively absorbing and photoelectrically converting) blue light which is light in a blue wavelength region, and the red photo-sensing device 50R may be configured to sense (e.g., selectively sense, including selectively absorbing and photoelectrically converting) red light which is light in a red wavelength region.

The photo-sensing devices 50B and 50R may be configured to sense (e.g., selectively sense) light, the information sensed by the photo-sensing devices 50B and 50R may be transferred by the transmission transistor, the charge storage 55 is electrically connected to the photoelectric device 100, and the information of the charge storage 55 may be transferred by the transmission transistor.

In the drawings, the photo-sensing devices 50B and 50R are, for example, arranged in parallel without limitation, and the blue photo-sensing device 50B and the red photo-sensing device 50R may be stacked in a vertical direction.

A metal wire (not shown) and a pad (not shown) are formed on the semiconductor substrate 310. In order to decrease signal delay, the metal wire and pad may be made of a metal having low resistivity, for example, aluminum (Al), copper (Cu), silver (Ag), and alloys thereof, but are not limited thereto. Further, it is not limited to the structure, and the metal wire and pad may be positioned under the photo-sensing devices 50B and 50R.

The lower insulation layer 60 is formed on the metal wire and the pad. The lower insulation layer 60 may be made of an inorganic insulating material such as a silicon oxide and/or a silicon nitride, or a low dielectric constant (low K) material such as SiC, SiCOH, SiCO, and SiOF. The lower insulation layer 60 has a trench exposing the charge storage 55. The trench may be filled with fillers.

A color filter layer 70 is formed on the lower insulation layer 60 and may be located between the photoelectric device 100 and the semiconductor substrate 310. The color filter layer 70 includes a blue filter 70B formed in the blue pixel and configured to selectively transmit blue light and a red filter 70R formed in the red pixel and configured to selectively transmit red light. In some example embodiments, a cyan filter and a yellow filter may be disposed instead of the blue filter 70B and red filter 70R. In some example embodiments, including the example embodiments shown in FIGS. 3 and 4, a green filter is not included, but a green filter may be further included.

The color filter layer 70 may be omitted. For example, when the blue photo-sensing device 50B and the red photo-sensing device 50R are stacked in a vertical direction, the blue photo-sensing device 50B and the red photo-sensing device 50R may selectively absorb light in each wavelength region depending on their stack depth, and the color filter layer 70 may not be equipped.

The upper insulation layer 80 is formed on the color filter layer 70. The upper insulation layer 80 eliminates a step caused by the color filter layer 70 and smoothens the surface. The upper insulation layer 80 and the lower insulation layer 60 may include a contact hole (not shown) exposing a pad, and a through-hole 85 exposing the charge storage 55 of the green pixel.

The aforementioned photoelectric device 100 is formed on (e.g., directly or indirectly on) the upper insulation layer 80. The photoelectric device 100 includes the first electrode 10, the active layer 30, and the second electrode 20 as described above.

The first electrode 10 and the second electrode 20 may be transparent electrodes, and the active layer 30 is the same as described above. The active layer 30 may selectively absorbs and/or senses light in a green wavelength region and replaces a color filter of a green pixel. Accordingly, the photoelectric device 100 may be on the semiconductor substrate 310 and may be configured to selectively sense light in the green wavelength region.

When light enters from the second electrode 20, the light in a green wavelength region may be mainly absorbed in the active layer 30 and photoelectrically converted, while the light in the rest of the wavelength regions passes through first electrode 10 and may be sensed in the photo-sensing devices 50B and 50R.

As described above, the photoelectric devices configured to selectively absorb light in a green wavelength region are stacked and thereby a size of an image sensor may be decreased and a down-sized image sensor may be realized.

As described above, the compound represented by the Chemical Formula 1 may be used as a p type semiconductor compound, aggregation between compounds in a thin film state is inhibited, and thereby light absorption characteristics depending on a wavelength may be maintained. Thereby, green wavelength selectivity may be maintained, crosstalk caused by unnecessary absorption of other light except a green wavelength region may be decreased and sensitivity may be increased.

In some example embodiments, in FIG. 4, additional color filters may be further disposed on the photoelectric device 100. The additional color filters may include a blue filter 70B and a red filter 70R or a cyan filter and a yellow filter.

Figure 5:
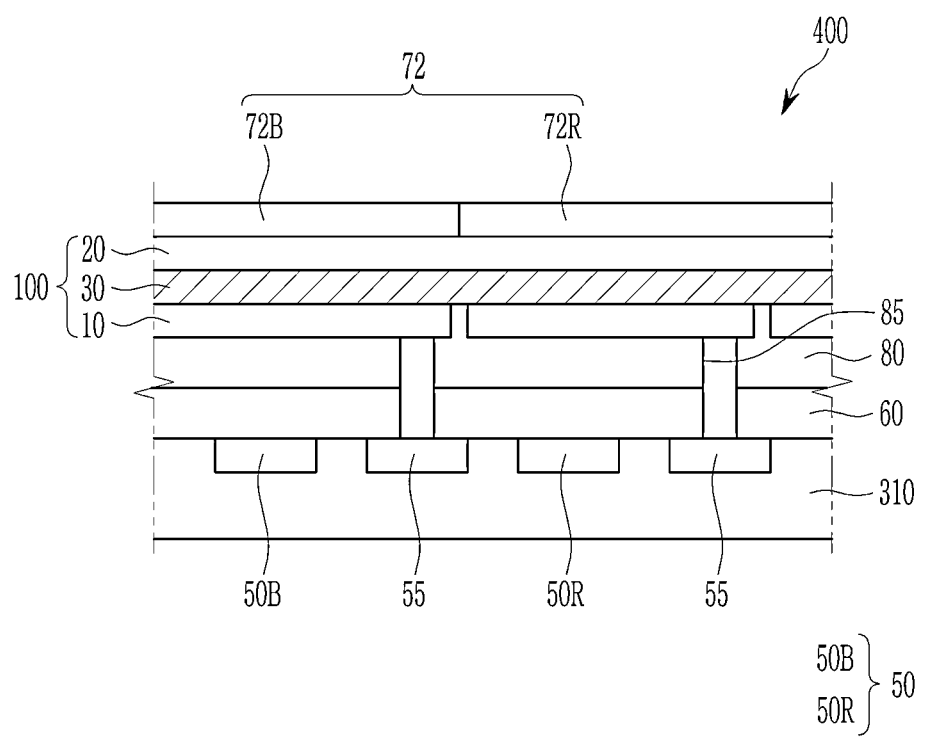
FIG. 5 is a schematic cross-sectional view of an organic CMOS image sensor according to some example embodiments.

The organic CMOS image sensor with the color filters disposed on the photoelectric device is shown in FIG. 5.

FIG. 5 is a schematic cross-sectional view showing an organic CMOS image sensor according to some example embodiments. Referring to FIG. 5, an organic CMOS image sensor 400 has the same structure as FIG. 4 except that a color filter layer 72 including the blue filter 72B and the red filter 72R is disposed on the photoelectric device 100 such that the photoelectric device 100 is between the color filter layer 72 and the semiconductor substrate 310. Instead of the blue filter 72B and the red filter 72R, the cyan filter and the yellow filter may be disposed respectively.

In FIGS. 4 and 5, the photoelectric device 100 of FIG. 1 is included, but it is not limited thereto, and thus the photoelectric device 200 of FIG. 2 may be applied in the same manner.

Figure 6:
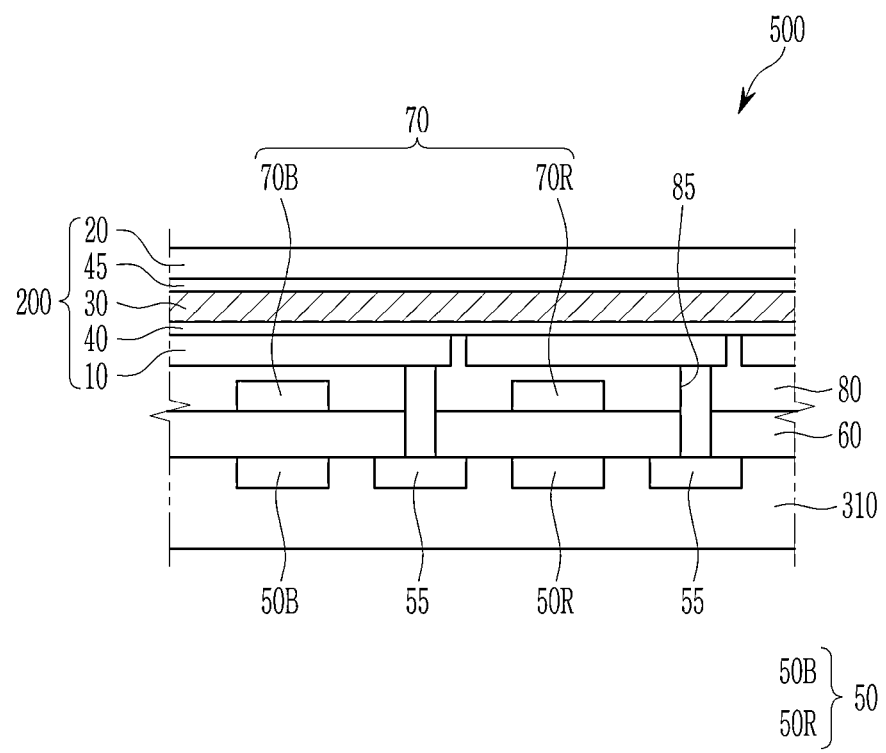
FIG. 6 is a schematic cross-sectional view of an organic CMOS image sensor according to some example embodiments.

FIG. 6 is a cross-sectional view showing an organic CMOS image sensor 500 to which the photoelectric device 200 is applied.

Referring to FIG. 6, the organic CMOS image sensor 500 includes a semiconductor substrate 310 integrated with photo-sensing devices 50B and 50R, a transmission transistor (not shown), a charge storage 55, a lower insulation layer 60, an upper insulation layer 80, and a photoelectric device 200, like some example embodiments, including the example embodiments shown in FIG. 4.

However, the organic CMOS image sensor 500 according to some example embodiments, including the example embodiments shown in FIG. 6, includes the photoelectric device 200, unlike some example embodiments, including the example embodiments shown in FIG. 4, which include the photoelectric device 100.

Figure 7:
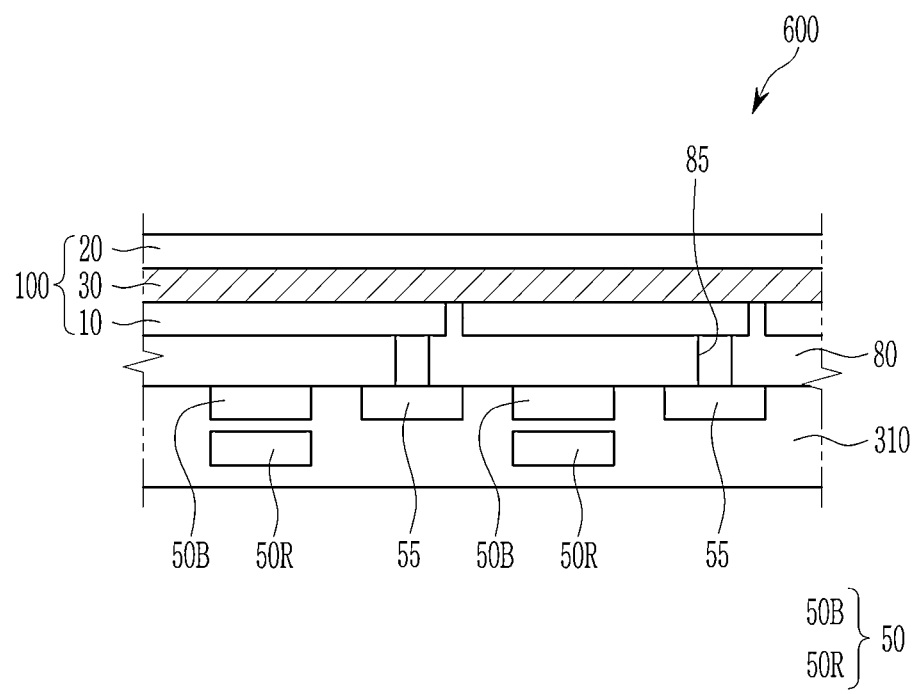
FIG. 7 is a cross-sectional view of an organic CMOS image sensor according to some example embodiments.

FIG. 7 is a schematic view showing an organic CMOS image sensor according to some example embodiments.

Referring to FIG. 7, the organic CMOS image sensor 600 includes a semiconductor substrate 310 integrated with photo-sensing devices 50B and 50R, a transmission transistor (not shown), and a charge storage 55, an insulation layer 80, and a photoelectric device 100, like some example embodiments, including the example embodiments illustrated in FIG. 5.

However, the organic CMOS image sensor 600 according to some example embodiments includes the blue photo-sensing device 50B and the red photo-sensing device 50R that are stacked in a vertical direction (e.g., perpendicular to a direction in which the upper surface of the semiconductor substrate 310 extends as shown in FIG. 7) in the semiconductor substrate 310 and does not include a color filter layer 70, unlike some example embodiments, including the example embodiments shown in FIG. 5. For example, each red photo-sensing device 50R of a plurality of red photo-sensing devices 50R integrated in the semiconductor substrate 310 may be stacked in a vertical direction with a separate blue photo-sensing device 50B of a plurality of blue photo-sensing devices 50B in the semiconductor substrate 310. The blue photo-sensing device 50B and the red photo-sensing device 50R are electrically connected with the charge storage 55, and the information of the charge storage 55 may be transferred by the transmission transistor (not shown). The blue photo-sensing device 50B and the red photo-sensing device 50R may selectively absorb light in each wavelength region depending on a stack depth.

As described above, the photoelectric devices selectively absorbing light in a green wavelength region are stacked and the red photo-sensing device and the blue photo-sensing device are stacked, and thereby a size of an image sensor may be decreased and a down-sized image sensor may be realized. As described above, the photoelectric device 100 has improved green wavelength selectivity, and crosstalk caused by unnecessary absorption of light in a wavelength region except green may be decreased while increasing sensitivity.

In FIG. 7, the photoelectric device 100 of FIG. 1 is included, but it is not limited thereto, and thus the photoelectric device 200 of FIG. 2 may be applied in the same manner.

Figure 8:
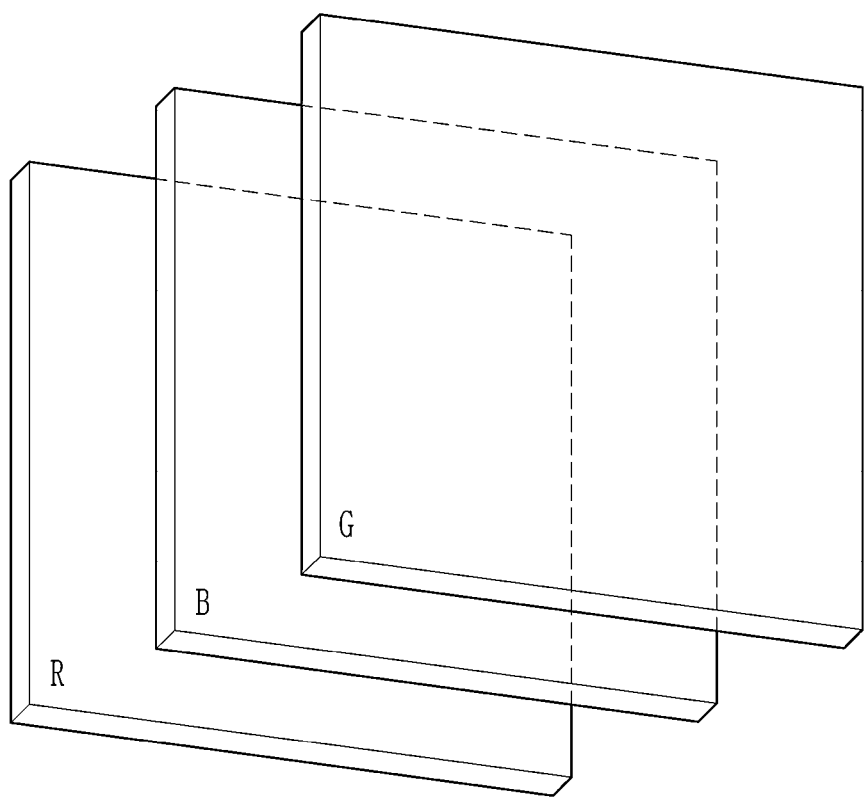
FIG. 8 is a schematic view showing an organic CMOS image sensor according to some example embodiments.
Figure 9:
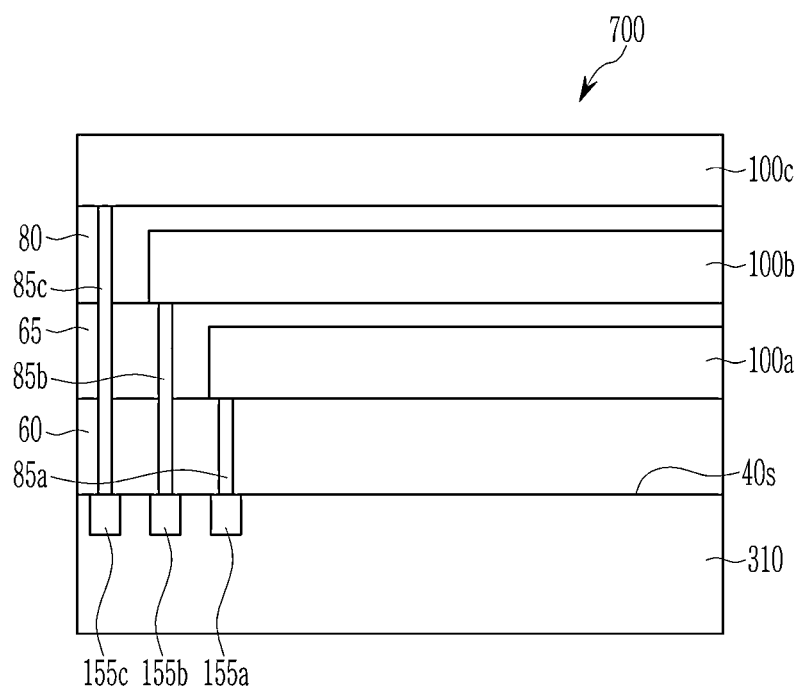
FIG. 9 is a cross-sectional view of the organic CMOS image sensor of FIG. 8.

FIG. 8 is a schematic view showing an organic CMOS image sensor according to some example embodiments and FIG. 9 is a cross-sectional view of the organic CMOS image sensor of FIG. 8.

Referring to FIGS. 8 and 9, the organic CMOS image sensor 700 according to some example embodiments includes a green photoelectric device (G) configured to selectively absorb light in a green wavelength region, a blue photoelectric device (B) configured to selectively absorb light in a blue wavelength region, and a red photoelectric device (R) configured to selectively absorb light in a red wavelength region that are stacked. For example, the organic CMOS image sensor 700 may include a green photoelectric device configured to selectively sense light in a green wavelength region, a blue photoelectric device configured to selectively sense light in a blue wavelength region, and a red photoelectric device configured to selectively sense light in a red wavelength region, where the green photoelectric device, the blue photoelectric device, and the red photoelectric device are stacked as shown in at least FIG. 8. As shown, the photoelectric devices 100a to 100c may be stacked in a vertical direction on the semiconductor substrate 310, such that the photoelectric devices 100a to 100c at least partially overlap each other in a vertical direction that is perpendicular to an upper surface 40s of the semiconductor substrate 310, but example embodiments are not limited thereto.

The organic CMOS image sensor 700 according to some example embodiments includes a semiconductor substrate 310, a lower insulation layer 60, an intermediate insulation layer 65, an upper insulation layer 80, a first device (i.e., photoelectric device, the same below) 100a, a second device 100b, and a third device 100c.

The semiconductor substrate 310 may be a silicon substrate, and a transmission transistor (not shown) and charge storages 155a, 155b, and 155c are integrated therein.

Metal wires (not shown) and pads (not shown) are formed on the semiconductor substrate 310, and the lower insulation layer 60 is formed on the metal wires and the pads.

The first device 100a, the second device 100b, and the third device 100c are sequentially formed on the lower insulation layer 60.

Any one of the first, second, and third devices 100a, 100b, and 100c may be the photoelectric devices 100 and 200 (green photoelectric device according to example embodiments) of FIG. 1 or 2, and the other two of them (a red photoelectric device and a blue photoelectric device) may have the same structure as the photoelectric devices 100 and 200, but an active layer 30 therein selectively absorbs light in a red or blue wavelength region to photoelectrically convert the light. Detailed descriptions of the photoelectric devices 100 and 200 are the same as described above. The first electrode 10 and the second electrode 20 of the photoelectric devices 100 and 200, the red photoelectric device and the blue photoelectric device may be connected to the charge storages 155a, 155b, and 155c.

The active layer 30 of the first device 100a may selectively absorb light in any one wavelength region of red, blue, or green to photoelectrically convert the light. For example, the first device 100a may be a red photoelectric conversion device configured to selectively sense light in a red wavelength region. The first electrode 10 and the second electrode 20 of the first device 100a may be electrically connected to the first charge storage 155a. A "photoelectric conversion device" may be interchangeably referred to herein as a "photoelectric device."

The intermediate insulation layer 65 may be formed on the first device 100a and the second device 100b may be formed on the intermediate insulation layer 65.

The active layer 30 of the second device 100b may selectively absorb light in any one wavelength region of red, blue, or green to photoelectrically convert the light. For example, the second device 100b may be a green photoelectric conversion device configured to selectively sense light in a green wavelength region. In another example, the second device 100b may be a blue photoelectric conversion device configured to selectively sense light in a blue wavelength region. The first electrode 10 and the second electrode 20 of the second device 100b may be electrically connected to the second charge storage 155b.

The upper insulation layer 80 is formed on the second device 100b. The lower insulation layer 60, the intermediate insulation layer 65, and the upper insulation layer 80 have a plurality of through-holes 85a, 85b, and 85c exposing the charge storages 155a, 155b, and 155c.

The third device 100c is formed on the upper insulation layer 80. The active layer 30 of the third device 100c may selectively absorb light in any one wavelength region of red, blue, and green to photoelectrically convert the light. For example, the third device 100c may be a blue photoelectric conversion device configured to selectively sense light in a blue wavelength region. In another example, the third device 100c may be a green photoelectric conversion device configured to selectively sense light in a green wavelength region. The first electrode 10 and the second electrode 20 of the third device 100c may be electrically connected to the third charge storage 155c.

A focusing lens (not shown) may be further formed on the third device 100c. The focusing lens may control direction of incident light and gather the light in one region. The focusing lens may have a shape of, for example, a cylinder or a hemisphere, but is not limited thereto.

In the drawing, a structure in which the first device 100a, the second device 100b, and the third device 100c are sequentially stacked, but is not limited thereto, and the stacking order may be variously changed.

As described above, the first device 100a, the second device 100b, and the third device 100c that absorb light in different wavelength regions have a stacked structure, further reducing a size of the image sensor, implementing a down-sized image sensor, and simultaneously increasing sensitivity and reducing a crosstalk.

Figure 10:
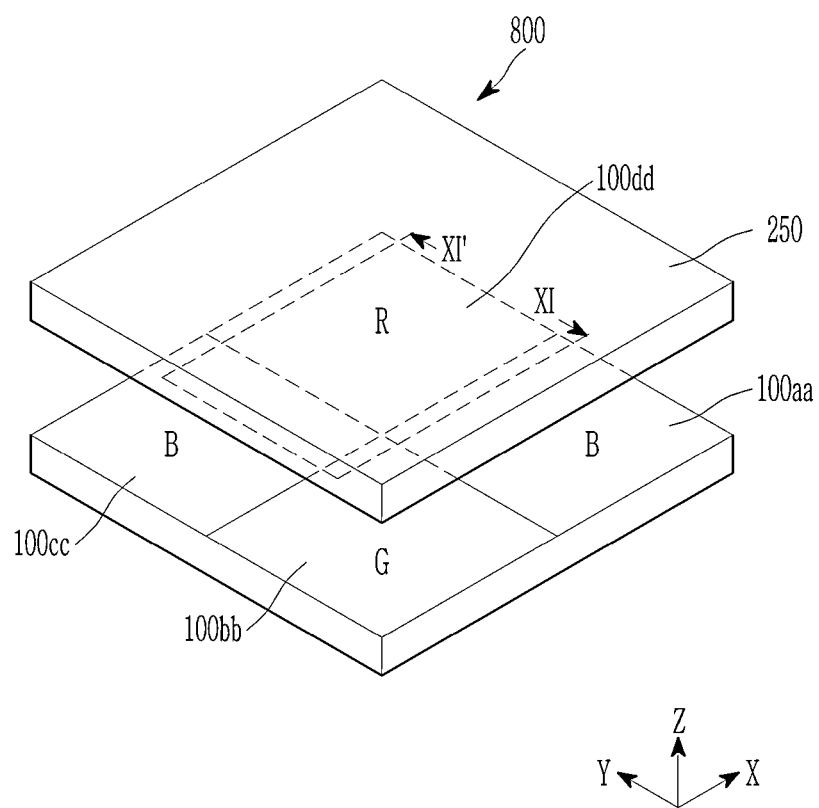
FIG. 10 is a perspective view schematically showing an organic CMOS image sensor according to some example embodiments, FIG. 11 schematically shows a view of cross-section of an example of the organic CMOS image sensor of FIG. 10 taken along line XI-XI' of FIG. 10.
Figure 11:
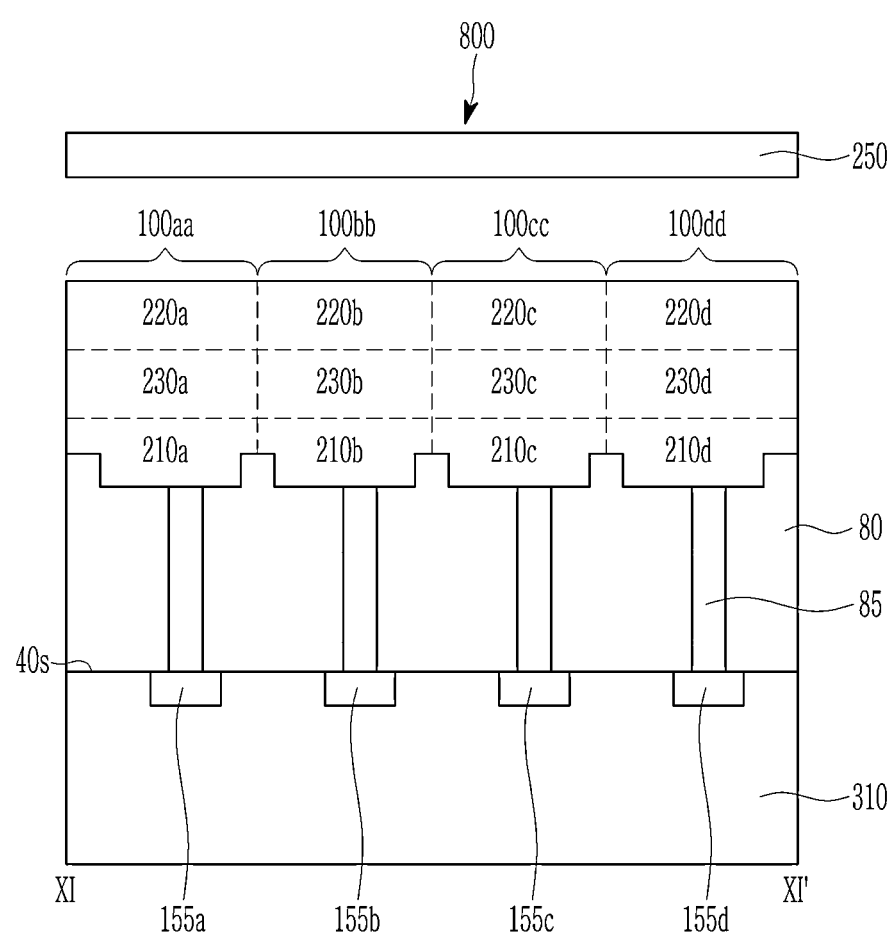

FIG. 10 is a perspective view schematically showing an example of an organic CMOS image sensor according to some example embodiments, and FIG. 11 schematically shows a view of a cross-section of an example of the organic CMOS image sensor of FIG. 10 taken along line XI-XI' of FIG. 10.

Referring to FIGS. 10 and 11, the organic CMOS image sensor 800 according to some example embodiments, as in some example embodiments, including the example embodiments shown in at least FIG. 4, includes the semiconductor substrate 310 and the insulation layer 80. The organic CMOS image sensor 800 may include an optical filter 250 which may be configured to selectively transmit light of various wavelength regions (e.g., selectively transmit visible light). In some example embodiments, the optical filter 250 may be omitted. The organic CMOS image sensor 800 includes multiple photoelectric devices 100aa, 100bb, 100cc, and 100dd which are stacked horizontally on the semiconductor substrate 310, for example stacked in a direction that is parallel to the upper surface 40s of the semiconductor substrate 310 such that the photoelectric devices 100aa to 100dd at least partially overlap each other in a horizontal direction that is parallel to the upper surface 40s of the semiconductor substrate 310.

As shown, for example, in FIG. 10, photoelectric devices 100aa and 100cc may be blue photoelectric devices configured to selectively sense light in a blue wavelength region, photoelectric device 100bb may be a green photoelectric device configured to selectively sense light in a green wavelength region, and photoelectric device 100dd may be a red photoelectric device configured to selectively sensor light in a red wavelength region, but example embodiments are not limited thereto, and each of the photoelectric devices 100aa to 100dd may be configured to selectively sense light of any wavelength region, including visible or non-visible (e.g., infrared or ultraviolet) light, provided that at least one of the photoelectric devices 100aa to 100dd is the green photoelectric device according to the example embodiments, such as the photoelectric device 100 or 200 as shown in FIG. 1 or 2.

As shown, the photoelectric devices 100aa to 100dd may be aligned side by side along a plane direction (e.g., XY direction) of the semiconductor substrate 310 and respectively connected, via respective through-holes 85, to respective charge storages 155a to 155d integrated in the semiconductor substrate 310. As shown, the respective first electrodes 210a to 210d, active layers 230a to 230d, and second electrodes 220a to 220d of the photoelectric devices 100aa to 100dd may be aligned side by side along a plane direction (e.g., XY direction) of the semiconductor substrate 310 (e.g., overlap in the horizontal direction).

At least one of the photoelectric devices 100aa to 100dd may each independently be the photoelectric devices 100 or 200 (green photoelectric device according to example embodiments) of FIG. 1 or 2, and the others (including a red photoelectric device and a blue photoelectric device) may have the same structure as the photoelectric devices 100 and 200, but an active layer 30 therein selectively absorbs light in a red or blue wavelength region to photoelectrically convert the light. Detailed descriptions of the photoelectric devices 100 and 200 are the same as described above. The first electrode 10 and the second electrode 20 of the photoelectric devices 100 and 200, the red photoelectric device, and the blue photoelectric device may be connected to the charge storages 155a, 155b, and 155c.

The photoelectric device 100aa includes a first electrode 210a, an active layer 230a, and a second electrode 220a. The photoelectric device 100bb includes a first electrode 210b, an active layer 230b, and a second electrode 220b. The photoelectric device 100cc includes a first electrode 210c, an active layer 230c, and a second electrode 220c. The photoelectric device 100dd includes a first electrode 210d, an active layer 230d, and a second electrode 220d.

The first electrodes 210a to 210d may each be the same as the first electrodes 10 of the photoelectric devices 100 and 200 of FIG. 1 or 2. The second electrodes 220a to 220d may each be the same as the second electrodes 20 of the photoelectric devices 100 and 200 of FIG. 1 or 2. The active layers 230a to 230d may each be the same as the active layers 30 of the photoelectric devices 100 and 200 of FIG. 1 or 2. At least some of the active layers 230a to 230d may have different material compositions and may be configured to sense (e.g., selectively absorb and photoelectrically convert) light in different wavelength regions. The active layers 230a and 230c may each be configured to selectively absorb light in the blue wavelength region and photoelectrically convert the absorbed light, the active layer 230b may be configured to selectively absorb light in the green wavelength region and photoelectrically convert the absorbed light, and the active layer 230d may be configured to absorb light in the red wavelength region and photoelectrically convert the absorbed light.

In some example embodiments, some or all of the second electrodes 220a to 220d may be separate portions of a single, continuous piece of material that extends between each of the photoelectric devices 100aa to 100dd to establish a common electrode, while the first electrodes 210a to 210d may be separate pieces of material in separate photoelectric devices 100aa to 100dd. In some example embodiments, some or all of the first electrodes 210a to 210d may be separate portions of a single, continuous piece of material that extends between each of the photoelectric devices 100aa to 100dd to establish a common electrode, while the second electrodes 220a to 220d may be separate pieces of material in separate photoelectric devices 100aa to 100dd.

The image sensor absorbs light in an appropriate wavelength region and may show all improved sensitivity (YSNR10) and color reproducibility ($\Delta E^*ab$) despite a stacked structure.

Herein, the YSNR10 indicates sensitivity of the image sensor, which is measured in a method described in Juha Alakarhu's "Image Sensors and Image Quality in Mobile Phones" printed in 2007 International Image Sensor Workshop (Ogunquit Maine, USA) but minimum illuminance expressed by lux at a ratio of 10 between signal and noise. Accordingly, the smaller the YSNR10 is, the higher sensitivity is.

On the other hand, the color reproducibility ($\Delta E^*ab$) shows a difference from standard colors in an X-Rite chart, and the $\Delta E^*ab$ (also indicated as simply $\Delta E$) is defined as a distance between two points on a L*a*b* color space by CIE (Commission International de L'Eclairage) in 1976. For example, the color difference may be calculated according to Equation 1.

$$\Delta E = \sqrt{(\Delta L^*)^2 + (\Delta a^*) + (\Delta b^*)^2} \qquad \text{[Equation 1]}$$

In Equation 1, $\Delta E$ denotes the color reproducibility (also denoted as $\Delta E^*ab$ herein), $\Delta L^*$ denotes a change of a color coordinate L* compared with the color coordinate L*at room temperature (about 20° C. to about 25° C.), $\Delta a^*$ denotes a change of a color coordinate a* compared with the color coordinate a*at room temperature (about 20° C. to about 25° C.), and $\Delta b^*$ denotes a change of a color coordinate b* compared with the color coordinate b*at room temperature (about 20° C. to about 25° C.).

In order to manufacture an image sensor having high sensitivity and high color reproducibility, YSNR10≤100 lux at $\Delta E^*ab$:3, and herein, the compound may realize YSNR10≤100 lux of sensitivity and color reproducibility at $\Delta E^*ab$≤3.

The image sensor may be applied to (e.g., included in) various electronic devices, for example, a mobile phone, a digital camera, and the like but is not limited thereto.

Figure 12:
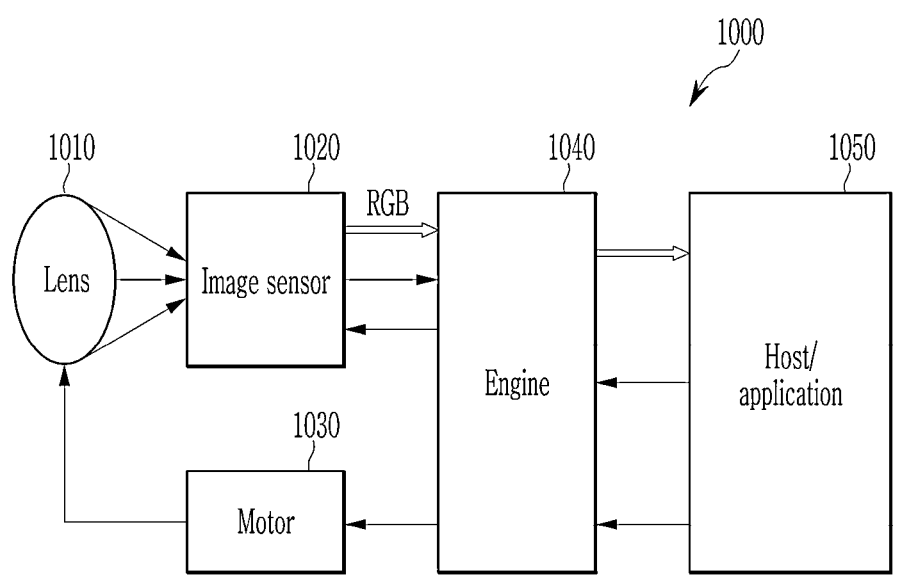
FIG. 12 is a block diagram of a digital camera including an image sensor according to some example embodiments.

FIG. 12 is a block diagram of a digital camera including an image sensor according to some example embodiments.

Referring to FIG. 12, a digital camera 1000 includes a lens 1010, an image sensor 1020, a motor 1030, and an engine 1040. The image sensor 1020 may be one of image sensors according to some example embodiments, including any of the example embodiments shown in FIGS. 3 to 11 of the present application.

The lens 1010 concentrates incident light on the image sensor 1020. The image sensor 1020 generates RGB data for received light through the lens 1010.

In some example embodiments, the image sensor 1020 may interface with the engine 1040.

The motor 1030 may adjust the focus of the lens 1010 or perform shuttering in response to a control signal received from the engine 1040. The engine 1040 may control the image sensor 1020 and the motor 1030.

The engine 1040 may be connected to a host/application 1050.

Figure 13:
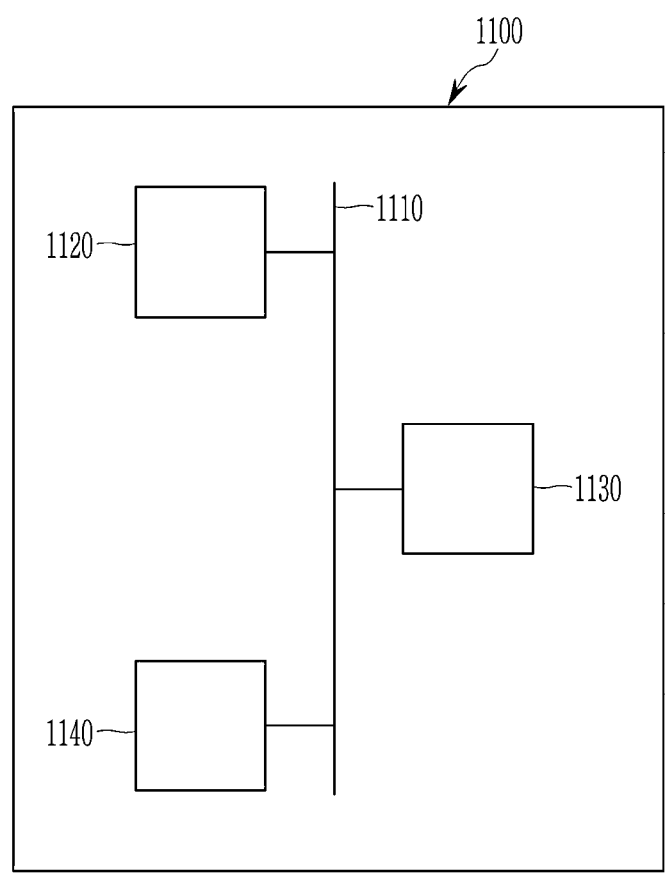
FIG. 13 is a schematic view of an electronic device according to some example embodiments.

FIG. 13 is a schematic view showing an electronic device according to some example embodiments.

Referring to FIG. 13, an electronic device 1100 may include a processor 1120, a memory 1130, and an image sensor 1140 that are electrically coupled together via a bus 1110.

The image sensor 1140 may be an image sensor, organic CMOS image sensor, or the like according to any of the example embodiments, including any of the example embodiments shown in FIGS. 3 to 11 of the present application. The memory 1130 may be a non-transitory computer readable medium and may store a program of instructions. The memory 1130 may be a nonvolatile memory, such as a flash memory, a phase-change random access memory (PRAM), a magneto-resistive RAM (MRAM), a resistive RAM (ReRAM), or a ferro-electric RAM (FRAM), or a volatile memory, such as a static RAM (SRAM), a dynamic RAM (DRAM), or a synchronous DRAM (SDRAM). The processor 1120 may execute the stored program of instructions to perform one or more functions. For example, the processor 1120 may be configured to process electrical signals generated by the image sensor 1140. The processor 1120 may include processing circuitry such as hardware including logic circuits; a hardware/software combination such as a processor executing software; or any combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processor 1120 may be configured to generate an output (e.g., an image to be displayed on a display interface) based on such processing.

One or more of the processor 1120, memory 1130, motor 1030, engine 1040, or host/application 1050 may be included in, include, and/or implement one or more instances of processing circuitry such as hardware including logic circuits, a hardware/software combination such as a processor executing software; or any combination thereof. In some example embodiments, said one or more instances of processing circuitry may include, but are not limited to, a central processing unit (CPU), an application processor (AP), an arithmetic logic unit (ALU), a graphic processing unit (GPU), a digital signal processor, a microcomputer, a field programmable gate array (FPGA), a System-on-Chip (SoC), a programmable logic unit, a microprocessor, or an application-specific integrated circuit (ASIC), etc. In some example embodiments, any of the memories, memory units, or the like as described herein may include a non-transitory computer readable storage device, for example a solid state drive (SSD), storing a program of instructions, and the one or more instances of processing circuitry may be configured to execute the program of instructions to implement the functionality of some or all of any of the processor 1120, memory 1130, motor 1030, engine 1040, or host/application 1050, or the like according to any of the example embodiments as described herein.

Hereinafter, some example embodiments are illustrated in more detail with reference to examples. However, these examples are non-limiting, and the inventive concepts are not limited thereto.

Synthesis Example 1: Synthesis of Compound Represented by Chemical Formula 1-1

[Chemical Formula 1-1]

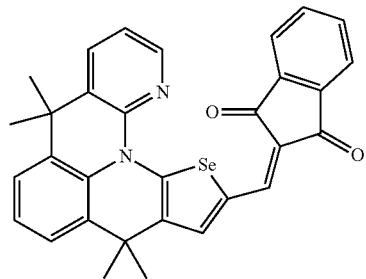

[Reaction Scheme 1-1]

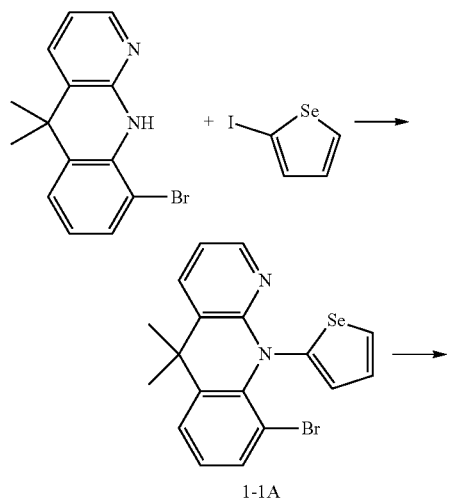

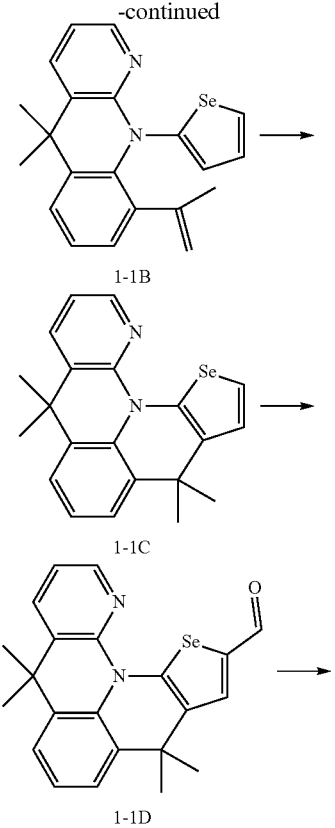

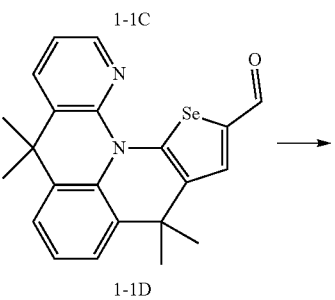

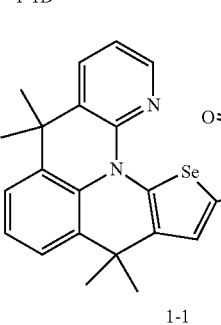

(i) Synthesis of Compound 1-1A 14.0 g (54 mmol) of 2-iodo-selenophene and 5.2 g (18.0 mmol) of 9-bromo-5,5-dimethyl-5,10-dihydrobenzo[b][1,8] naphthyridine are placed in a 100 mL round bottom flask and dissolved in 20 ml of 1,4-dioxane. 5.1 g (26 mmol) of copper iodide (CuI), 0.9 mL (7.3 mmol) of trans-(±)-1,2-diamino-cyclohexane, and 16.0 g (75 mmol) of potassium phosphate tribasic ($K_3PO_4$) are added thereto and reacted at 100° C. for 3 days. Then, the product is filtered using Celite and the filter is concentrated, and separated and purified through silica gel column chromatography (hexane:dichloromethane=volume ratio of 10:1). Through this, 4.4 g (Yield: 62%) of Compound 1-1A is obtained.

$^1$H-NMR (500 MHz, CD2Cl2): δ 8.37 (d, 1H), 7.72 (d, 1H), 7.46 (m, 3H), 7.09 (m, 3H), 6.50 (d, 1H), 1.59 (s, 6H).

(ii) Synthesis of Compound 1-1B 3 mL (16 mmol) of 2-isopropenylboronic acid pinacol ester, 0.65 g (0.48 mmol) of tetrakis(triphenylphosphine) palladium (0), 2 g (14.5 mmol) of potassium carbonate ($K_2CO_3$), and 2.5 mL each of water and ethanol are added to a solution of 2.0 g (4.8 mmol) of Compound 1-1A dissolved in 5 ml of toluene, and then stirred for 20 minutes while bubbling nitrogen gas. The reactants are reacted in a microwave reactor at 110° C. for 24 hours. After diluting the reactants in dichloromethane to separate the organic layer, the filtrate through Celite and silica is concentrated, and separation and purification are performed through silica gel column chromatography (hexane:dichloromethane=volume ratio of 10:1). Through this, 1.28 g (Yield: 70%) of Compound 1-1B is obtained.

¹H-NMR (500 MHz, CD2Cl2): δ 8.33 (d, 1H), 7.71 (d, 1H), 7.42 (d, 1H), 7.35 (d, 1H), 7.19 (t, 1H), 7.14 (d, 1H), 7.08 (q, 1H), 6.95 (q, 1H), 6.48 (d, 1H), 4.90 (d, 1H), 4.79 (d, 1H), 1.87 (s, 3H), 1.59 (s, 6H).

(iii) Synthesis of Compound 1-1C 1.5 g (3.9 mmol) of Compound 1-1B is dissolved in 10 ml of 4N HCl 1,4-dioxane solution at 0° C. and stirred for 12 hours. After confirming that the reactants are consumed through LC-MS, the mixture is poured into ice water and neutralized by adding a 2M aqueous sodium hydroxide solution, and then the organic layer extracted with toluene is washed with an aqueous sodium chloride solution. Anhydrous magnesium sulfate is added to the organic layer, dried, concentrated and purified through silica gel column chromatography (hexane:dichloromethane=volume ratio of 9:1) to obtain 0.6 g of Compound 1-1-C(yield: 40%). The above processes are repeated to obtain a sufficient amount of Compound 1-1C.

¹H-NMR (500 MHz, CD2Cl2): δ 8.23 (d, 1H), 7.76 (d, 1H), 7.54 (d, 1H), 7.41 (d, 1H), 7.37 (d, 1H), 7.31 (d, 1H), 7.17 (t, 1H), 7.05 (q, 1H), 1.63 (s, 6H), 1.61 (s, 6H).

¹³C-NMR (125.77 MHz, CD2Cl2): δ 146.3, 143.0, 133.7, 132.9, 132.4, 132.0, 130.2, 128.8, 125.9, 125.5, 125.1, 123.9, 123.6, 123.0, 118.0, 36.5, 36.0, 33.3, 31.9.

(iv) Synthesis of Compound 1-1 D 0.74 ml (7.9 mmol) of phosphoryl chloride is added dropwise to 2.00 ml (25.7 mmol) of N,N-dimethylformamide at 0° C., followed by stirring at room temperature for 2 hours. This solution is slowly added to a solution of 0.92 g (2.42 mmol) of Compound 1-1C in 40 ml of dichloromethane at 0° C., followed by stirring at room temperature for 1 hour. Water is added to the obtained product, and 2M aqueous sodium hydroxide solution is added until the pH value is 14, followed by stirring at room temperature for 2 hours. The organic layer extracted with dichloromethane is washed with aqueous sodium chloride solution, dried with anhydrous magnesium sulfate, and then concentrated. The obtained product is separated and purified through silica gel column chromatography (volume ratio is changed from hexane:dichloromethane=volume ratio of 3:2 to 100 volume % of dichloromethane) to obtain 0.84 g (Yield: 85%) of Compound 1-1D.

¹H-NMR (500 MHz, CD2Cl2): δ 9.79 (s, 1H), 8.33 (d, 1H), 8.03 (s, 1H), 7.86 (d, 1H), 7.43 (m, 2H), 7.24 (t, 1H), 7.17 (q, 1H) 1.67 (s, 6H), 1.65 (s, 6H)

¹³C-NMR (125.77 MHz, CD2Cl2): δ 185.3, 145.1, 142.8, 142.3, 139.4, 138.0, 134.9, 132.3, 130.9, 130.4, 130.1, 126.8, 125.3, 125.0, 124.6, 119.3, 36.2, 35.9, 33.7, 33.1

(v) Synthesis of Compound Represented by Chemical Formula 1-1

0.65 g (1.6 mmol) of Compound 1-11D is suspended in 50 ml of ethanol, 0.24 g (1.05 mmol) of 1H-indene-1,3(2H)-dione is added thereto, and the mixture is stirred at 50° C. for 24 hours and concentrated under reduced pressure. After silica gel filtering, recrystallization using chloroform and ethanol to obtain 0.69 g (Yield: 80%) of the compound represented by Chemical Formula 1-1. The obtained compound is purified by sublimation to a purity of 99.9%.

¹H-NMR (500 MHz, CD2Cl2): δ 8.54 (d, 1H), 8.18 (s, 1H), 8.02 (s, 1H), 7.93 (dd, 1H), 7.88 (t, 1H), 7.31 (t, 1H), 7.72 (m, 2H), 7.47 (m, 2H), 7.28 (m, 2H), 1.69 (s, 6H), 1.69 (s, 6H).

Synthesis Example 2: Synthesis of Compound Represented by Chemical Formula 1-2

[Chemical Formula 1-2]

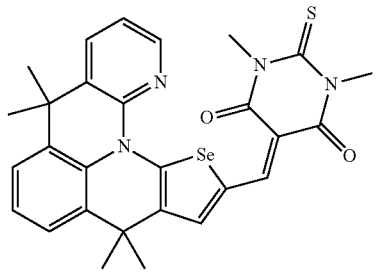

A compound represented by Chemical Formula 1-2 is obtained in the same manner as in Synthesis Example 1 except that 1,3-dimethyl-2-thiobarbituric acid is used instead of 1H-indene-1,3(2H)-dione in step (v) of Synthesis Example 1. The obtained compound is purified by sublimation to a purity of 99.9%.

¹H-NMR (500 MHz, CD2Cl2): δ 8.70 (s, 1H), 8.55 (d, 1H), 8.28 (s, 1H), 7.96 (d, 1H), 7.49 (m, 2H), 7.31 (m, 2H), 3.82 (s, 3H), 3.77 (s, 3H), 1.69 (s, 6H), 1.69 (s, 6H).

Synthesis Example 3: Synthesis of Compound Represented by Chemical Formula 1-3

[Chemical Formula 1-3]

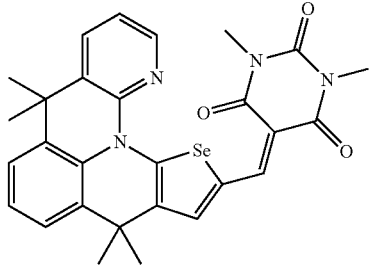 [SMILES: CN1C(=O)C(=Cc2cc3c([se]2)N2c4ncccc4C(C)(C)c4cccc(c42)C3(C)C)C(=O)N(C)C1=S]

A compound represented by Chemical Formula 1-3 is obtained in the same manner as in Synthesis Example 1 except that 1,3-dimethylbarbituric acid is used instead of 1H-indene-1,3(2H)-dione in step (v) of Synthesis Example 1. The obtained compound is purified by sublimation to a purity of 99.9%.

¹H-NMR (500 MHz, CD2Cl2): δ 8.71 (s, 1H), 8.52 (d, 1H), 8.22 (s, 1H), 7.93 (d, 1H), 7.47 (m, 2H), 7.29 (m, 2H), 3.41 (s, 3H), 3.36 (s, 3H), 1.69 (s, 6H), 1.68 (s, 6H).

¹³C-NMR (125.77 MHz, CD2Cl2): δ 163.3, 162.6, 155.2, 151.9, 151.4, 148.4, 145.4, 143.3, 135.2, 133.4, 133.1, 132.9, 131.0, 130.8, 127.7, 125.6, 125.2, 124.9, 120.3, 103.8, 36.0, 35.7, 33.7, 33.1, 28.3, 27.6.

Reference Synthesis Example 1: Synthesis of Compound Represented by Chemical Formula 2-1

[Chemical Formula 2-1]

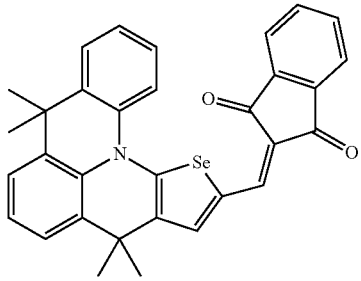

[Reaction Scheme 2-1]

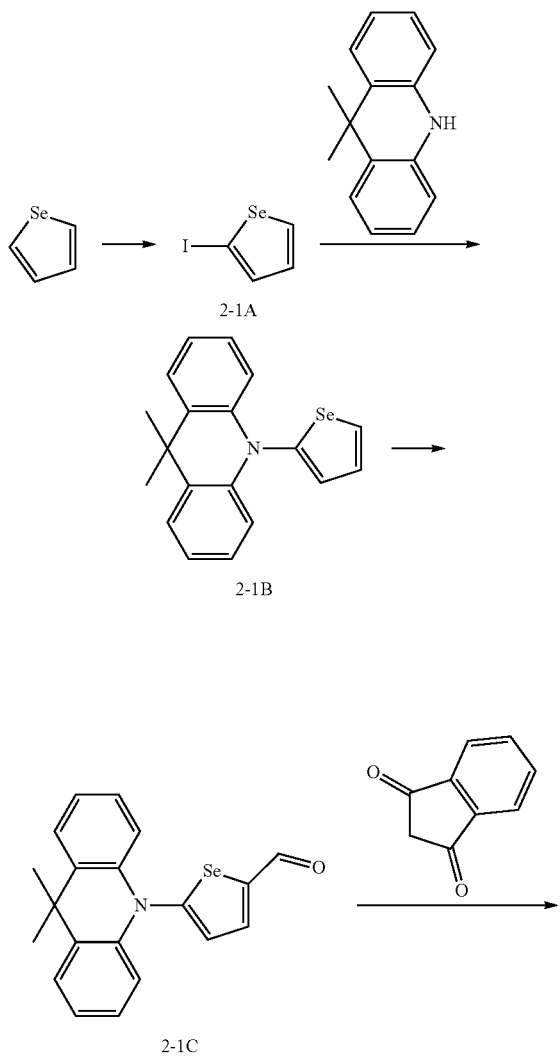

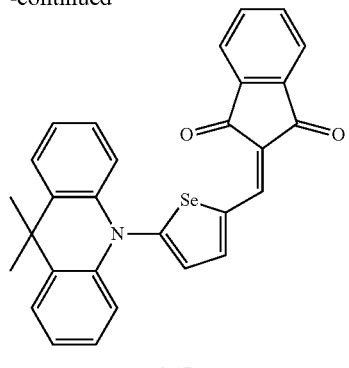

2-1D (i) Synthesis of Compound 2-1A 2-iodoselenophene is synthesized referring to the method disclosed in Efficient Synthesis of 2-Iodo and 2-Dicyanomethyl Derivatives of Thiophene, Selenophene, Tellurophene, and Thieno[3,2-b]thiophene, Takahashi, K.; Tarutani, S. Heterocycles 1996, 43, 1927-1935.

(ii) Synthesis of Compound 2-1B 7.47 g (28.7 mmol) of 2-iodoselenophene and 5.00 g (23.9 mmol) of 9,9-dimethyl-9,10-dihydroacridine are dissolved in 80 ml of toluene in the presence of 5 mol % of Pd(dba)$_2$, 10 mol % of P(tBu)$_3$ and 6.89 g (71.7 mmol) of NaOtBu, and the mixture is heated under reflux for 2 hours. The obtained product is separated and purified by silica gel column chromatography (toluene:hexane=volume ratio of 1:4) to obtain 3.1 g (Yield: 39.5%) of Compound 2-1B (9,9-dimethyl-10-(selenophen-2-yl)-9,10-dihydroacridine).

(iii) Synthesis of Compound 2-1C 1.7 ml of phosphoryl chloride is added dropwise to 4.4 ml of N,N-dimethylformamide at 0° C. and stirred at room temperature (24° C.) for 1 hour. The mixture is slowly added dropwise to 90 ml solution of 3.00 g of Compound 2-1B dissolved in dichloromethane at 0° C., followed by stirring at room temperature for 1 hour. 100 ml of water is added thereto, and an aqueous sodium hydroxide solution is added thereto until the pH value becomes 14, followed by stirring at room temperature for 2 hours. The organic layer extracted with dichloromethane is washed with an aqueous sodium chloride solution, and then dried with anhydrous magnesium sulfate. The obtained product is separated and purified by silica gel column chromatography (volume ratio is changed from dichloromethane:hexane=volume ratio of 3:2 to 100% of dichloromethane) to obtain 2.90 g (Yield: 89.3%) of Compound 2-1-C(5-(9,9-dimethylacridin-10(9H)-yl)selenophene-2-carbaldehyde).

(iv) Synthesis of Compound Represented by Chemical Formula 2-1

1.00 g (2.73 mmol) of the obtained Compound 2-1C is suspended in ethanol, and 0.440 g (30.1 mmol) of 1H-indene-1,3(2H)-dione is added thereto and reacted at 50° C. for 2 hours, followed by filtering with a silica gel filter. Thereafter, 1.05 g (Yield: 77.8%) of compound represented by Chemical Formula 2-1 is obtained by recrystallization from chloroform and ethanol. The obtained compound is purified by sublimation to a purity of 99.9%.

$^1$H-NMR (300 MHz, CDCl$_3$): δ 7.9 (s, 1H), 7.8 (m, 5H), 7.7 (m, 2H), 7.6 (d, 2H), 7.4 (m, 4H), 7.0 (d, 1H), 1.6 (s, 6H).

Reference Synthesis Example 2: Synthesis of Compound Represented by Chemical Formula 2-2

[Chemical Formula 2-2]

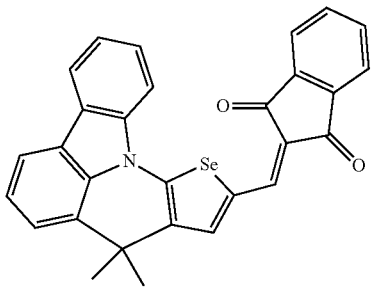

[Reaction Scheme 2-2]

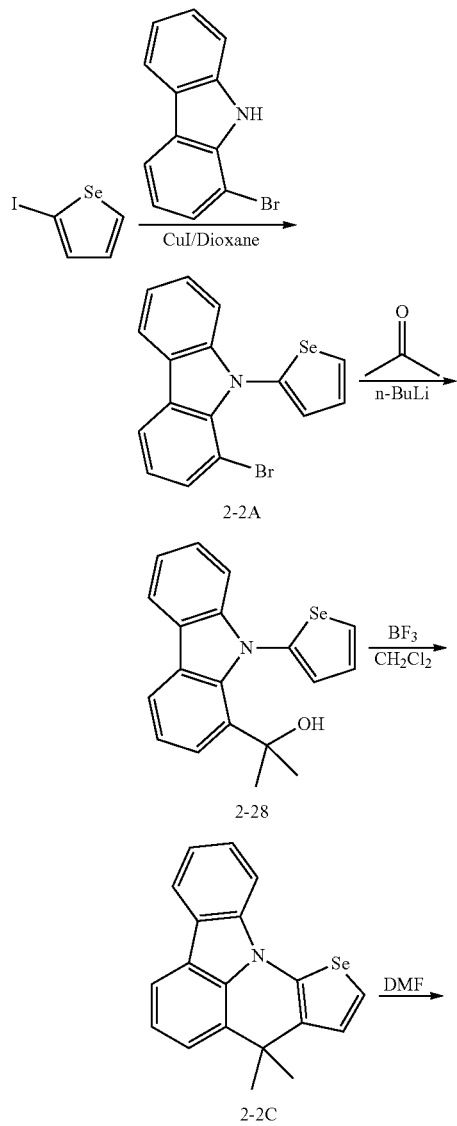

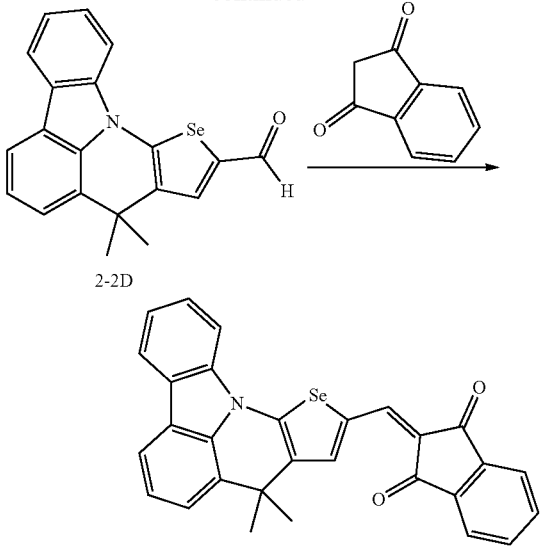

(i) Synthesis of Compound 2-2A 9.4 g (36.5 mmol) of 2-iodoselenophene and 7.5 g (30.5 mmol) of 1-bromo-9H-carbazole are dissolved in 30 ml of dioxane. 0.29 g (1.52 mmol) of copper (1) iodide, 0.70 g (6.09 mmol) of trans-1,2-cyclohexanediamine, and 12.9 g (61.0 mmol) of tripotassium phosphate are added thereto and the mixture is heated under reflux for 30 hours. At this time, the obtained product is separated and purified through silica gel column chromatography (hexane:ethyl acetate=volume ratio of 5:1) to obtain 8.18 g (Yield: 72%) of Compound 2-2A. The above process is repeated to obtain a sufficient amount of Compound 2-2A.

(ii) Synthesis of Compound 2-2B 12.0 g (32.0 mmol) of Compound 2-2A is dissolved in 300 ml of dehydrated diethyl ether. 12 ml (32.0 mmol) of a 2.76 M n-butyl lithium (n-BuLi) hexane (hexane) solution is added dropwise at −50° C., followed by stirring at room temperature for 1 hour. 2.0 g (35.2 mmol) of dehydrated acetone (dimethyl ketone, $CH_3COCH_3$) is added thereto at −50° C., and the mixture is stirred at room temperature for 2 hours. The organic layer extracted from diethyl ether is washed with an aqueous sodium chloride solution, and then dried with anhydrous magnesium sulfate. At this time, the obtained product is separated and purified through silica gel column chromatography (volume ratio of hexane:dichloromethane is changed from 100:0 to 50:50) to obtain 6.3 g (Yield: 56%) of Compound 2-2B.

(iii) Synthesis of Compound 2-2C 6.23 g (17.6 mmol) of Compound 2-2B is dissolved in 180 ml of dichloromethane. 4.98 g (35.5 mmol) of boron trifluoride-ethyl ether complex is added dropwise at 0° C. and stirred for 2 hours. The organic layer extracted from dichloromethane is washed with an aqueous sodium chloride solution, and then dried with anhydrous magnesium sulfate. At this time, the obtained product is separated and purified through silica gel column chromatography (hexane:dichloromethane=volume ratio of 50:50) to obtain 5.12 g (Yield: 87%) of Compound 2-2C. The above processes are repeated to obtain a sufficient amount of Compound 2-2C.

(iv) Synthesis of Compound 2-2D 1.9 ml (20.2 mmol) of phosphoryl chloride is added dropwise to 6.0 ml (77.5 mmol) of N,N-dimethylformamide at −15° C., and then stirred at room temperature for 2 hours. This solution is slowly added to a solution of 5.23 g (15.5 mmol) of Compound 2-2C in 150 ml of dichloromethane at −15° C., stirred at room temperature for 30 hours, and then concentrated under low pressure. Water is added thereto, and an aqueous sodium hydroxide solution is added until the pH value is 14, followed by stirring at room temperature for 2 hours. The organic layer extracted with dichloromethane is washed with an aqueous sodium chloride solution, and then dried with anhydrous magnesium sulfate. The product thus obtained is separated and purified through silica gel column chromatography (hexane:dichloromethane=volume ratio of 50:50) to obtain 3.34 g (Yield: 65%) of Compound 2-2D.

(v) Synthesis of Compound Represented by Chemical Formula 2-2

1.50 g (4.11 mmol) of Compound 2-2D is dissolved in 20 ml of tetrahydrofuran, 0.72 g (4.93 mmol) of 1H-indene-1,3(2H)-dione is added, and the mixture is stirred at 50° C. for 4 hours and concentrated under reduced pressure. Recrystallization using chloroform and ethanol is performed to obtain 2.03 g (Yield: 74%) of the compound represented by Chemical Formula 2-2. The obtained compound is purified by sublimation to a purity of 99.9%.

$^1$H-NMR (300 MHz, Methylene Chloride-d$_2$): δ 8.15 (d, 1H), 8.14 (s, 1H), 8.07 (s, 1H), 8.03 (d, 1H), 7.95-7.88 (m, 3H), 7.82-7.77 (m, 2H), 7.72 (td, 1H), 7.45-7.55 (m, 3H), 1.79 (s, 6H).

Reference Synthesis Example 3: Synthesis of Compound Represented by Chemical Formula 2-3

[Chemical Formula 2-3]

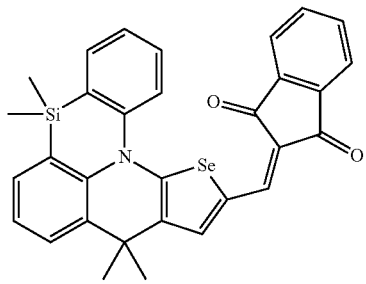

[Reaction Scheme 2-3]

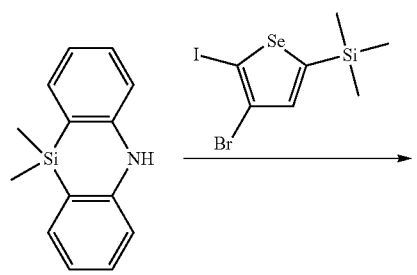

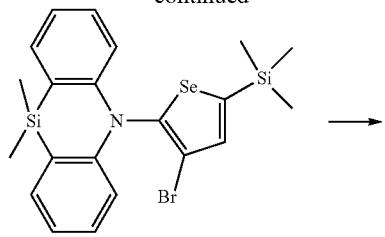

2-3A

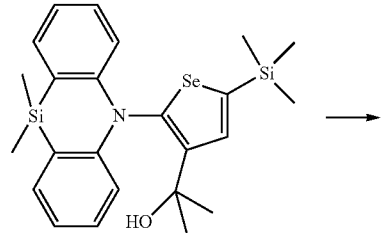

2-3B

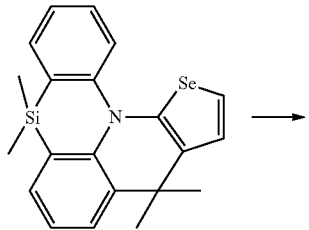

2-3C

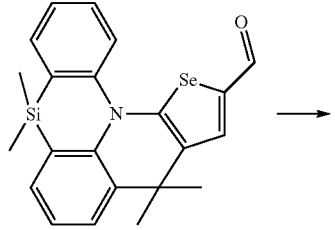

2-3D

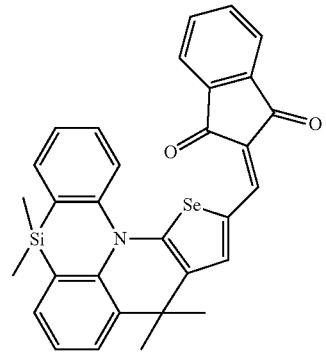

2-3

(i) Synthesis of Compound 2-3A 12.6 g (30.9 mmol) of (4-bromo-5-iodoselenophen-2-yl)trimethylsilane and 5.8 g (25.7 mmol) of 10,10-dimethyl-5,10-dihydrodibenzo[b,e][1,4]azasiline are dissolved in 90 ml of toluene. In the presence of 5 mol % of Pd(dba)$_2$, 5 mol % of P(tBu)$_3$, and 7.4 g (77.2 mmol) of NaOtBu, the mixture is heated under reflux for 2 hours. At this time, the obtained product is separated and purified through silica gel column chromatography (hexane:ethyl acetate=volume ratio of 5:1) to obtain 2.7 g (Yield: 21%) of Compound 2-3A.

(ii) Synthesis of Compound 2-3B 2.7 g (3.4 mmol) of Compound 2-3A is dissolved in 50 ml of dehydrated diethyl ether. 4.3 ml (10.7 mmol) of a 2.76 M n-BuLi hexane solution is added dropwise at −50° C., followed by stirring at room temperature for 1 hour. 0.8 ml (10.7 mmol) of dehydrated acetone (dimethyl ketone, $CH_3COCH_3$) is added thereto at −50° C., and the mixture is stirred at room temperature for 2 hours. The organic layer extracted from diethyl ether is washed with an aqueous sodium chloride solution, and then dried with anhydrous magnesium sulfate. At this time, the obtained product is separated and purified through silica gel column chromatography (volume ratio of hexane:dichloromethane is changed from 100:0 to 50:50) to obtain 1.6 g (Yield: 62%) of Compound 2-3B.

(iii) Synthesis of Compound 2-3C 1.6 g (3.3 mmol) of Compound 2-3B is dissolved in 180 ml of dichloromethane. 3.04 ml (30.4 mmol) of 1M $BBr_3$ solution is added dropwise at 0° C. and stirred for 2 days. The organic layer extracted from dichloromethane is washed with an aqueous sodium chloride solution, and then dried by adding anhydrous magnesium sulfate. At this time, the obtained product is separated and purified through silica gel column chromatography (hexane:dichloromethane=volume ratio of 50:50) to obtain 1.2 g (Yield: 85%) of Compound 2-3C.

(iv) Synthesis of Compound 2-3D 0.4 ml (4.72 mmol) of phosphoryl chloride is added dropwise to 1.5 ml (20.3 mmol) of N,N-dimethylformamide at −15° C., and then stirred at room temperature for 2 hours. This solution is slowly dropped into a 100 ml solution of Compound 2-3C in 1.2 g (2.9 mmol) in dichloromethane at −15° C., stirred at room temperature for 30 hours, and then concentrated under low pressure. Water is added thereto, and an aqueous sodium hydroxide solution is added until the pH value is 14, followed by stirring at room temperature for 2 hours. The organic layer extracted with dichloromethane is washed with an aqueous sodium chloride solution, and then dried with anhydrous magnesium sulfate. The product thus obtained is separated and purified through silica gel column chromatography (hexane:dichloromethane=volume ratio of 50:50) to obtain 0.4 g (Yield: 33%) of Compound 2-3D.

(v) Synthesis of Compound Represented by Chemical Formula 2-3

0.4 g (1.0 mmol) of Compound 2-3D is dissolved in 20 ml of tetrahydrofuran, and after adding 0.17 g (1.2 mmol) of 1H-indene-1,3(2H)-dione, the mixture is stirred at 50° C. for 4 hours and concentrated under reduced pressure. Recrystallization using chloroform and ethanol is performed to obtain 0.4 g (Yield: 69%) of the compound represented by Chemical Formula 2-3. The obtained compound is purified by sublimation to a purity of 99.9%.

$^1$H-NMR (500 MHz, Methylene Chloride-$d_2$): δ 8.04 (d, 1H), 7.98 (s, 2H), 7.83-7.81 (m, 1H), 7.78-7.76 (m, 1H), 7.70-7.67 (m, 3H), 7.52 (dd, 1H), 7.47 (dd, 1H), 7.44 (td, 1H), 7.35 (td, 1H), 7.28 (t, 1H), 1.92 (s, 3H), 1.37 (s, 3H), 0.72 (s, 3H), 0.27 (s, 3H).

Reference Synthesis Example 4: Synthesis of Compound Represented by Chemical Formula 2-4

[Chemical Formula 2-4]

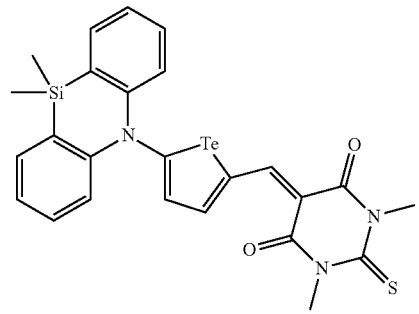

[Reaction Scheme 2-4]

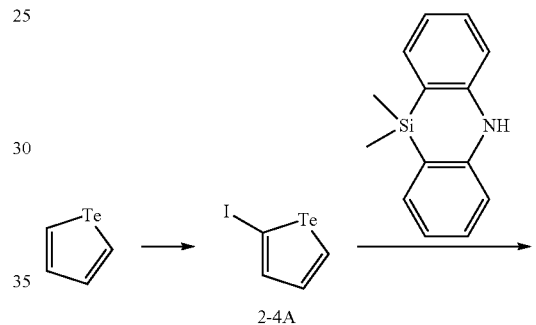

2-4A

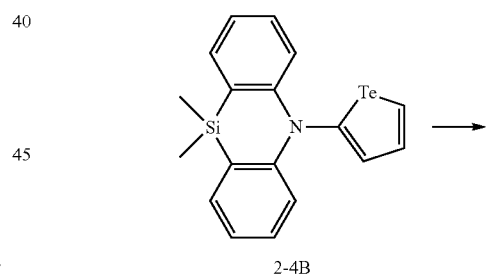

2-4B

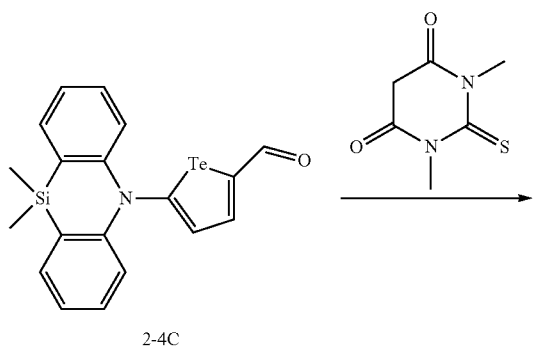

2-4C

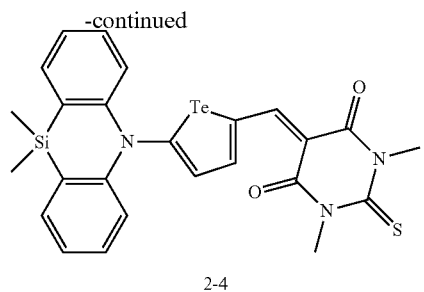

2-4

(i) Synthesis of Compound 2-4A 2-iodotellurophene is synthesized referring to the method disclosed in Efficient Synthesis of 2-Iodo and 2-Dicyanomethyl Derivatives of Thiophene, Selenophene, Tellurophene, and Thieno[3,2-b]thiophene, Takahashi, K.; Tarutani, S. Heterocycles 1996, 43, 1927-1935.

(ii) Synthesis of Compound 2-4B 15.0 g (49.1 mmol) of 2-iodotellurophene and 10.0 g (44.6 mmol) of 10,10-dimethyl-5,10-dihydrodibenzo[b,e][1,4]azasiline are dissolved in 200 ml of anhydrous toluene in the presence of 5 mol % of Pd(dba)$_2$, 5 mol % of P(tBu)$_3$, and 12.9 g (133.9 mmol) of NaOtBu, and the mixture is heated under reflux for 2 hours. The obtained product is separated and purified by silica gel column chromatography (toluene:hexane=volume ratio of 1:4) to obtain 6.8 g of (Yield 37.8%) of Compound 2-4B (10,10-dimethyl-5-(tellurophen-2-yl)-5,10-dihydrodibenzo[b,e][1,4]azasiline).

(iii) Synthesis of Compound 2-4C 6.2 ml of phosphoryl chloride is added dropwise to 30.0 ml of N,N-dimethylformamide at −15° C. and stirred at room temperature (24° C.) for 2 hours. This is slowly added dropwise to a mixture of 300 ml of dichloromethane and 6.8 g of Compound 2-4B at −15° C., stirred at room temperature for 30 minutes, and concentrated under reduced pressure. 300 ml of water is added thereto, and an aqueous sodium hydroxide solution is added until the pH value is 14, followed by stirring at room temperature for 2 hours. The organic layer extracted with dichloromethane is washed with aqueous sodium chloride solution, and then dried with anhydrous magnesium sulfate. The obtained product is separated and purified by silica gel column chromatography (hexane:ethyl acetate=volume ratio of 4:1) to obtain 2.82 g (Yield: 38.8%) of Compound 2-4-C(5-(10,10-dimethyldibenzo[b,e][1,4]azasilin-5(10H)-yl)tellurophene-2-carbaldehyde).

(iv) Synthesis of Compound Represented by Chemical Formula 2-4

2.82 g (6.54 mmol) of the obtained Compound 2-4C is suspended in ethanol, and 1.35 g (7.85 mmol) of 1,3-dimethyl-2-thiobarbituric acid is added thereto, followed by reaction at 50° C. for 2 hours to obtain 2.98 g (Yield: 77.8%) of the compound represented by Chemical Formula 2-4. The obtained compound is purified by sublimation to a purity of 99.9%.

$^1$H-NMR (500 MHz, Methylene Chloride-d$_2$): δ 8.46 (s, 1H), 8.26 (d, 1H), 7.80 (d, 2H), 7.71 (d, 2H), 7.54 (t, 2H), 7.42 (t, 2H), 6.93 (d, 1H), 3.68 (d, 6H), 0.45 (s, 6H).

Example 1: Manufacture of Photoelectric Device

ITO is laminated on a glass substrate through sputtering to form an about 150 nm-thick anode, and the ITO glass substrate is ultrasonic wave-cleaned with acetone/isopropyl alcohol/pure water respectively for 15 minutes and then, UV ozone-cleaned. Subsequently, the compound according to Synthesis Example 1 and C60 are codeposited in a volume ratio of 1.2:1 on the ITO glass substrate to form a 120 nm-thick active layer, and ITO is vacuum-deposited to be 7 nm thick to manufacture a photoelectric device having a structure of ITO (150 nm)/active layer (120 nm)/ITO (7 nm).

Examples 2 and 3 and Reference Examples 1 to 4: Manufacture of Photoelectric Device Photoelectric devices according to Example 2, Example 3, and Reference Examples 1 to 4 are manufactured according to the same method as Example 1 except that each of compounds according to Synthesis Example 2, Synthesis Example 3 and Reference Synthesis Examples 1 to 4 is respectively used instead of the compound of Synthesis Example 1.

Evaluation 1: Light Absorption Characteristics of Compound

Light absorption characteristics (a maximum absorption wavelength ($\lambda_{max}$) and a full width at half maximum (FWHM)) of the compounds according to Synthesis Examples 1 to 3 depending on a wavelength are evaluated. The light absorption characteristics are evaluated using samples prepared after preparing the compounds obtained in Synthesis Examples 1 to 3 by dissolving them in toluene at 1.0×10$^{-5}$ mol/L, respectively. The results are shown in Table 1.

TABLE 1

| Compounds | Chemical Formula | $\lambda_{max}$ (nm) | FWHM (nm) |
|---|---|---|---|
| Synthesis Example 1 | | 541 | 37 |

TABLE 1-continued

| Compounds | Chemical Formula | $\lambda_{max}$ (nm) | FWHM (nm) |
|---|---|---|---|
| Synthesis Example 2 | | 546 | 34 |
| Synthesis Example 3 | | 518 | 36 |

Referring to Table 1, the compounds of Synthesis Examples 1 to 3 exhibit a maximum absorption wavelength in a green wavelength region and a small full width at half maximum (FWHM). Accordingly, the compounds of Synthesis Examples 1 to 3 exhibit excellent absorption selectivity in the green wavelength region.

Evaluation 2: Energy Level, Reorganization Energy, and Oscillator Strength of Compounds The compounds according to Synthesis Examples 1 to 3 are used as p-type semiconductor compounds, respectively, and the compounds (p-type semiconductor compound) and C60 (n-type semiconductor compound) are co-deposited in a volume ratio of 1:1.2 to form a thin film. For each thin film, HOMO energy level in the ultraviolet-visible (UV-Vis) region is measured using AC-3 photoelectron spectrophotometer (RIKEN KEIKI) equipment, and the band gap is obtained from an UV spectrum measured using UV spectrometer (manufactured by Varian, Inc.). The HOMO energy level and the band gap are used to calculate LUMO energy level. Reorganization energy and oscillator strength are calculated at DFT B3LYP/6-311 G(d,p) level using Gaussian 09 program. The results are shown in Table 2.

TABLE 2

| Compounds | HOMO (eV) | LUMO (eV) | Reorganization Energy (eV) | Oscillator Strength (a.u.) |
|---|---|---|---|---|
| Synthesis Example 1 | −5.32 | −2.46 | 0.194 | 1.01 |
| Synthesis Example 2 | −5.52 | −2.65 | 0.183 | 1.06 |
| Synthesis Example 3 | −5.45 | −2.66 | 0.202 | 0.93 |

Referring to Table 2, the energy levels (HOMO and LUMO) of the compounds according to Synthesis Examples 1 to 3 show that the compounds according to Synthesis Examples 1 to 3 are suitable for use as a p-type semiconductor. From the low reorganization energy, excellent stability of molecules and excellent packing properties during the deposition process may be predicted, and the high extinction coefficient of the compound may be predicted from the high oscillator strength.

Evaluation 3: Thermal Stability of Compounds

Thermal stability is evaluated by measuring the melting point ($T_m$), deposition temperature (sublimation temperature), and decomposition temperature of the compounds according to Synthesis Examples 1 to 3. The deposition temperature is evaluated by thermogravimetric analysis (TGA), and the deposition characteristics are evaluated from a weight loss according to the temperature increase by sublimating the compound under a high vacuum of a pressure of 10 Pa. The results are shown in Table 3.

TABLE 3

| | $T_m$ (° C.) | $T_{s10}$ (10 wt %, 10 Pa) (° C.) | $T_{d10}$ (10 wt %, 1 atm) (° C.) | $\Delta T$ ($T_m$ − $T_{s10}$) (° C.) |
|---|---|---|---|---|
| Synthesis Example 1 | 252 | 223 | 363 | 29 |
| Synthesis Example 2 | 358 | 264 | 365 | 94 |
| Synthesis Example 3 | 317 | 229 | 363 | 88 |

* $T_{s10}$ (° C.) (10 wt %): the temperature at which the weight of the sample reduced by 10 wt %
$T_{d10}$ (° C.) (10 wt %): the temperature at which 10 wt % of the sample is decomposed Referring to Table 3, the compounds according to Synthesis Examples 1 to 3 have good thermal stability.

Evaluation 4: Planarity of Compounds

For the compounds according to Synthesis Examples 1 to 3, a molecular skeleton of an energetically optimized structure is calculated through density functional theory (DFT) calculation, and the longest length at a major axis (i.e., the length of the longest axis) (X) and the shortest length at a minor axis (i.e., the length of the shortest axis) (Z) in the molecular skeleton are measured to calculate a ratio (Z/X) of the minor axis/major axis length as the aspect ratio. The results are shown in Table 4.

TABLE 4

| | Aspect ratio |
|---|---|
| Synthesis Example 1 | 0.377 |
| Synthesis Example 2 | 0.391 |
| Synthesis Example 3 | 0.398 |

Referring to Table 4, the aspect ratio of the compounds according to Synthesis Examples 1 to 3 is as low as about 0.40. These results indicate that the compounds according to Synthesis Examples 1 to 3 maintain planarity.

Evaluation 5: External Quantum Efficiency of Photoelectric Device

External quantum efficiency (EQE) according to a wavelength and a voltage of the photoelectric devices according to Examples 1 to 3 is evaluated.

The external quantum efficiency is measured by using an IPCE measurement system (McScience Inc., Korea). First, an Si photodiode (Hamamatsu Photonics K.K., Japan) is used to calibrate the system, and the photoelectric devices according to Examples 1 to 3 are mounted on the system, and then, the external quantum efficiency thereof is measured in a wavelength range of about 350 nm to 750 nm. The EQEs at 3V, the maximum absorption wavelengths, and FWHMs of the photoelectric devices according to Example 1 and Example 2 are shown in Table 5.

TABLE 5

| | Maximum absorption wavelength ($\lambda_{max}$, nm) | Full width at half maximum (FWHM) (nm) | EQE (room temperature, %) |
|---|---|---|---|
| Example 1 | 555 | 101 | 49 |
| Example 2 | 560 | 98 | 70 |

Referring to Table 5, the photoelectric devices according to Examples 1 and 2 exhibit a maximum absorption wavelength in the green wavelength region and have excellent absorption selectivity in the green wavelength region because the full widths at half maximum (FWHM) is narrow and the external quantum efficiency at room temperature is also excellent.

Evaluation 6: High-Temperature Stability of Photoelectric Device

After the photoelectric devices according to Examples 1 to 3 are annealed at 180° C. and 200° C., respectively, external quantum efficiency is measured by the method described in Evaluation 5. Among them, the evaluation results of the photoelectric device according to Example 2 are shown in Table 6. For comparison, EQE at room temperature is also described.

TABLE 6

| | EQE (room temperature, %) | EQE (180° C., %) | EQE (200° C., %) |
|---|---|---|---|
| Example 2 | 70 | 63 | 55 |

Referring to Table 6, the photoelectric device according to Example 2 exhibits excellent external quantum efficiency not only at room temperature but also after annealing at 180° C. or higher.

Evaluation 7: Residual Charge Characteristics of Photoelectric Device

Residual charges of the photoelectric devices according to Examples 1 to 3 and Reference Examples 1 to 4 are evaluated.

When photoelectrically converted charges are not all used for signal treatment but remain in one frame, the charges in the former frame are overlapped and read with charges in the following frame, and herein, an amount of the charges in the following frame is called to be an amount of residual charges. The amount of the residual charges is measured by irradiating light in the green wavelength region of 532 nm where the photoelectric conversion may occur for desired and/or alternatively predetermined time, turning off the light, and integrating the current measured in units of $10^{-6}$ seconds with an oscilloscope equipment, by time. The amount of the residual charges is evaluated by a h+/μm² unit based on 5000 lux light. After the photoelectric devices according to Examples 1 to 3 and Reference Examples 1 to 4 are annealed at 180° C., residual charges are measured by the method described above. Table 7 shows the residual charge measurement results of the photoelectric devices according to Example 2 and Reference Example 4.

TABLE 7

| | Residual charge (room temperature, h+/μm²) | Residual charge (180° C., h+/μm²) |
|---|---|---|
| Example 2 | 38 | 31 |
| Reference Example 4 | 512 | 156 |

Referring to Table 7, the photoelectric device according to Example 2 exhibits lower residual charges than the photoelectric device according to Reference Example 4 at room temperature and high temperature.

Evaluation 8: Dark Current Characteristics of Photoelectric Device

The dark currents of the photoelectric devices of Examples 1 to 3 and Reference Examples 1 to 4 are evaluated.

The dark current is measured by using the IPCE measurement system (McScience Inc., Korea). After calibrating the equipment with the Si photodiode (Hamamatsu Photonics K.K., Japan), the photoelectric devices according to Examples 1 to 3 and Reference Examples 1 to 4 are mounted on the equipment and measured with respect to the dark current in a wavelength region ranging from about 350 nm to 750 nm. After annealing the photoelectric devices according to Examples 1 to 3 and Reference Examples 1 to 4 at 180° C., the dark currents are measured by the method described above. Among them, the dark current measurement results of the photoelectric device according to Example 2 are shown in Table 8.

TABLE 8

| | Dark current (180° C., h/s/μm²) |
|---|---|
| Example 2 | 6 |

Referring to 8, the photoelectric device according to Example 2 exhibit low dark current at high temperature.

Evaluation 9: Mobility of Photoelectric Device

Charge mobility is evaluated by measuring TDCF (time-delayed collection field) mobility. The photoelectric devices according to Examples 1 to 3 are irradiated by a laser of 550 nm (a pulse width: 6 nm) with a light source, and then, a bias voltage (V) is applied thereto to measure a photocurrent. Equation 2 is used to obtain the TDCF mobility.

$$\text{Mobility} = (T)^2/(t*V) \quad \text{[Equation 2]}$$

In Equation 2,

T is a thickness of an active layer, t is a period of taken from the time the laser is irradiated to the time when the photo current is maximized, and V is the bias voltage.

TDCF mobility result of the photoelectric device according to Example 2 are shown in Table 9.

TABLE 9

| | TDCF mobility (cm$^2$/V · sec) |
|---|---|
| Example 2 | 6.0 × 10$^{-6}$ |

Referring to Table 9, the photoelectric device according to Example 2 exhibit improved mobility.

Lastly, the crosstalk values are averaged to obtain an average crosstalk. Among them, the results according to Reference Example 2 and Example 2 are shown in Table 10.

TABLE 10

| | Average crosstalk (%) |
|---|---|
| Reference Example 2 | 26 |
| Example 2 | 21 |

Referring to Table 10, when the photoelectric device according to Example 2 is applied, crosstalk is reduced compared with the case where the photoelectric device according to Reference Example 2 is applied.

While the inventive concepts have been described in connection with what is presently considered to be practical example embodiments, it is to be understood that the inventive concepts are not limited to such example embodiments. On the contrary, the inventive concepts are intended to cover various modifications and equivalent arrangements included within the spirit and scope of the appended claims.

<Description of symbols>

| | | | |
|---|---|---|---|
| 10: | first electrode | 20: | second electrode |
| 30: | active layer | 40, 45: | charge auxiliary layer |
| 100, 200, 100a, 100b, 100c, 100aa, 100bb, 100cc, 100dd: | photoelectric device | | |
| 300, 400, 500, 600, 700, 800: | organic CMOS image sensor | | |
| 310: | semiconductor substrate | 70B, 72B: | blue filter |
| 70R, 72R: | red filter | | |
| 70, 72: | color filter layer | 85, 85a, 85b, 85c: | through-hole |
| 60: | lower insulation layer | 80: | upper insulation layer |
| 50B, 50R: | photo-sensing device | 55: | charge storage |
| 1000: | digital camera | 1010: | lens |
| 1020: | image sensor | 1030: | motor |
| 1040: | engine | 1050: | host/application |

Evaluation 10: Crosstalk of Image Sensor

The crosstalks of the image sensors having the structures shown in FIG. 4 including the photoelectric devices according to Examples 1 to 3 and Reference Examples 1 to 4 are evaluated.

The crosstalk is evaluated through simulation by using a LUMERRICAL 3D program. Herein, a wavelength region is divided into three regions of 440 nm to 480 nm (blue), 520 nm to 560 nm (green), and 590 nm to 630 nm (red), and how much two other photoelectric devices of different colors in each region optically interfere is evaluated. In other words, when an integral of a sensitivity curve of a blue device in the blue region of 440 nm to 480 nm is regarded as 100, a relative integral of the sensitivity curves of red and green devices in the blue region of 440 to 480 nm is calculated. The obtained value is a crosstalk of the red and green devices regarding the blue region of 440 nm to 480 nm.

Likewise, when an integral of a sensitivity curve in the green region of 520 nm to 560 nm is regarded as 100, a relative integral of sensitivity curves of the red and blue devices in the green region of 520 nm to 560 nm is calculated. This value is a crosstalk of the red and blue devices regarding the green region of 520 nm to 560 nm.

Likewise, when an integral of a sensitivity curve in the red region of 590 to 630 nm is 100, a relative integral of sensitivity curves of the blue and green devices in the red region of 520 nm to 560 nm is calculated. This value is a crosstalk of the blue and green devices regarding the red region of 590 nm to 630 nm.

What is claimed is:

1. A composition for a photoelectric device, the composition comprising:
a p-type semiconductor compound represented by Chemical Formula 1 and an n-type semiconductor compound:

[Chemical Formula 1]

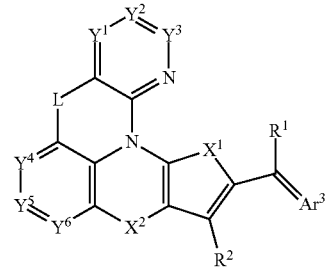

wherein, in Chemical Formula 1,
L is —O—, —S—, —Se—, —Te—, —NR$^{a1}$—, —BR$^{a2}$—, —SiR$^b$R$^c$—, —SiR$^{bb}$R$^{cc}$—, —GeR$^d$R$^e$—, —GeR$^{dd}$R$^{ee}$—, —(CR$^f$R$^g$)$_{n1}$—, —(CR$^{ff}$R$^{gg}$)—, —(C(R$^m$)=C(R$^n$))—, —(C(R$^{mm}$)=C(R$^{nn}$))—, —(C(R$^p$)=N)—, or a single bond, wherein R$^{a1}$, R$^{a2}$, R$^b$, R$^c$, R$^d$, R$^e$, R$^f$, R$^g$, R$^m$, R$^n$, and R$^p$ are each independently hydrogen, deuterium, a halogen, a substituted or unsubstituted C1 to C20 alkyl group, a substituted or unsubstituted C6 to C20 aryl group, or a substituted or unsubstituted C6 to C20 aryloxy group, each pair of $R^{bb}$ and $R^{cc}$, $R^{dd}$ and $R^{ee}$, $R^{ff}$ and $R^{gg}$, or $R^{mm}$ and $R^{nn}$ are linked to each other to form a ring structure, and n1 of —(CR'$R^g$)$_{n1}$— is 1 or 2, or L is linked to $Y^1$ or $Y^4$ to provide a ring structure, $Y^1$ to $Y^6$ are each independently N or $CR^k$, wherein $R^k$ is hydrogen, deuterium, a halogen, a cyano group, a nitro group, a hydroxyl group, amine group, a substituted or unsubstituted C1 to C10 alkyl group, or a substituted or unsubstituted C1 to C10 alkoxy group or adjacent $R^k$'s are linked to each other to provide a substituted or unsubstituted C6 to C30 arene group, a substituted or unsubstituted C3 to C30 heteroarene group, or a condensed ring thereof, $X^1$ is —S—, —Se—, —Te—, —S(=O)—, —S(=O)$_2$—, —$NR^{a1}$—, —$BR^{a2}$—, —Si$R^bR^c$—, —Si$R^{bb}R^{cc}$—, —Ge$R^dR^e$—, —Ge$R^{dd}R^{ee}$—, —C$R^fR^g$—, or —C$R^{ff}R^{gg}$—, wherein $R^{a1}$, $R^{a2}$, $R^b$, $R^c$, $R^d$, $R^e$, $R^f$, and $R^g$ are each independently hydrogen, deuterium, a halogen, a cyano group, a substituted or unsubstituted C1 to C20 alkyl group, a substituted or unsubstituted C1 to C20 alkoxy group, a substituted or unsubstituted C6 to C20 aryl group, a substituted or unsubstituted C6 to C20 aryloxy group, or a substituted or unsubstituted C3 to C20 heteroaryl group, and each pair of $R^{bb}$ and $R^{cc}$, $R^{dd}$ and $R^{ee}$, or $R^{ff}$ and $R^{gg}$ are linked to each other to provide a ring structure, $X^2$ is —O—, —S—, —Se—, —Te—, —S(=O)—, —S(=O)$_2$—, —$NR^{a1}$—, —$BR^{a2}$—, —Si$R^bR^c$—, —Si$R^{bb}R^{cc}$—, —Ge$R^dR^e$—, —Ge$R^{dd}R^{ee}$—, —(C$R^fR^g$)$_{n1}$—, —(C$R^{ff}R^{gg}$)—, —(C($R^m$)=C($R^n$))—, —(C($R^{mm}$)=C($R^{nn}$))—, or —(C($R^p$)=N)—, wherein $R^{a1}$, $R^{a2}$, $R^b$, $R^c$, $R^d$, $R^e$, $R^f$, $R^g$, $R^m$, $R^n$, and $R^p$ are each independently hydrogen, deuterium, a halogen, a cyano group, a substituted or unsubstituted C1 to C20 alkyl group, a substituted or unsubstituted C1 to C20 alkoxy group, a substituted or unsubstituted C6 to C20 aryl group, a substituted or unsubstituted C6 to C20 aryloxy group or a substituted or unsubstituted C3 to C20 heteroaryl group, and each pair of $R^{bb}$ and $R^{cc}$, $R^{dd}$ and $R^{ee}$, $R^{ff}$ and $R^{gg}$, or $R^{mm}$ and $R^{nn}$ is linked to each other to provide a ring structure, and n1 of —(CR'$R^g$)$_{n1}$— is 1 or 2, $Ar^3$ is a substituted or unsubstituted C6 to C30 hydrocarbon cyclic group having at least one functional group selected from C=O, C=S, C=Se, and C=Te, a substituted or unsubstituted C2 to C30 heterocyclic group having at least one functional group selected from C=O, C=S, C=Se, and C=Te, or a fused ring thereof, and $R^1$ and $R^2$ are each independently hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a substituted or unsubstituted C2 to C30 acyl group, a halogen, a cyano group (—CN), a cyano-containing group, a nitro group, a pentafluorosulfanyl group (—SF$_5$), a hydroxyl group, an amine group, a hydrazine group, a hydrazone group, a carboxyl group or a salt thereof, a sulfonic acid group or a salt thereof, a phosphoric acid group or a salt thereof, —Si$R^aR^bR^c$, wherein $R^a$, $R^b$, and $R^c$ are each independently hydrogen or a substituted or unsubstituted C1 to C10 alkyl group, or any combination thereof.

2. The composition of claim 1, wherein the p-type semiconductor compound of Chemical Formula 1 is represented by Chemical Formula 2A:

[Chemical Formula 2A]

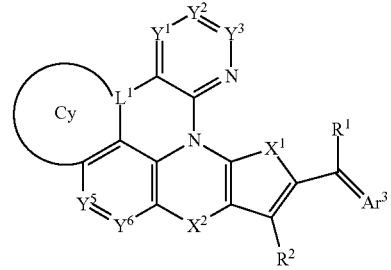

wherein, in Chemical Formula 2A,
$X^1$, $X^2$, $Ar^3$, $R^1$, $R^2$, $Y^1$ to $Y^3$, $Y^5$, and $Y^6$ are the same as $X^1$, $X^2$, $Ar^3$, $R^1$, $R^2$, $Y^1$ to $Y^3$, $Y^5$, and $Y^6$, respectively, in Chemical Formula 1,
$L^1$ is N, B, Si, Ge, or C, and
Cy is a substituted or unsubstituted C6 to C30 arene group, a substituted or unsubstituted C3 to C30 heteroarene group, a substituted or unsubstituted C5 to C30 cycloalkene group, a substituted or unsubstituted C5 to C30 heterocycloalkene group, or a condensed ring thereof.

3. The composition of claim 1, wherein the p-type semiconductor compound of Chemical Formula 1 is represented by Chemical Formula 2B:

[Chemical Formula 2B]

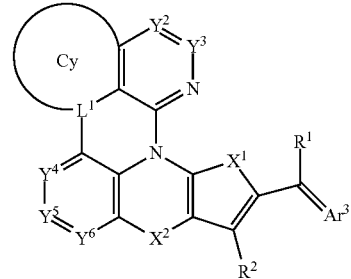

wherein, in Chemical Formula 2B,
$X^1$, $X^2$, $Ar^3$, $R^1$, $R^2$, $Y^2$, $Y^3$, $Y^4$, $Y^5$, and $Y^6$ are the same as $X^1$, $X^2$, $Ar^3$, $R^1$, $R^2$, $Y^2$, $Y^3$, $Y^4$, $Y^5$, and $Y^6$, respectively, in Chemical Formula 1, and
Cy is a substituted or unsubstituted C6 to C30 arene group, a substituted or unsubstituted C3 to C30 heteroarene group, a substituted or unsubstituted C5 to C30 cycloalkene group, a substituted or unsubstituted C5 to C30 heterocycloalkene group, or a condensed ring thereof.

4. The composition of claim 1, wherein
$X^1$ is —S—, —Se—, —Te—, —S(=O)—, —S(=O)$_2$—, —$NR^{a1}$—, —$BR^{a2}$—, —Si$R^bR^c$—, —Ge$R^dR^e$—, or —C$R^fR^g$—, wherein $R^{a1}$, $R^{a2}$, $R^b$, $R^c$, $R^d$, $R^e$, $R^f$, and $R^g$ are each independently a halogen, a cyano group, a C1 to C20 alkyl group substituted with a halogen or a cyano group, a C1 to C20 alkoxy group substituted with a halogen or a cyano group, a C6 to C20 aryl group substituted with a halogen or a cyano group, a C6 to C20 aryloxy group substituted with a halogen or a cyano group, or a C3 to C20 heteroaryl group substituted with a halogen or a cyano group.

5. The composition of claim 1, wherein the ring structures in $X^1$, $X^2$, and L of Chemical Formula 1 are each a spiro structure or a fused ring structure.

6. The composition of claim 1, wherein the ring structures in $X^1$, $X^2$, and L of Chemical Formula 1 are each a fused ring structure or a moiety represented by Chemical Formula 4:

[Chemical Formula 4]

 (1)

 (2)

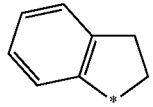 (3)

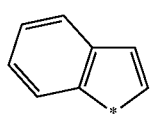 (4)

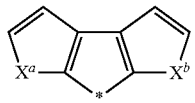 (5)

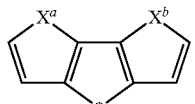 (6)

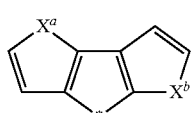 (7)

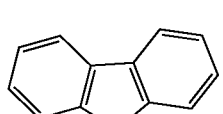 (8)

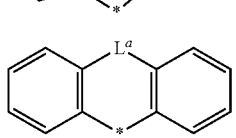 (9)

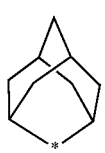 (10)

wherein, in Chemical Formula 4, $X^a$ and $X^b$ are each independently —O—, —S—, —Se—, —Te—, —S(=O)—, —S(=O)$_2$—, —NR$^{a1}$—, —BR$^{a2}$—, —SiR$^b$R$^c$—, —SiR$^{bb}$R$^{cc}$—, —GeR$^d$R$^e$—, or —GeR$^{dd}$R$^{ee}$—, wherein R$^{a1}$, R$^{a2}$, R$^b$, R$^c$, R$^d$, and R$^e$ are each independently hydrogen, deuterium, a halogen, a cyano group, a substituted or unsubstituted C1 to C20 alkyl group, a substituted or unsubstituted C1 to C20 alkoxy group, a substituted or unsubstituted C6 to C20 aryl group, a substituted or unsubstituted C6 to C20 aryloxy group, or a substituted or unsubstituted C3 to C20 heteroaryl group, and each pair of R$^{bb}$ and R$^{cc}$ or R$^{dd}$ and R$^{ee}$ is linked to each other to provide a ring structure, L$^a$ is —O—, —S—, —Se—, —Te—, —NR$^{a1}$—, —BR$^{a2}$—, —SiR$^b$R$^c$—, —GeR$^d$R$^e$—, —(CR$^f$R$^g$)$_{n1}$—, —(C(R$^p$)=N)—, or a single bond, wherein R$^{a1}$, R$^{a2}$, R$^b$, R$^c$, R$^d$, R$^e$, R$^f$, R$^g$, and R$^p$ are each independently hydrogen, deuterium, a halogen, a cyano group, a substituted or unsubstituted C1 to C20 alkyl group, a substituted or unsubstituted C1 to C20 alkoxy group, a substituted or unsubstituted C6 to C20 aryl group, or a substituted or unsubstituted C6 to C20 aryloxy group, and

* is a linking point.

7. The composition of claim 1, wherein the ring structures in $X^1$, $X^2$, and L of Chemical Formula 1 are each a fused ring structure or a moiety represented by Chemical Formula 4:

[Chemical Formula 4]

 (1)

 (2)

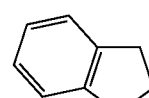 (3)

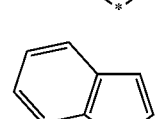 (4)

 (5)

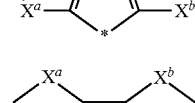 (6)

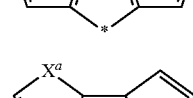 (7)

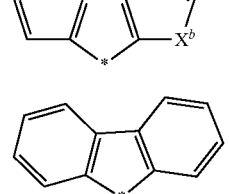 (8)

-continued (9)

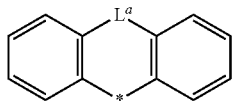

(10)

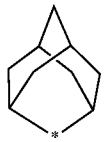

wherein, in Chemical Formula 4,
  $X^a$ and $X^b$ are each independently —O—, —S—, —Se—, —Te—, —S(=O)—, —S(=O)$_2$—, —NR$^{a1}$—, —BR$^{a2}$—, —SiR$^b$R$^c$—, —SiR$^{bb}$R$^{cc}$—, —GeR$^d$R$^e$—, or —GeR$^{dd}$R$^{ee}$—, wherein R$^{a1}$, R$^{a2}$, R$^b$, R$^c$, R$^d$, and R$^e$ are each independently hydrogen, deuterium, a halogen, a cyano group, a substituted or unsubstituted C1 to C20 alkyl group, a substituted or unsubstituted C1 to C20 alkoxy group, a substituted or unsubstituted C6 to C20 aryl group, a substituted or unsubstituted C6 to C20 aryloxy group, or a substituted or unsubstituted C3 to C20 heteroaryl group, and each pair of R$^{bb}$ and R$^{cc}$ or R$^{dd}$ and R$^{ee}$ is linked to each other to provide a ring structure,
  L$^a$ is —O—, —S—, —Se—, —Te—, —NR$^{a1}$—, —BR$^{a2}$—, —SiR$^b$R$^c$—, —GeR$^d$R$^e$—, —(CR$^f$R$^g$)$_{n1}$—, —(C(R$^p$)=N)—, or a single bond, wherein R$^{a1}$, R$^{a2}$, R$^b$, R$^c$, R$^d$, R$^e$, R$^f$, R$^g$, and R$^p$ are each independently hydrogen, deuterium, a halogen, a cyano group, a substituted or unsubstituted C1 to C20 alkyl group, a substituted or unsubstituted C1 to C20 alkoxy group, a substituted or unsubstituted C6 to C20 aryl group, or a substituted or unsubstituted C6 to C20 aryloxy group,
  at least one hydrogen of each ring of the moieties (1), (2), (3), (4), (5), (6), (7), (8), or (9) is replaced by at least one substituent of deuterium, a halogen, a substituted or unsubstituted C1 to C20 alkyl group, a substituted or unsubstituted C1 to C20 alkoxy group, a substituted or unsubstituted C6 to C20 aryl group, or a substituted or unsubstituted C6 to C20 aryloxy group, and
  * is a linking point.

8. The composition of claim 1, wherein the ring structures in X$^1$, X$^2$, and L of Chemical Formula 1 are each a fused ring structure or a moiety represented by Chemical Formula 4:

[Chemical Formula 4]

(1)

(2)

(3)

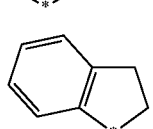

(4)

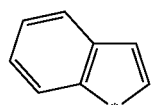

(5)

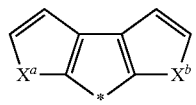

(6)

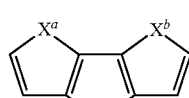

(7)

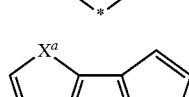

(8)

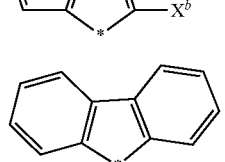

(9)

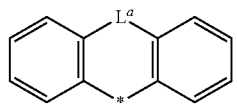

(10)

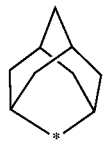

wherein, in Chemical Formula 4,
  $X^a$ and $X^b$ are each independently —O—, —S—, —Se—, —Te—, —S(=O)—, —S(=O)$_2$—, —NR$^{a1}$—, —BR$^{a2}$—, —SiR$^b$R$^c$—, —SiR$^{bb}$R$^{cc}$—, —GeR$^d$R$^e$—, or —GeR$^{dd}$R$^{ee}$—, wherein R$^{a1}$, R$^{a2}$, R$^b$, R$^c$, R$^d$, and R$^e$ are each independently hydrogen, deuterium, a halogen, a cyano group, a substituted or unsubstituted C1 to C20 alkyl group, a substituted or unsubstituted C1 to C20 alkoxy group, a substituted or unsubstituted C6 to C20 aryl group, a substituted or unsubstituted C6 to C20 aryloxy group, or a substituted or unsubstituted C3 to C20 heteroaryl group, and each pair of R$^{bb}$ and R$^{cc}$ or R$^{dd}$ and R$^{ee}$ is linked to each other to provide a ring structure,
  L$^a$ is —O—, —S—, —Se—, —Te—, —NR$^{a1}$—, —BR$^{a2}$—, —SiR$^b$R$^c$—, —GeR$^d$R$^e$—, —(CR$^f$R$^g$)$_{n1}$—, —(C(R$^p$)=N)—, or a single bond, wherein R$^{a1}$, R$^{a2}$, R$^b$, R$^c$, R$^d$, R$^e$, R$^f$, R$^g$, and R$^p$ are each independently hydrogen, deuterium, a halogen, a cyano group, a substituted or unsubstituted C1 to C20 alkyl group, a substituted or unsubstituted C1 to C20 alkoxy group, a substituted or unsubstituted C6 to C20 aryl group, or a substituted or unsubstituted C6 to C20 aryloxy group,
  one or more CH present in an aromatic ring of the moieties (3), (4), (5), (6), (7), (8), or (9) is replaced by N, and
  * is a linking point.

9. The composition of claim 1, wherein Ar$^3$ is a cyclic group represented by Chemical Formula 5,

[Chemical Formula 5]

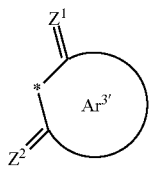

wherein, in Chemical Formula 5,
Ar$^{3\prime}$ is a substituted or unsubstituted C6 to C30 aryl group or a substituted or unsubstituted C3 to C30 heteroaryl group,
Z$^1$ is O, S, Se, or Te,
Z$^2$ is O, S, Se, Te, or CR$^a$R$^b$, wherein R$^a$ and R$^b$ are each independently hydrogen, a substituted or unsubstituted C1 to C10 alkyl group, a cyano group, or a cyano-containing group provided that when Z$^2$ is CR$^a$R$^b$, at least one of R$^a$ or R$^b$ is a cyano group or a cyano-containing group, and
* is a linking point.

10. The composition of claim 1, wherein in Chemical Formula 1, Ar$^3$ is a cyclic group represented by one of Chemical Formula 6A to Chemical Formula 6G:

[Chemical Formula 6A]

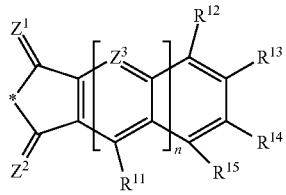

wherein, in Chemical Formula 6A,
Z$^1$ is O, S, Se, or Te,
Z$^2$ is O, S, Se, Te, or CR$^a$R$^b$, wherein R$^a$ and R$^b$ are independently hydrogen, a substituted or unsubstituted C1 to C10 alkyl group, a cyano group, or a cyano-containing group, provided that when Z$^2$ is CR$^a$R$^b$, at least one of R$^a$ or R$^b$ is a cyano group or a cyano-containing group,
Z$^3$ is N or CR$^c$, wherein R$^c$ is hydrogen, deuterium, or a substituted or unsubstituted C1 to C10 alkyl group,
R$^{11}$, R$^{12}$, R$^{13}$, R$^{14}$, and R$^{15}$ are independently hydrogen, deuterium, a substituted or unsubstituted C1 to C30 alkyl group, a substituted or unsubstituted C6 to C30 aryl group, a substituted or unsubstituted C4 to C30 heteroaryl group, a halogen, a cyano group (—CN), a cyano-containing group, or any combination thereof, wherein R$^{12}$ and R$^{13}$ and R$^{14}$ and R$^{15}$ are independently present or are linked to each other to provide a fused aromatic ring,
n is 0 or 1, and
* is a linking point,

[Chemical Formula 6B]

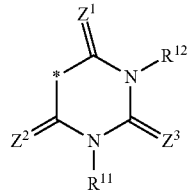

wherein, in Chemical Formula 6B,
Z$^1$ is O, S, Se, or Te,
Z$^2$ is O, S, Se, Te, or CR$^a$R$^b$, wherein R$^a$ and R$^b$ are independently hydrogen, a substituted or unsubstituted C1 to C10 alkyl group, a cyano group, or a cyano-containing group, provided that when Z$^2$ is CR$^a$R$^b$, at least one of R$^a$ or R$^b$ is a cyano group or a cyano-containing group,
Z$^3$ is O, S, Se, Te, or C(R$^a$)(CN), wherein R$^a$ is hydrogen, a cyano group (—CN), or a C1 to C10 alkyl group,
R$^{11}$ and R$^{12}$ are independently hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C4 to C30 heteroaryl group, a halogen, a cyano group (—CN), or any combination thereof, and
* is a linking point,

[Chemical Formula 6C]

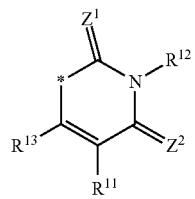

wherein, in Chemical Formula 6C,
Z$^1$ is O, S, Se, or Te,
Z$^2$ is O, S, Se, Te, or CR$^a$R$^b$, wherein R$^a$ and R$^b$ are independently hydrogen, a substituted or unsubstituted C1 to C10 alkyl group, a cyano group, or a cyano-containing group, provided that when Z$^2$ is CR$^a$R$^b$, at least one of R$^a$ or R$^b$ is a cyano group or a cyano-containing group,
R$^{11}$, R$^{12}$, and R$^{13}$ are independently hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C4 to C30 heteroaryl group, a halogen, a cyano group (—CN), or any combination thereof, and

* is a linking point,

[Chemical Formula 6D]

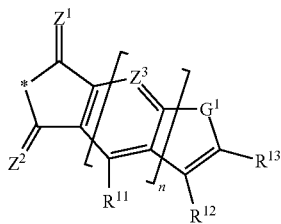

wherein, in Chemical Formula 6D,
$Z^1$ is O, S, Se, or Te,
$Z^2$ is O, S, Se, Te, or $CR^aR^b$, wherein $R^a$ and $R^b$ are independently hydrogen, a substituted or unsubstituted C1 to C10 alkyl group, a cyano group, or a cyano-containing group, provided that when $Z^2$ is $CR^aR^b$, at least one of $R^a$ or $R^b$ is a cyano group or a cyano-containing group,
$Z^3$ is N or $CR^c$, wherein $R^c$ is hydrogen or a substituted or unsubstituted C1 to C10 alkyl group,
$G^1$ is O, S, Se, Te, $SiR^xR^y$, or $GeR^zR^w$, wherein $R^x$, $R^y$, $R^z$, and $R^w$ are independently hydrogen, deuterium, a halogen, a substituted or unsubstituted C1 to C20 alkyl group, or a substituted or unsubstituted C6 to C20 aryl group,
$R^{11}$, $R^{12}$, and $R^{13}$ are independently hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C4 to C30 heteroaryl group, a halogen, a cyano group, a cyano-containing group, or any combination thereof, wherein $R^{12}$ and $R^{13}$ are independently present or are linked to each other to provide a fused aromatic ring,
n is 0 or 1, and
* is a linking point,

[Chemical Formula 6E]

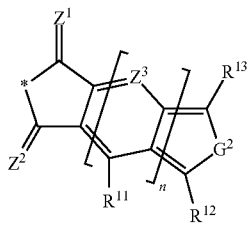

wherein, in Chemical Formula 6E,
$Z^1$ is O, S, Se, or Te,
$Z^2$ is O, S, Se, Te, or $CR^aR^b$, wherein $R^a$ and $R^b$ are independently hydrogen, a substituted or unsubstituted C1 to C10 alkyl group, a cyano group, or a cyano-containing group, provided that when $Z^2$ is $CR^aR^b$, at least one of $R^a$ or $R^b$ is a cyano group or a cyano-containing group,
$Z^3$ is N or $CR^c$, wherein $R^c$ is hydrogen or a substituted or unsubstituted C1 to C10 alkyl group,
$G^2$ is O, S, Se, Te, $SiR^xR^y$, or $GeR^zR^w$, wherein $R^x$, $R^y$, $R^z$, and $R^w$ are independently hydrogen, deuterium, a halogen, a substituted or unsubstituted C1 to C20 alkyl group, or a substituted or unsubstituted C6 to C20 aryl group,
$R^{11}$, $R^{12}$, and $R^{13}$ are independently hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C4 to C30 heteroaryl group, a halogen, a cyano group, a cyano-containing group, or any combination thereof,
n is 0 or 1, and
* is a linking point,

[Chemical Formula 6F]

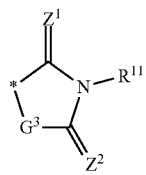

wherein, in Chemical Formula 6F,
$Z^1$ is O, S, Se, or Te,
$Z^2$ is O, S, Se, Te, or $CR^aR^b$, wherein $R^a$ and $R^b$ are independently hydrogen, a substituted or unsubstituted C1 to C10 alkyl group, a cyano group, or a cyano-containing group, provided that when $Z^2$ is $CR^aR^b$, at least one of $R^a$ or $R^b$ is a cyano group or a cyano-containing group,
$R^{11}$ is hydrogen, deuterium, a substituted or unsubstituted C1 to C30 alkyl group, a substituted or unsubstituted C6 to C30 aryl group, a substituted or unsubstituted C4 to C30 heteroaryl group, a halogen, a cyano group (—CN), a cyano-containing group, or any combination thereof,
$G^3$ is O, S, Se, Te, $SiR^xR^y$, or $GeR^zR^w$, wherein $R^x$, $R^y$, $R^z$, and $R^w$ are independently hydrogen, deuterium, a halogen, a substituted or unsubstituted C1 to C20 alkyl group, or a substituted or unsubstituted C6 to C20 aryl group, and
* is a linking point,

[Chemical Formula 6G]

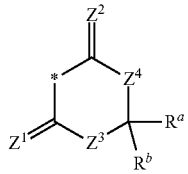

wherein, in Chemical Formula 6G,
$Z^1$ is O, S, Se, or Te,
$R^a$ and $R^b$ are independently hydrogen, a substituted or unsubstituted C1 to C10 alkyl group, a cyano group, or a cyano-containing group,
$Z^2$ to $Z^4$ are independently O, S, Se, Te, or $CR^cR^d$, wherein $R^c$ and $R^d$ are independently hydrogen, a substituted or unsubstituted C1 to C10 alkyl group, a cyano group, or a cyano-containing group, provided that when $Z^2$ is $CR^cR^d$, at least one of $R^c$ or $R^d$ is a cyano group or a cyano-containing group, and
* is a linking point.

11. The composition of claim 1, wherein the composition has a maximum absorption wavelength ($\lambda_{max}$) in a wavelength range of greater than or equal to about 500 nm and less than or equal to about 600 nm in a thin film state.

12. The composition of claim 1, wherein the composition exhibits a light absorption curve having a full width at half maximum (FWHM) in a thin film state of about 50 nm to about 200 nm.

13. The composition of claim 1, wherein an aspect ratio of a molecule of the p-type semiconductor compound represented by Chemical Formula 1, determined based on dividing a length of a shortest axis of the molecule by a length of a longest axis of the molecule, is less than or equal to about 0.42.

14. The composition of claim 1, wherein
a volume ratio of the p-type semiconductor compound represented by Chemical Formula 1 and the n-type semiconductor compound in the composition is about 1:100 to about 100:1.

15. A composition, comprising:
a compound represented by Chemical Formula 1:

[Chemical Formula 1]

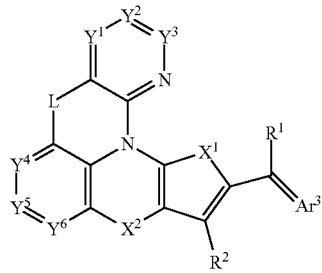

wherein, in Chemical Formula 1,
L is —O—, —S—, —Se—, —Te—, —NR$^{a1}$—, —BR$^{a2}$—, —SiR$^b$R$^c$—, —SiR$^{bb}$R$^{cc}$—, —GeR$^d$R$^e$—, —GeR$^{dd}$R$^{ee}$—, —(CR$^f$R$^g$)$_{n1}$—, —(CR$^{ff}$R$^{gg}$—, —(C(R$^m$)=C(R$^n$))—, —(C(R$^{mm}$)=C(R$^{nn}$))—, —(C(R$^p$)=N)—, or a single bond, wherein R$^{a1}$, R$^{a2}$, R$^b$, R$^c$, R$^d$, R$^e$, R$^f$, R$^g$, R$^m$, R$^n$, and R$^p$ are each independently hydrogen, deuterium, a halogen, a substituted or unsubstituted C1 to C20 alkyl group, a substituted or unsubstituted C6 to C20 aryl group, or a substituted or unsubstituted C6 to C20 aryloxy group, each pair of R$^{bb}$ and R$^{cc}$, R$^{dd}$ and R$^{ee}$, R$^{ff}$ and R$^{gg}$, or R$^{mm}$ and R$^{nn}$ are linked to each other to form a ring structure, and n1 of —(CR$^f$R$^g$)$_{n1}$— is 1 or 2, or L is linked to Y$^1$ or Y$^4$ to provide a ring structure, Y$^1$ to Y$^6$ are each independently N or CR$^k$, wherein R$^k$ is hydrogen, deuterium, a halogen, a cyano group, a nitro group, a hydroxyl group, amine group, a substituted or unsubstituted C1 to C10 alkyl group, or a substituted or unsubstituted C1 to C10 alkoxy group or adjacent R$^k$'s are linked to each other to provide a substituted or unsubstituted C6 to C30 arene group, a substituted or unsubstituted C3 to C30 heteroarene group, or a condensed ring thereof, X$^1$ is —S—, —Se—, —Te—, —S(=O)—, —S(=O)$_2$—, —NR$^{a1}$—, —BR$^{a2}$—, —SiR$^b$R$^c$—, —SiR$^{bb}$R$^{cc}$—, —GeR$^d$R$^e$—, —GeR$^{dd}$R$^{ee}$—, —CR$^f$R$^g$—, or —CR$^{ff}$R$^{gg}$—, wherein R$^{a1}$, R$^{a2}$, R$^b$, R$^c$, R$^d$, R$^e$, R$^f$, and R$^g$ are each independently hydrogen, deuterium, a halogen, a cyano group, a substituted or unsubstituted C1 to C20 alkyl group, a substituted or unsubstituted C1 to C20 alkoxy group, a substituted or unsubstituted C6 to C20 aryl group, a substituted or unsubstituted C6 to C20 aryloxy group, or a substituted or unsubstituted C3 to C20 heteroaryl group, and each pair of R$^{bb}$ and R$^{cc}$, R$^{dd}$ and R$^{ee}$, or R$^{ff}$ and R$^{gg}$ are linked to each other to provide a ring structure, X$^2$ is —O—, —S—, —Se—, —Te—, —S(=O)—, —S(=O)$_2$—, —NR$^{a1}$—, —BR$^{a2}$—, —SiR$^b$R$^c$—, —SiR$^{bb}$R$^{cc}$—, —GeR$^d$R$^e$—, —GeR$^{dd}$R$^{ee}$—, —(CR$^f$R$^g$)$_{n1}$—, —(CR$^{ff}$R$^{gg}$—, —(C(R$^m$)=C(R$^n$))—, —(C(R$^{mm}$)=C(R$^{nn}$))—, or —(C(R$^p$)=N)—, wherein R$^{a1}$, R$^{a2}$, R$^b$, R$^c$, R$^d$, R$^e$, R$^f$, R$^g$, R$^m$, R$^n$, and R$^p$ are each independently hydrogen, deuterium, a halogen, a cyano group, a substituted or unsubstituted C1 to C20 alkyl group, a substituted or unsubstituted C1 to C20 alkoxy group, a substituted or unsubstituted C6 to C20 aryl group, a substituted or unsubstituted C6 to C20 aryloxy group or a substituted or unsubstituted C3 to C20 heteroaryl group, and each pair of R$^{bb}$ and R$^{cc}$, R$^{dd}$ and R$^{ee}$, R$^{ff}$ and R$^{gg}$, or R$^{mm}$ and R$^{nn}$ is linked to each other to provide a ring structure, and n1 of —(CR$^f$R$^g$)$_{n1}$— is 1 or 2, Ar$^3$ is a substituted or unsubstituted C6 to C30 hydrocarbon cyclic group having at least one functional group selected from C=O, C=S, C=Se, and C=Te, a substituted or unsubstituted C2 to C30 heterocyclic group having at least one functional group selected from C=O, C=S, C=Se, and C=Te, or a fused ring thereof, and R$^1$ and R$^2$ are each independently hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a substituted or unsubstituted C2 to C30 acyl group, a halogen, a cyano group (—CN), a cyano-containing group, a nitro group, a pentafluorosulfanyl group (—SF$_5$), a hydroxyl group, an amine group, a hydrazine group, a hydrazone group, a carboxyl group or a salt thereof, a sulfonic acid group or a salt thereof, a phosphoric acid group or a salt thereof, —SiR$^a$R$^b$R$^c$, wherein R$^a$, R$^b$, and R$^c$ are each independently hydrogen or a substituted or unsubstituted C1 to C10 alkyl group, or any combination thereof.

16. The composition of claim 15, wherein an aspect ratio of a molecule of the compound represented by Chemical Formula 1, determined based on dividing a length of a shortest axis of the molecule by a length of a longest axis of the molecule, is less than or equal to about 0.42.

17. A photoelectric device, comprising:
a first electrode and a second electrode facing each other, and
an active layer between the first electrode and the second electrode,
wherein the active layer includes the composition of claim 1.

18. A photoelectric device, comprising:
a first electrode and a second electrode facing each other, and
an active layer between the first electrode and the second electrode,
wherein the active layer includes the composition of claim 15.

19. An image sensor comprising the photoelectric device of claim 17.

20. The image sensor of claim 19, further comprising:
a semiconductor substrate integrated with a plurality of first photo-sensing devices configured to selectively sense light in a blue wavelength region and a plurality of second photo-sensing devices configured to selectively sense light in a red wavelength region,
wherein the photoelectric device is on the semiconductor substrate and is configured to selectively sense light in a green wavelength region.

21. The image sensor of claim 20, further comprising:
a color filter layer,
wherein the color filter layer includes a blue filter configured to selectively transmit light in the blue wavelength region and a red filter configured to selectively transmit light in the red wavelength region.

22. The image sensor of claim 20, wherein the plurality of first photo-sensing devices and the plurality of second photo-sensing devices are stacked in a vertical direction in the semiconductor substrate.

23. The image sensor of claim 19, wherein
the photoelectric device is a green photoelectric device configured to selectively sense light in a green wavelength region, and
the image sensor includes a stack, on a semiconductor substrate, of
the green photoelectric device,
a blue photoelectric device configured to selectively sense light in a blue wavelength region, and
a red photoelectric device configured to selectively sense light in a red wavelength region.

24. The image sensor of claim 23, wherein
the green photoelectric device, the blue photoelectric device, and the red photoelectric device are aligned in parallel on the semiconductor substrate and overlap in a horizontal direction that is parallel to an upper surface of the semiconductor substrate.

25. An image sensor comprising the photoelectric device of claim 18.

26. An electronic device comprising the image sensor of claim 19.

27. An electronic device comprising the image sensor of claim 25.

* * * * *